(12) United States Patent
Badaroglu

(10) Patent No.: US 10,109,646 B1
(45) Date of Patent: Oct. 23, 2018

(54) SELECTIVELY RECESSING TRENCH ISOLATION IN THREE-DIMENSIONAL (3D) TRANSISTORS TO VARY CHANNEL STRUCTURE EXPOSURES FROM TRENCH ISOLATION TO CONTROL DRIVE STRENGTH

(71) Applicant: QUALCOMM Incorporated, San Diego, CA (US)

(72) Inventor: Mustafa Badaroglu, Kessel-Lo (BE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/613,656

(22) Filed: Jun. 5, 2017

(51) Int. Cl.
*H01L 27/118* (2006.01)

(52) U.S. Cl.
CPC .......... *H01L 27/11807* (2013.01); *H01L 2027/11824* (2013.01)

(58) Field of Classification Search
CPC ............. H01L 27/11807; H01L 2027/11824
See application file for complete search history.

(56) References Cited

U.S. PATENT DOCUMENTS

| 9,331,201 | B2 | 5/2016 | Cheng et al. |
| 9,362,178 | B1 | 6/2016 | Cao et al. |
| 9,502,414 | B2 | 11/2016 | Machkaoutsan et al. |
| 9,530,775 | B2 | 12/2016 | Cai et al. |
| 9,543,419 | B1 | 1/2017 | Fan et al. |
| 2008/0157225 | A1* | 7/2008 | Datta ............ H01L 27/105 257/401 |
| 2009/0278196 | A1* | 11/2009 | Chang .......... H01L 21/823412 257/328 |
| 2010/0163971 | A1* | 7/2010 | Hung ............ H01L 29/66795 257/327 |
| 2011/0147848 | A1* | 6/2011 | Kuhn ............ H01L 21/76229 257/368 |
| 2015/0228782 | A1* | 8/2015 | Lin ............... H01L 29/785 257/24 |

* cited by examiner

*Primary Examiner* — Kyoung Lee
(74) *Attorney, Agent, or Firm* — Withrow & Terranova

(57) ABSTRACT

Selectively recessing trench isolation in three-dimensional (3D) transistors to vary channel structure exposures from trench isolation to control drive strength is disclosed. The ability to vary the exposures of channel structures in 3D transistors from trench isolation allows the drive strengths of the 3D transistors to be varied. Varying the drive strengths of 3D transistors may be advantageous in certain circuit applications to reduce power consumption and/or control drive strength ratios between transistors, as examples. In this regard, in exemplary aspects disclosed herein, during the fabrication of 3D transistors, a trench isolation material is disposed adjacent to channel structures formed from a substrate. The amount of trench isolation material disposed adjacent to each channel structure determines the amount of channel structure surface area exposed to a gate. The amount of channel structure surface area of the 3D transistor exposed to the gate affects the drive strength of the 3D transistor.

36 Claims, 35 Drawing Sheets

A-A

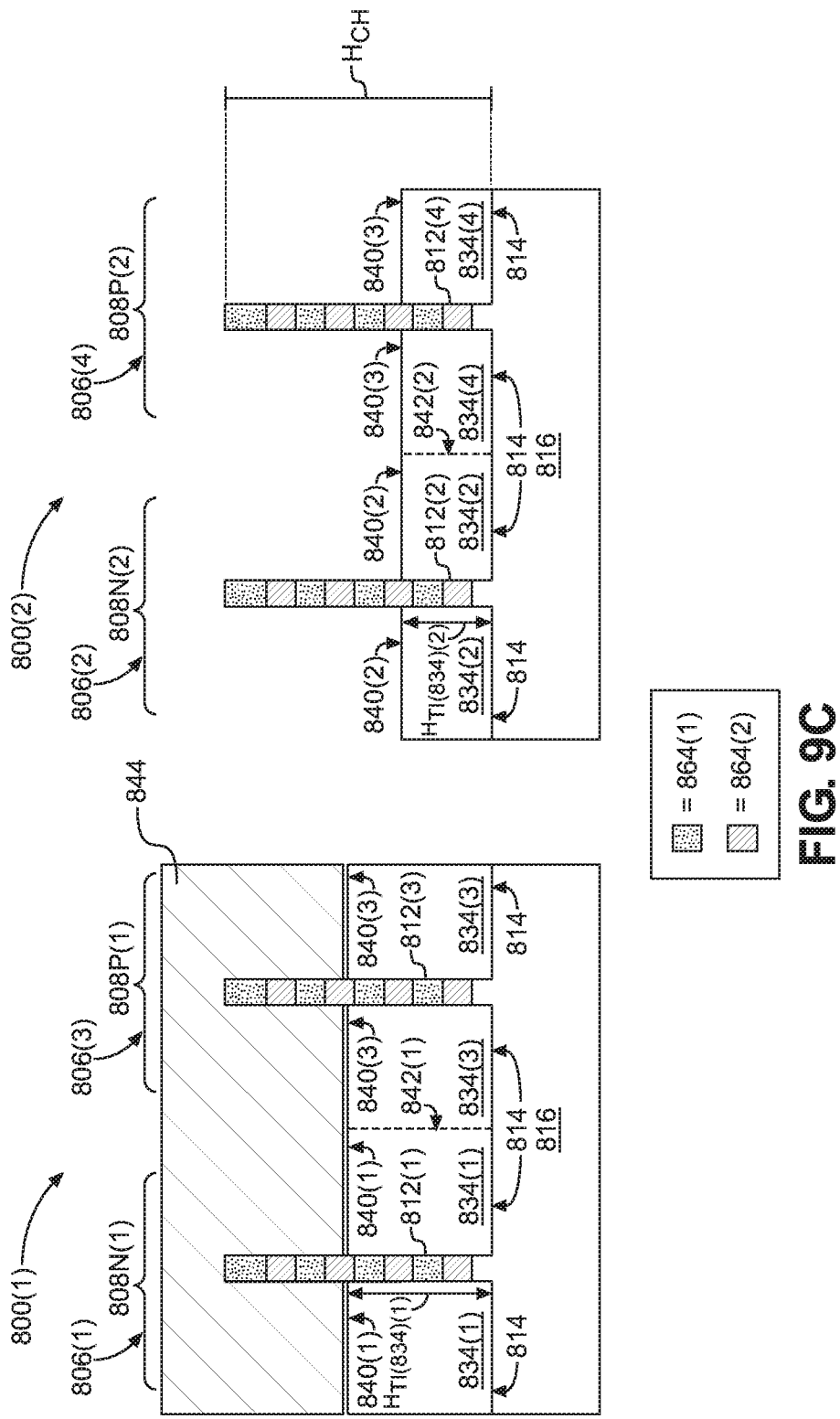

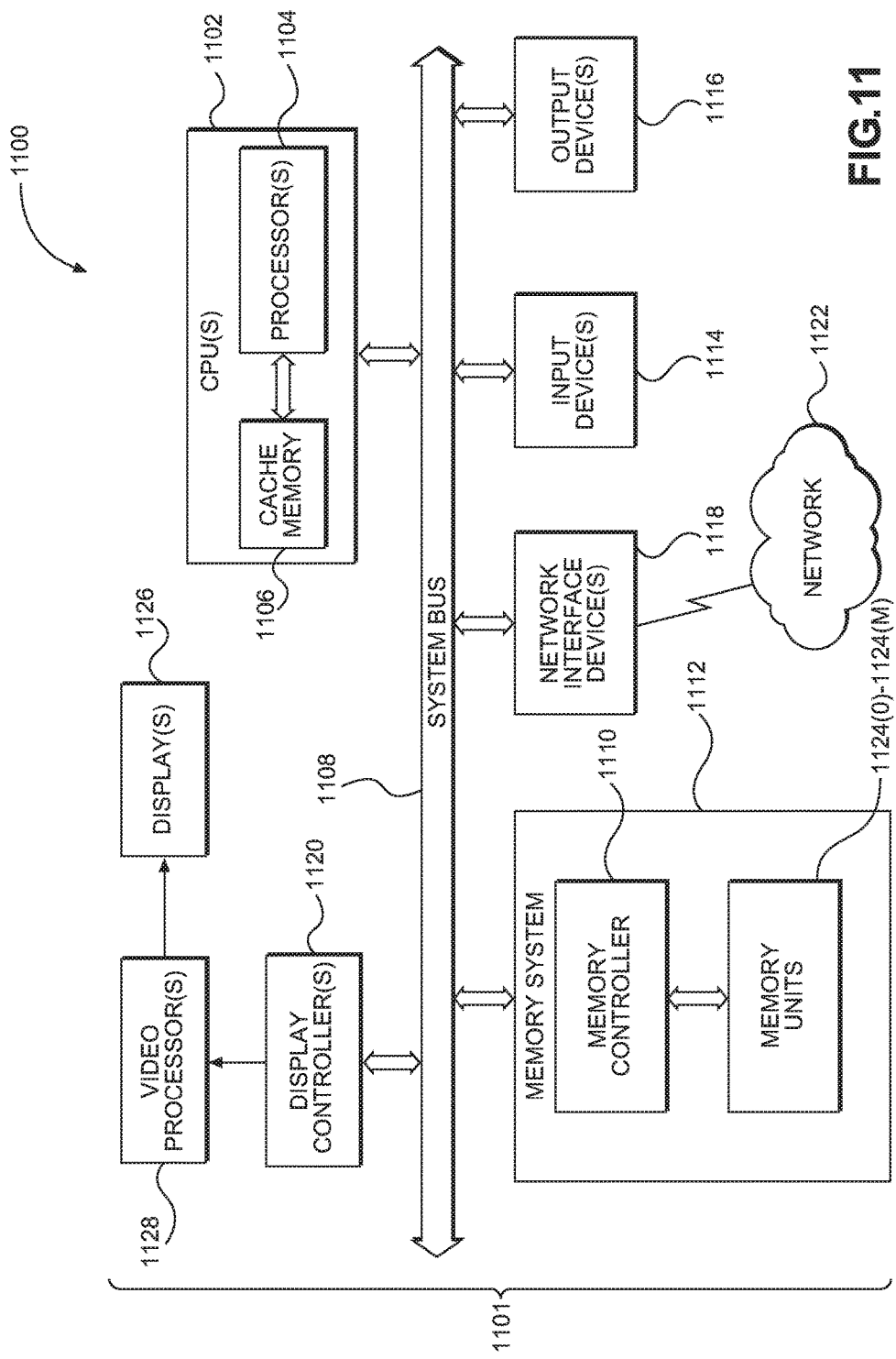

SELECTIVELY RECESSING TRENCH ISOLATION IN THREE-DIMENSIONAL (3D) TRANSISTORS TO VARY CHANNEL STRUCTURE EXPOSURES FROM TRENCH ISOLATION TO CONTROL DRIVE STRENGTH

BACKGROUND

I. Field of the Disclosure

The technology of the disclosure relates generally to three-dimensional (3D) transistors, and more particularly to controlling drive strengths of 3D transistors.

II. Background

Transistors are essential components in modern electronic devices. Large numbers of transistors are employed in integrated circuits (ICs) in many modern electronic devices. For example, components such as central processing units (CPUs) and memory systems employ large quantities of transistors for logic circuits and memory devices.

As electronic devices continue to become more functionally complex, the need to include more transistors in such devices increases. This increase is achieved in part through continued efforts to miniaturize transistors in ICs (i.e., placing more transistors into the same amount of space). In particular, node sizes in ICs are being scaled down by reducing IC minimum metal line width (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) and providing smaller parasitic capacitances resulting in reduced circuit delay. However, reducing the channel length at a lower rate relative to the rate of reduction of the pitch of a gate insulator, such as a polysilicon insulator, increases the capacitance between the channel and the drain, which in turn lowers the barrier height required to enable the conduction in the channel, thus reducing the threshold voltage. This effect is referred to as drain-induced barrier lowering (DIBL), and it is the cause of short channel effects (SCEs) that can degrade performance, such as increased current leakage, reduced threshold voltage, and/or threshold voltage roll-off. Therefore, to address the need to scale down channel lengths in transistors while avoiding or mitigating the effect of SCEs, alternative device structures to planar transistors have been developed.

One alternative design to the planar transistor is the Fin Field-Effect Transistor (FinFET). FIG. 1A illustrates an example FinFET 100. As shown in FIG. 1A, the FinFET 100 includes a conduction channel 102 in the form a "fin" 104. The fin 104 is formed in a substrate 106 of a semiconductor material and has two vertical side surfaces 108 and a horizontal top surface 110. Applying a voltage to a gate 112 wrapped around the two vertical side surfaces 108 and the horizontal top surface 110 generates an electric field in the fin 104 that allows current to flow from a source 114 to a drain 116. By providing gate control at each surface of the fin 104, the FinFET 100 spreads out and/or reduces the capacitances responsible for DIBL in planar transistors, thus reducing or eliminating leakage current, threshold voltage roll-off, and other SCEs.

FIG. 1B illustrates a more detailed cross-sectional view along an A-A line of the FinFET 100 in FIG. 1A. As shown in FIG. 1B, the gate 112 is disposed around the fin 104 above a dielectric trench isolation material 118. The gate 112 includes a gate oxide layer 120, a gate dielectric material layer 122, a work function layer 124, and a conductive layer 126. The dielectric trench isolation material 118 limits the effect of the gate 112 on other transistors that share the same substrate 106 by providing an isolation region between the gate 112 and the substrate 106. Additionally, the dielectric trench isolation material 118 provides an isolation region between the gate 112 and a lower portion 128 of the fin 104 that reduces gate control by limiting the conduction channel 102 to a cross-sectional area 130 of the fin 104. The cross-sectional area 130 of the fin 104 is determined by the amount of perimeter P of the fin 104 exposed to the gate 112. The amount of perimeter P exposed to the gate 112 is a function of the height H of each vertical side surface 108 and the length D of the horizontal top surface 110 exposed to the gate 112, and is referred to as the "effective width," or $W_{eff}$, of the FinFET 100. In this manner, the amount of perimeter P exposed to the gate 112 determines the cross-sectional area 130 of the fin 104, which determines the conduction channel 102. A larger effective width $W_{eff}$ of the fin 104 provides a lower conduction channel 102 resistance, thus increasing the drive strength of the FinFET 100. However, FinFETs having stronger drive strengths consume additional power because of increased capacitance over FinFETs with weaker drive strengths. Thus, even with advances in FinFET designs, there still may be a need to improve FinFET performance.

FinFETs, like the FinFET 100 in FIGS. 1A and 1B, can be implemented in a complementary metal-oxide semiconductor (MOS) (CMOS) standard cell, for example. A CMOS standard cell provides a standard layout of P-type MOS (PMOS) and N-type MOS (NMOS) regions and structures for fabricating transistors and interconnect structures to form circuits, including logic circuits. For example, FIGS. 2A-2C illustrate three (3) CMOS standard cells 200(A)-200(C) for 10 nm, 7 nm, and 5 nm node sizes, respectively. The 10 nm CMOS standard cell 200(A) in FIG. 2A has six (6) fins 202(A)(1)-202(A)(6) positioned between two (2) power supply rails 204(A)(1), 204(A)(2) that can form a fin in a fabricated FinFET. For example, a FinFET could be formed in each PMOS and NMOS region 206(A)-206(C), 208(A)-208(C) of each CMOS standard cell 200(A)-200(C). Each FinFET formed in the 10 nm CMOS standard cell 200(A) could employ two (2) outer fins 202(A)(1), 202(A)(2) and 202(A)(5), 202(A)(6) to form their respective channel structures to increase drive strength over a FinFET including only one fin. The fins 202(A)(1)-202(C)(6) of each FinFET of each CMOS standard cell 200(A)-200(C) could be connected to one of a source/drain line 210(A)(1)-210(C)(5) acting as a source and one of a source/drain line 210(A)(1)-210(C)(5) acting as a drain, and be controlled by a gate contact 212(A)(1)-212(C)(2) over one of the four (4) gate lines 214(A)(1)-214(C)(4) of each CMOS standard cell 200(A)-200(C) acting as a gate of each FinFET. The 7 nm CMOS standard cell 200(B) in FIG. 2B has a reduced area over the 10 nm CMOS standard cell 200(A) to support increased device density. However, the 7 nm CMOS standard cell 200(B) has four (4) fins 202(B)(1)-202(B)(4) positioned between two (2) power supply rails 204(B)(1), 204(B)(2), as compared to the six (6) fins 202(A)(1)-202(A)(6) in the 10 nm CMOS standard cell 200(A) in FIG. 2A. The 7 nm CMOS standard cell 200(B) can also support multiple FinFETs each employing two (2) fin channel structures. The 5 nm CMOS standard cell 200(C) in FIG. 2C has an even further reduced area to support increased device density, but has an area that includes two fins 202(C)(1), 202(C)(2) positioned between two (2) power supply rails 204(C)(1), 204(C)(2).

Thus, while each of the CMOS standard cells 200(A)-200(C) in FIGS. 2A-2C support the standard formation of FinFETs, the 5 nm CMOS standard cell 200(C) in FIG. 2C can only support both NMOS-based and PMOS-based Fin-FETs to form a CMOS logic circuit, such as a gate, if each FinFET employs only a single fin channel structure. This is because there are only two fins 202(C)(1), 202(C)(2) in the 5 nm CMOS standard cell 200(c) because of the reduced size of the 5 nm CMOS standard cell 200(C). A FinFET with a single fin channel structure has less drive strength than a similarly-dimensioned FinFET having a multiple-fin channel structure. Thus, employing the 5 nm CMOS standard cell 200(C) in FIG. 2C for fabrication of FinFETs may result in weaker drive strength devices than FinFETs fabricated in the 10 nm and 7 nm CMOS standard cells 200(A), 200(B) in FIGS. 2A and 2B. This can cause the FinFETs fabricated using the 5 nm CMOS standard cell 200(C) to operate outside of designed current margins, increasing the potential for logic errors. However, using the 5 nm CMOS standard cell 200(C) can increase the density of devices, including FinFETs, that can be provided in a given die area, which may also be desirable.

SUMMARY OF THE DISCLOSURE

Aspects disclosed in the detailed description include selectively recessing trench isolation in three-dimensional (3D) transistors to vary channel structure exposures from trench isolation to control drive strength. Varying the exposures of channel structures in 3D transistors from trench isolation allows the drive strengths of the 3D transistors to be varied. Varying the drive strengths of 3D transistors may be advantageous in certain circuit applications to reduce power consumption and/or control drive strength ratios between transistors, as examples. In this regard, in exemplary aspects disclosed herein, during the fabrication of 3D transistors, a trench isolation material is disposed adjacent to channel structures (e.g., fins, nanowires) formed from a substrate. The amount of trench isolation material disposed adjacent to each channel structure determines the amount of channel structure surface area exposed to a gate. The amount of channel structure surface area of the 3D transistor exposed to the gate affects the drive strength of the 3D transistor. In this manner, the heights and/or widths of the channel structures in the 3D transistors do not have to be varied to vary their drive strengths, which may be beneficial as varying the heights and/or widths of the channel structures may otherwise consume additional die area or not be possible. For example, when providing 3D transistors in complementary metal-oxide semiconductor (CMOS) standard cells of a reduced node size(s), the ability to vary channel structure heights and/or widths to vary drive strengths may be limited or not possible depending on the circuit application. Different 3D transistors in a die or within the same standard cell, for example, can have varying drive strengths depending on the circuit applications and performance desired.

In other exemplary aspects disclosed herein, to vary the exposures of channel structures in 3D transistors from trench isolation, after the trench isolation material is disposed adjacent to the channel structures, in one example, a portion of the trench isolation material adjacent to the first channel structure is selectively removed to control the exposure of the first channel structure from the trench isolation according to a desired weak drive strength. Then, one or more selective recess blocking masks are deposited above the trench isolation material disposed adjacent to the first channel structure for reduced exposure. Trench isolation material is removed adjacent to the second channel structure that is not protected by the selective recess blocking mask to form a 3D transistor having a higher drive strength relative to a 3D transistor formed from the first channel structure. The selective recess blocking mask can then be removed. In this manner, a 3D transistor formed from the first channel structure can have a reduced drive strength over another 3D transistor formed from the second channel structure, because the first channel structure is exposed less from the trench isolation than the second channel structure. The overall height of the first and second channel structures can be formed to be substantially the same, which if desired, allows for conventional process steps to be employed in forming the substrate and the channel structures formed therein. In this manner, the heights and/or widths of the formed channel structures may not have to be increased to vary drive strength, which may be beneficial as increasing heights and/or widths of channel structures may otherwise consume additional die area or not otherwise be feasible or possible. If it is desired to form 3D transistors with more than two varied drive strengths, additional selective recess blocking masks can be employed during fabrication.

In one exemplary aspect, an integrated circuit (IC) comprising a substrate, a first 3D transistor, and a second 3D transistor is provided. The substrate comprises a substantially planar top surface. The first 3D transistor comprises a first channel structure extending from the substantially planar top surface of the substrate to a first channel structure height above the substantially planar top surface. The first channel structure comprises a first end portion and a second end portion. A first source is formed in the first end portion of the first channel structure, and a first drain is formed in the second end portion of the first channel structure. The first 3D transistor also comprises at least one first channel formed in the first channel structure between the first source and the first drain. A first trench isolation layer of the first 3D transistor is disposed above the substrate and laterally adjacent to the first channel structure, and comprises a substantially planar top surface at a first trench isolation height above the substantially planar top surface of the substrate. Further, the first 3D transistor comprises a first gate disposed adjacent to the first channel structure and above the first trench isolation layer. The second 3D transistor comprises a second channel structure extending from the substantially planar top surface of the substrate to a second channel structure height above the substantially planar top surface substantially the same as the first channel structure height. The second channel structure comprises a first end portion and a second end portion. A second source is formed in the first end portion of the second channel structure, and a second drain is formed in the second end portion of the second channel structure. The second 3D transistor also comprises at least one second channel formed in the second channel structure between the second source and the second drain. A second trench isolation layer of the second 3D transistor is disposed above the substrate and laterally adjacent to the second channel structure, and comprises a substantially planar top surface at a second trench isolation height above the substantially planar top surface of the substrate different from the first trench isolation height. Further, the second 3D transistor comprises a second gate disposed adjacent to the second channel structure and above the second trench isolation layer.

In another exemplary aspect, an IC comprising a substrate, a first 3D transistor, and a second 3D transistor is provided. The substrate comprises a substantially planar top surface. The first 3D transistor comprises a first means for conducting current extending from the substantially planar top surface of the substrate to a first means for conducting current height above the substantially planar top surface. The first means for conducting current comprises a first end portion and a second end portion. A first means for providing electrical current is formed in the first end portion of the first means for conducting current, and a first means for receiving electrical current is formed in the second end portion of the first means for conducting current. A first means for dispersing electric field of the first 3D transistor is disposed above the substrate and is laterally adjacent to the first means for conducting current, and comprises a substantially planar top surface at a first means for dispersing electric field height above the substantially planar top surface of the substrate. Further, the first 3D transistor comprises a first means for controlling electrical current through the first means for conducting current disposed adjacent to the first means for conducting current and above the first means for dispersing electric field. The second 3D transistor comprises a second means for conducting current extending from the substantially planar top surface of the substrate to a second means for conducting current height above the substantially planar top surface substantially the same as the first means for conducting current height. The second means for conducting current comprises a first end portion and a second end portion. A second means for providing electrical current is formed in the first end portion of the second means for conducting current, and a second means for receiving electrical current is formed in the second end portion of the second means for conducting current. A second means for dispersing electric field of the second 3D transistor is disposed above the substrate and laterally adjacent to the second means for conducting current, and comprises a substantially planar top surface at a second means for dispersing electric field height above the substantially planar top surface of the substrate different from the first means for dispersing electric field height. Further, the second 3D transistor comprises a second means for controlling electrical current through the at least one second means for conducting current disposed adjacent to the second means for conducting current and above the second means for dispersing electric field.

In another exemplary aspect, a method of selectively recessing trench isolation to vary channel structure exposures from trench isolation to control drive strength is provided. The method comprises forming a first channel structure and a second channel structure from a substantially planar top surface of a substrate such that the first and second channel structures extend to substantially the same height above the substantially planar top surface. A trench isolation material is deposited adjacent to the first channel structure and the second channel structure to a first trench isolation height above the substantially planar top surface of the substrate. A substantially planar top surface of a first trench isolation layer is then formed laterally adjacent to the first channel structure at a second trench isolation height above the substantially planar top surface of the substrate. A first selective recess blocking mask is then deposited above the first trench isolation layer laterally adjacent to the first channel structure. A portion of the trench isolation material not below the first selective recess blocking mask and adjacent to the second channel structure is then removed so as to form a substantially planar top surface of a second trench isolation layer. The substantially planar top surface of the second trench isolation layer is formed laterally adjacent to the second channel structure and a third trench isolation height above the substantially planar top surface of the substrate. The third trench isolation height is different from the second trench isolation height. The first selective recess blocking mask is then removed.

BRIEF DESCRIPTION OF THE FIGURES

FIGS. 5B-1 and 5B-2 are cross-sectional and top-view diagrams illustrating depositing a trench isolation material adjacent to the two channel structures of the standard cell in FIGS. 3A and 3B according to the exemplary fabrication process in FIG. 4;

FIGS. 5C-1 and 5C-2 are cross-sectional and top-view diagrams illustrating depositing a selective recess blocking mask above the channel structure of the "weaker" FinFET of the standard cell in FIGS. 3A and 3B according to the exemplary fabrication process in FIG. 4;

FIGS. 5D-1 and 5D-2 are cross-sectional and top-view diagrams illustrating removing a portion of trench isolation material not below the selective recess blocking mask and adjacent to the channel structure of the "stronger" FinFET of the standard cell in FIGS. 3A and 3B according to the exemplary fabrication process in FIG. 4;

FIGS. 5E-1 and 5E-2 are cross-sectional and top-view diagrams illustrating removing the selective recess blocking mask to form the channel structures of the standard cell in FIGS. 3A and 3B having varying exposures from trench isolation according to the exemplary fabrication process in FIG. 4;

FIGS. 5F-1 and 5F-2 are cross-sectional and top-view diagrams illustrating forming a gate above the channel structures having varying exposures from trench isolation to form the FinFETs of the standard cell in FIGS. 3A and 3B;

FIGS. 9A-9E are cross-sectional diagrams illustrating the two (2) standard cells having nanowire structures with varied nanowire channel structure exposures in FIGS. 8A and 8B at various fabrication stages;

FIG. 11 is a block diagram of an exemplary processor-based system that can include 3D transistors that can be provided in standard cells and have varying channel structure exposures within and/or across different standard cells from trench isolation to vary drive strength, wherein one of the 3D transistors is a "weaker" FinFET having a weaker drive strength relative to the other "stronger" FinFET having a stronger relative drive strength and according to the exemplary aspects disclosed herein.

DETAILED DESCRIPTION

Figure 1A:
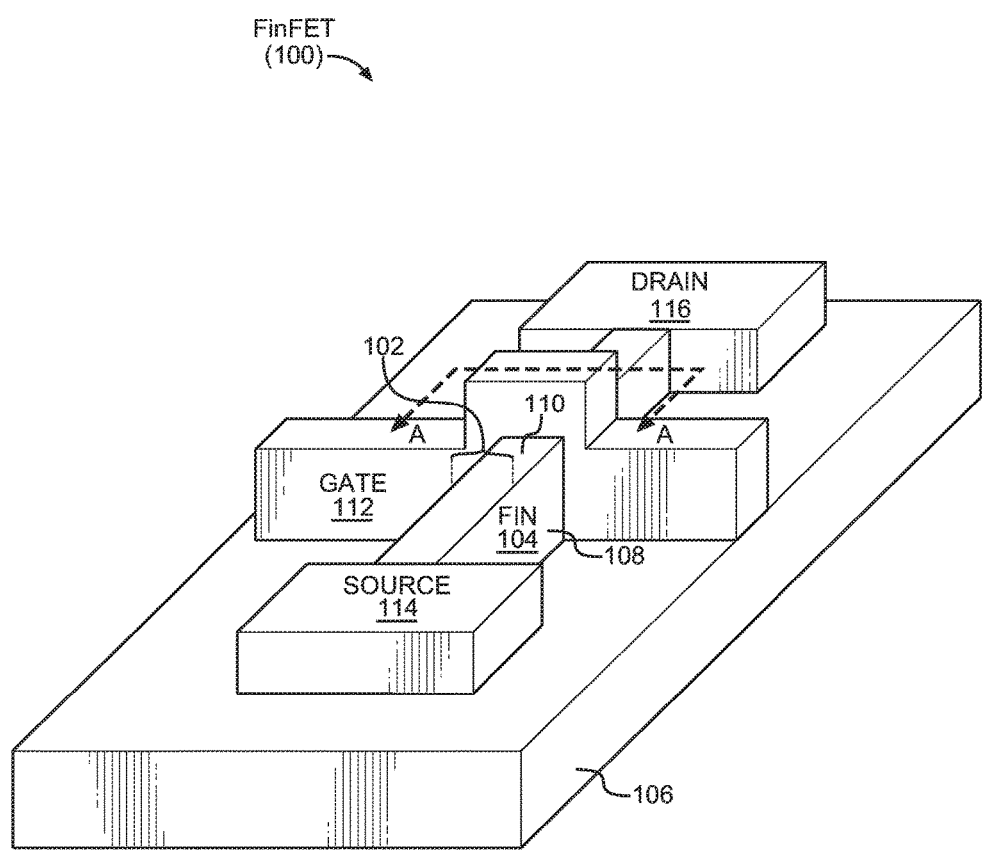
FIG. 1A is a perspective diagram of an exemplary Fin Field-Effect Transistor (FinFET)
Figure 1B:
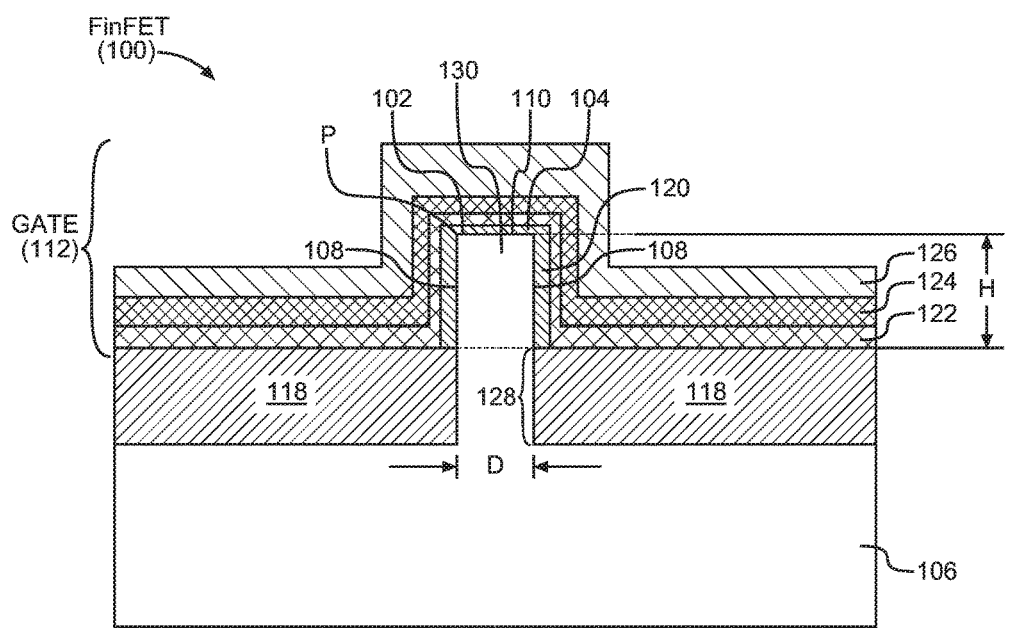
FIG. 1B is a cross-sectional diagram of the FinFET in FIG. 1.
Figure 2A:
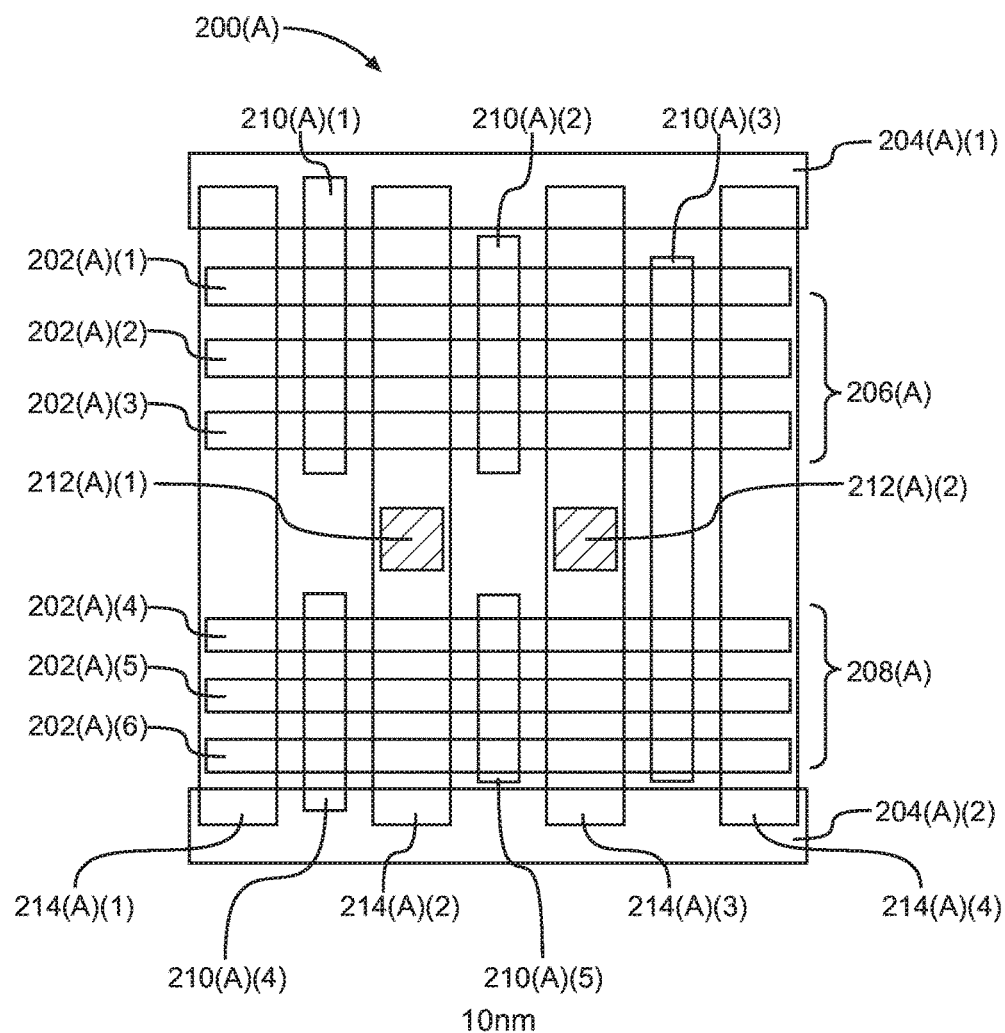
FIGS. 2A-2C illustrate top views of an exemplary ten (10) nanometer (nm) standard cell, a seven (7) nm standard cell, and a five (5) nm standard cell, respectively.
Figure 2B:
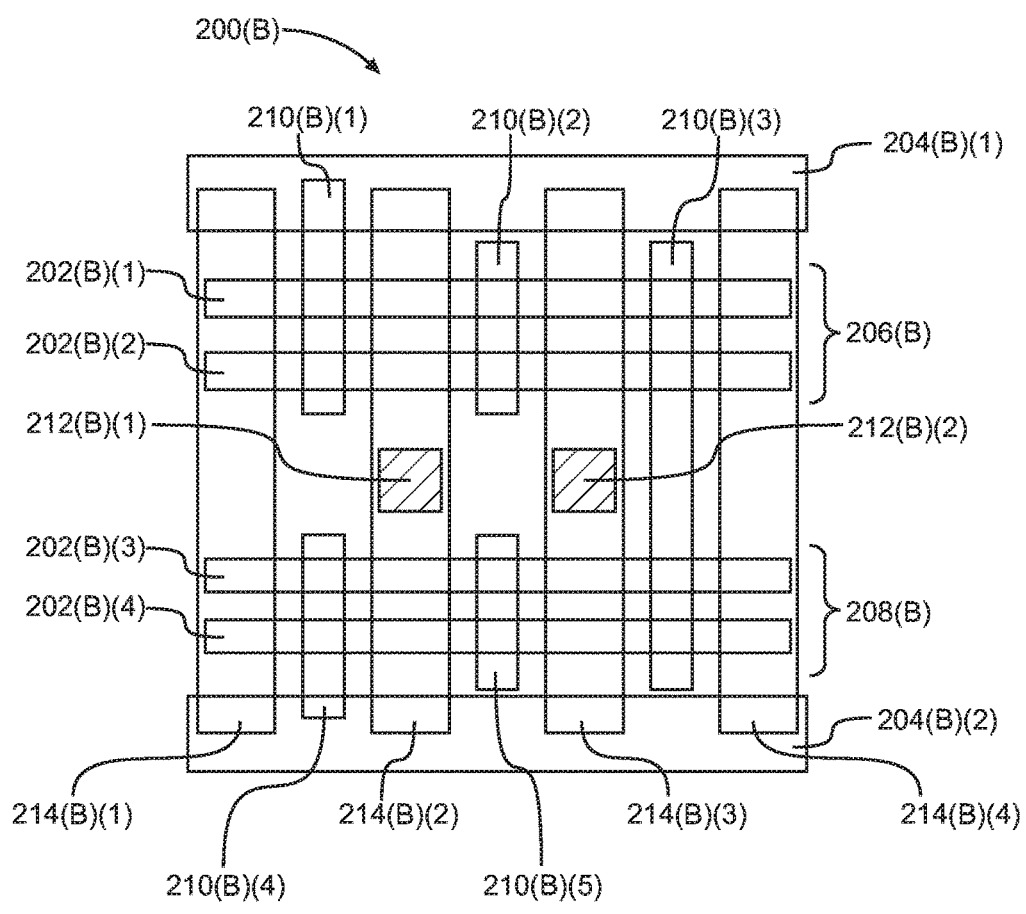
Figure 2C:
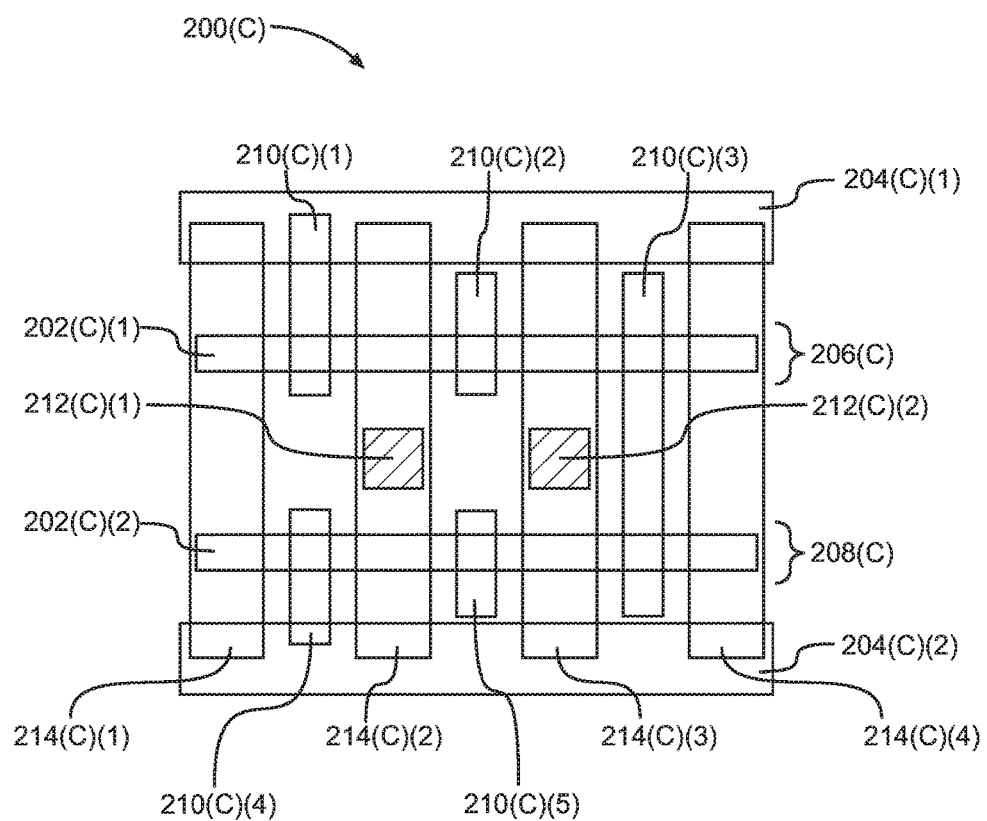

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include selectively recessing trench isolation in three-dimensional (3D) transistors to vary channel structure exposures from trench isolation to control drive strength. Varying the exposures of channel structures in 3D transistors from trench isolation allows the drive strengths of the 3D transistors to be varied. Varying the drive strengths of 3D transistors may be advantageous in certain circuit applications to reduce power consumption and/or control drive strength ratios between transistors, as examples. In this regard, in exemplary aspects disclosed herein, during the fabrication of 3D transistors, a trench isolation material is disposed adjacent to channel structures (e.g., fins, nanowires) formed from a substrate. The amount of trench isolation material disposed adjacent to each channel structure determines the amount of channel structure surface area exposed to a gate. The amount of channel structure surface area of the 3D transistor exposed to the gate affects the drive strength of the 3D transistor. In this manner, the heights and/or widths of the channel structures in the 3D transistors do not have to be varied to vary their drive strengths, which may be beneficial as varying the heights and/or widths of the channel structures may otherwise consume additional die area or not be possible. For example, when providing 3D transistors in complementary metal-oxide semiconductor (CMOS) standard cells of a reduced node size(s), the ability to vary channel structure heights and/or widths to vary drive strengths may be limited or not possible depending on the circuit application. Different 3D transistors in a die or within the same standard cell, for example, can have varying drive strengths depending on the circuit applications and performance desired.

In other exemplary aspects disclosed herein, to vary the exposures of channel structures in 3D transistors from trench isolation, after the trench isolation material is disposed adjacent to the channel structures, in one example, a portion of the trench isolation material adjacent to the first channel structure is selectively removed to control the exposure of the first channel structure from the trench isolation according to a desired weak drive strength. Then, one or more selective recess blocking masks are deposited above the trench isolation material disposed adjacent to the first channel structure for reduced exposure. Trench isolation material is removed adjacent to the second channel structure that is not protected by the selective recess blocking mask to form a 3D transistor having a higher drive strength relative to a 3D transistor formed from the first channel structure. The selective recess blocking mask can then be removed. In this manner, a 3D transistor formed from the first channel structure can have a reduced drive strength over another 3D transistor formed from the second channel structure, because the first channel structure is exposed less from the trench isolation than the second channel structure. The overall height of the first and second channel structures can be formed to be substantially the same, which if desired, allows for conventional process steps to be employed in forming the substrate and the channel structures formed therein. In this manner, the heights and/or widths of the formed channel structures may not have to be increased to vary drive strength, which may be beneficial as increasing heights and/or widths of channel structures may otherwise consume additional die area or not otherwise be feasible or possible. If it is desired to form 3D transistors with more than two varied drive strengths, additional selective recess blocking masks can be employed during fabrication.

Figure 3A:
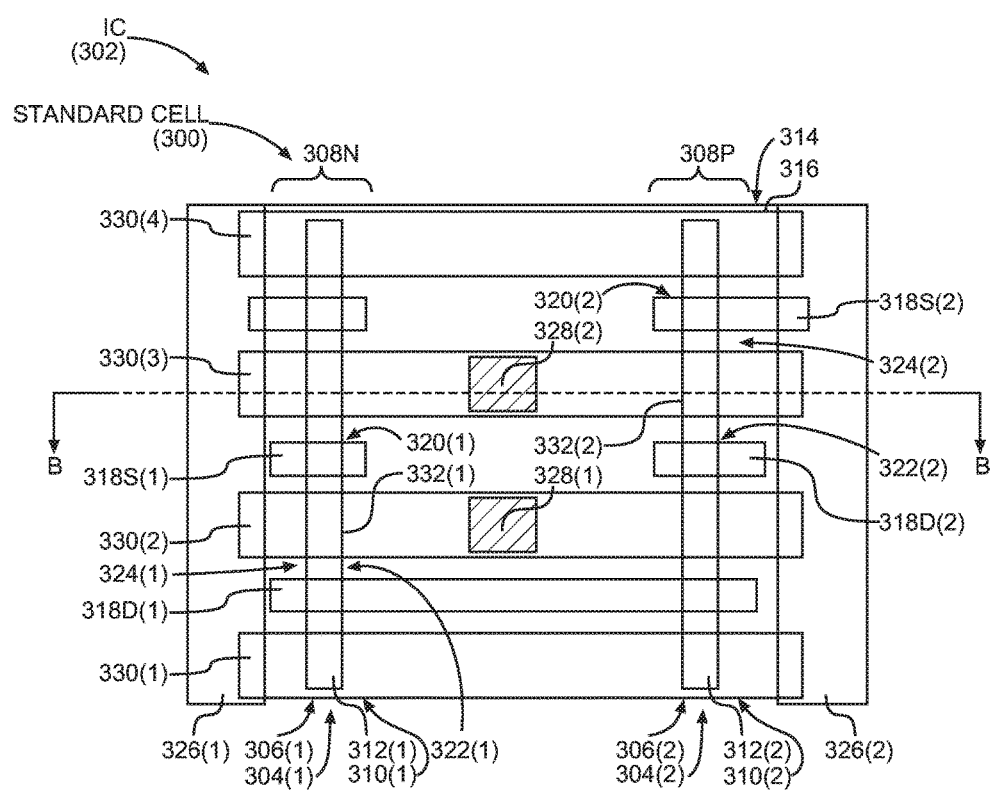
FIG. 3A is a top-view diagram of an exemplary standard cell including two (2) three-dimensional (3D) transistors, each in the form of a FinFET having one (1) fin as a channel structure, with varying channel structure exposures from trench isolation to vary drive strength, wherein one of the 3D transistors is a "weaker" FinFET having a weaker drive strength relative to the other "stronger" FinFET having a stronger relative drive strength.

In this regard, FIG. 3A illustrates a top-view diagram of an exemplary standard cell 300 including 3D transistors with varying channel structure exposures from trench isolation to vary drive strength. A standard cell is a group of transistor and interconnect structures that provide a Boolean logic function or a storage function. In this regard, the standard cell 300 is formed in an integrated circuit (IC) 302 and includes a first 3D transistor 304(1) in the form of a first Fin Field-Effect Transistor (FinFET) 306(1) and a second 3D transistor 304(2) in the form of a second FinFET 306(2). In this example, the first FinFET 306(1) is formed in an N-type MOS (NMOS) region 308N of the standard cell 300 and the second FinFET 306(2) is formed in a P-type MOS (PMOS) region 308P of the standard cell 300. The first FinFET 306(1) has a first channel structure 310(1) in the form of a first fin 312(1) formed from a substantially planar top surface 314 of a substrate 316. The first FinFET 306(1) includes a first source 318S(1) formed in a first end portion 320(1) of the first fin 312(1) and a first drain 318D(1) formed in a second end portion 322(1) of the first fin 312(1). The first FinFET 306(1) also includes a first channel 324(1) formed in the first fin 312(1) between the first drain 318D(1) and the first source 318S(1) as a fin-type channel. Similarly, the second FinFET 306(2) has a second channel structure 310(2) in the form of a second fin 312(2) formed from the substantially planar top surface 314 of the substrate 316. The second FinFET 306(2) includes a second source 318S(2) formed in a first end portion 320(2) of the second fin 312(2) and a second drain 318D(2) formed in a second end portion 322(2) of the second fin 312(2). The second FinFET 306(2) also includes a second channel 324(2) formed in the second fin 312(2) between the second drain 318D(2) and the second source 318S(2). The first FinFET 306(1) and the second FinFET 306(2) are formed in the standard cell 300 between and substantially parallel to two (2) power rails 326(1), 326(2) also provided in the standard cell 300. A gate contact 328(1), 328(2) is formed over one of a gate line 330(1)-330(4) of each FinFET 306(1), 306(2) to form a respective gate 332(1), 332(2) that controls the current conduction through each channel 324(1), 324(2).

Figure 3B:
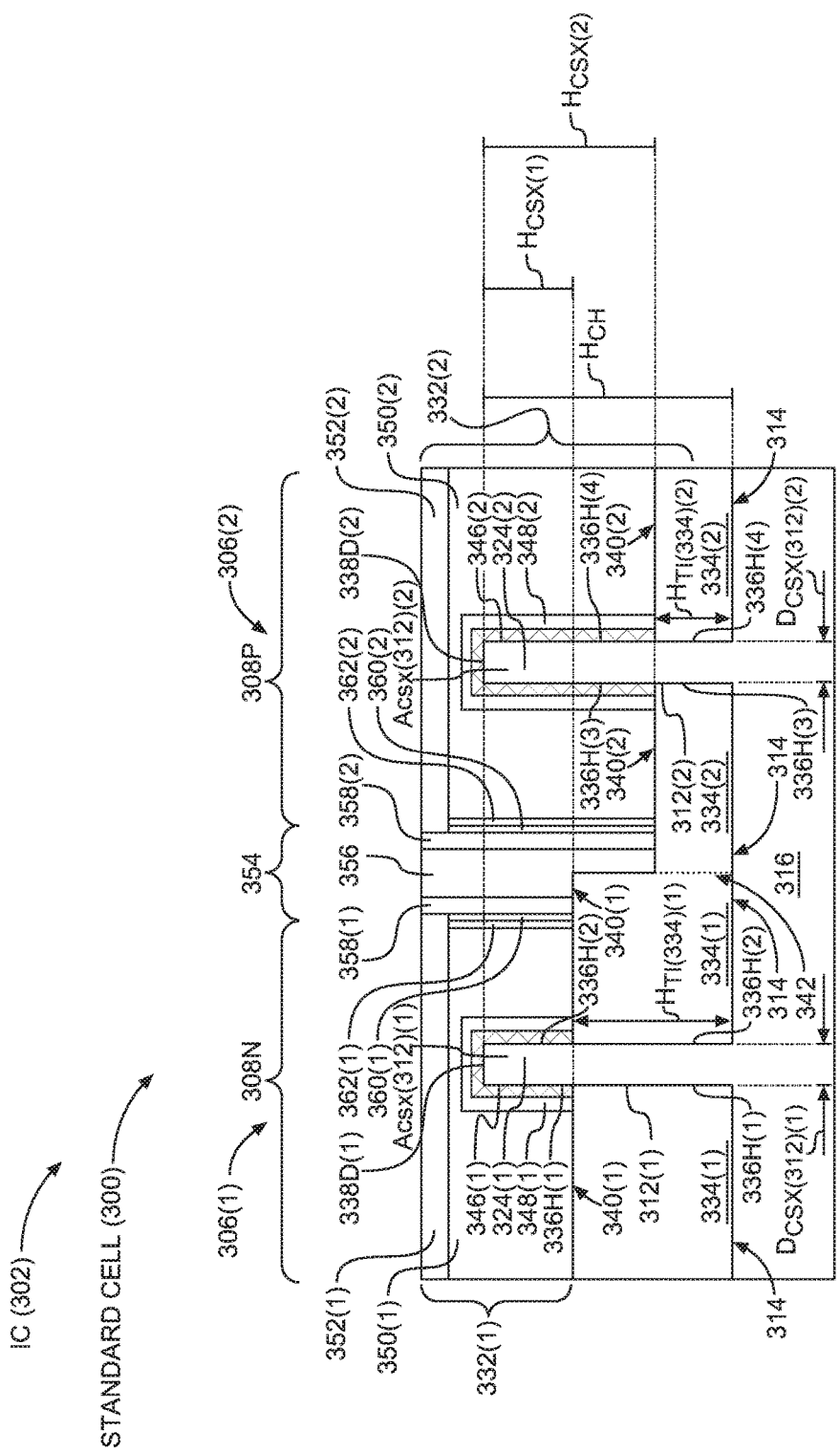
FIG. 3B is a cross-sectional diagram of the exemplary standard cell of FIG. 3A.

FIG. 3B is a cross-sectional view along a B-B line of the exemplary standard cell 300 of FIG. 3A to further illustrate the varied exposure of the first fin 312(1) and the second fin 312(2) in the respective first and second FinFETs 306(1), 306(2) from trench isolation to vary the drive strength of the first FinFET 306(1) and the second FinFET 306(2). In this regard, with reference to FIG. 3B, a first and second trench isolation layer 334(1), 334(2) are each disposed adjacent to the first and second fins 312(1), 312(2), respectively, to provide current isolation between channels 324(1), 324(2) provided by the respective first and second fins 312(1), 312(2) of the FinFETs 306(1), 306(2). The first and second trench isolation layers 334(1), 334(2) also limit the effect of the first and second gate 332(1), 332(2), respectively, on other transistors that share the same substrate 316 by isolating the substrate 316 from the electric field of each gate 332(1), 332(2). For example, the first trench isolation layer 334(1) limits the effect of the first gate 332(1) on the second FinFET 306(2). Similarly, the second trench isolation layer 334(2) limits the effect of the second gate 332(2) on the first FinFET 306(1).

Additionally, each trench isolation layer 334(1), 334(2) limits the amount of gate control over a respective fin 312(1), 312(2) by isolating a lower portion of the fin 312(1), 312(2) from the electric field of a respective gate 332(1), 332(2). For example, having the first trench isolation layer 334(1) cover a lower portion of the first fin 312(1) to a first trench isolation height $H_{TI(334)(1)}$ reduces the amount of surface area of the first fin 312(1) exposed to the first gate 332(1). By reducing the amount of direct gate-to-fin contact and by using the first trench isolation layer 334(1) to isolate portions of the first fin 312(1) not in direct contact with the first gate 332(1) from the electric field of the first gate 332(1), the amount of gate control over the first fin 312(1) is reduced. Similarly, the amount of gate control over the second fin 312(2) is reduced as a function of a second trench isolation height $H_{TI(334)(2)}$ of the second trench isolation layer 334(2).

There are several factors that affect the drive strength (i.e., current conduction) through the fins 312(1), 312(2) of the respective FinFETs 306(1), 306(2). The cross-sectional (denoted as CSX) area $A_{CSX(312)(1)}$, $A_{CSX(312)(2)}$ of each fin 312(1), 312(2) determines the resistance, and thus affects the drive strength of the respective channel 324(1), 324(2) of each fin 312(1), 312(2), which is referred to as the "effective width," $W_{eff}$, of the respective FinFET 306(1), 306(2). A decrease in resistance of the fins 312(1), 312(2) increases drive strength of the respective FinFETs 306(1), 306(2). The cross-sectional area $A_{CSX(312)(1)}$, $A_{CSX(312)(2)}$ of each fin 312(1), 312(2) is a function of the height $H_{CSX(312)(1)}$, $H_{CSX(312)(2)}$ of each vertical side surface 336H(1)-336H(4) exposed from the respective trench isolation layers 334(1), 334(2) times the length $D_{CSX(312)(1)}$, $D_{CSX(312)(2)}$ of each horizontal top surface 338D(1), 338D(2) exposed to the gate 332(1), 332(2). Thus, since a larger effective width $W_{eff}$ reduces channel 324(1), 324(2) resistance, FinFET 306(1), 306(2) drive strength can be increased by increasing effective width $W_{eff}$. For example, as shown in FIG. 3B, the drive strength of the first FinFET 306(1) is lower, or "weaker," than the drive strength of the second FinFET 306(2) because the effective width $W_{eff(1)}$ of the first FinFET 306(1), given by $2H_{CSX(312)(1)}+D_{CSX(312)(1)}$, is less than the effective width $W_{eff(2)}$ of the second FinFET 306(2), given by $2H_{CSX(312)(2)}+D_{CSX(312)(2)}$. Thus, by controlling the exposure of each fin 312(1), 312(2) from the respective trench isolation layers 334(1), 334(2), the amount of fin surface area exposed to each gate 332(1), 332(2) is also controlled, resulting in the second FinFET 306(2) having a stronger drive strength relative to the drive strength of the first FinFET 306(1).

Thus, as shown in FIGS. 3A and 3B, by varying the trench isolation heights $H_{TI(334)(1)}$, $H_{TI(334)(2)}$ of the trench isolation layers 334(1), 334(2), the heights $H_{CSX(312)(1)}$, $H_{CSX(312)(2)}$ of the vertical side surfaces 336H(1)-336H(4) of the fins 312(1), 312(2) exposed to the gate 332(1), 332(2) are also varied, thus varying their respective drive strengths. Since the effective width $W_{eff(1)}$, $W_{eff(2)}$ of each FinFET 306(1), 306(2) is a function of fin 312(1), 312(2) exposure from trench isolation, and drive strength is a function of effective width $W_{eff}$, varying the exposures of the first fin 312(1) and the second fin 312(2) from trench isolation varies the drive strengths of the first FinFET 306(1) and the second FinFET 306(2), respectively. Varying the drive strengths of the FinFETs 306(1), 306(2) may be advantageous in certain circuit applications to reduce power consumption and/or control drive strength ratios between transistors, as examples. In this manner, the heights and/or widths of the fins 312(1), 312(2) in the FinFETs 306(1), 306(2) do not have to be varied to vary their drive strengths, which may be beneficial as varying the heights and/or widths of the fins 312(1), 312(2) may otherwise consume additional die area or not be possible.

Also, as provided in FIGS. 3A and 3B, having two (2) FinFETs 306(1), 306(2) of varying drive strengths in the same standard cell 300 may be desirable because many ICs require both high drive strength FETs and low drive strength FETs in the same standard cell. For example, the IC 302 might require only one high drive strength FinFET, such as the second FinFET 306(2), in the standard cell 300 in order to reduce logic errors in a given circuit. The IC 302 might not require the first FinFET 306(1) to have a high drive strength in order to achieve the required reduction in logic errors. By providing the high drive strength second FinFET 306(2) and the low drive strength first FinFET 306(1) proximate to one another in the same standard cell 300, the standard cell 300 can provide the IC 302 with the FinFETs 306(1), 306(2) required to reduce logic errors. The IC 302 can also reduce power consumption because the low drive strength first FinFET 306(1) requires less power than the high drive strength second FinFET 306(2). Furthermore, the IC 302 can reduce logic errors because the high drive strength second FinFET 306(2) generally provides a larger write margin (i.e., the amount by which the write assertion signal exceeds the minimum amount for proper operation) than low drive strength first FinFET 306(1). Thus, in this example, the standard cell 300 allows for the IC 302 to benefit from both reduced logic errors and reduced power consumption. Additionally, by forming the gate 332(1), 332(2) of each FinFET 306(1), 306(2) over a substantially planar top surface 340(1), 340(2) of each trench isolation layer 334(1), 334(2), the FinFETs 306(1), 306(2) of the standard cell 300 can reduce the parallel plate capacitance between each gate 332(1), 332(2) and each channel 324(1), 324(2) of the respective FinFET 306(1), 306(2). This feature can increase the frequency at which each FinFET 306(1), 306(2) can operate and can reduce parasitic capacitance throughout the IC 302, for example, further reducing both logic errors and power consumption.

Moreover, by controlling fin exposure from trench isolation to vary drive strength instead of adjusting the height and/or width of the fin to vary drive strength, design costs and complexities associated with having FinFETs of varying fin heights and/or widths in standard cells may be reduced. For example, since the first and second fins 312(1), 312(2) in FIG. 3B both extend from the substantially planar top surface 314 of the substrate 316 to a same channel structure height $H_{CH}$, the height $H_{CH}$ of each fin 312(1), 312(2) is not varied in order to vary drive strength. Rather, the drive strengths of the first and second FinFETs 306(1), 306(2) are varied by controlling the exposure of each fin 312(1), 312(2) from trench isolation. This aspect is beneficial because varying the height $H_{CH}$ of the fins 312(1), 312(2) in the same standard cell 300 may otherwise consume additional die area or result in the standard cell 300 having more than one channel structure height $H_{CH}$ throughout, the latter of which could increase IC design costs and complexity. By providing a way to vary the drive strengths of transistors within a standard cell, such as the exemplary standard cell 300 illustrated in FIGS. 3A and 3B, without having fins of varying channel structure heights $H_{CH}$, IC design costs and complexity can be reduced.

In this regard, the substrate 316 can comprise materials such as silicon (Si), silicon germanium (SiGe), germanium (Ge), and/or other III-V compounds. Each source 318S(1), 318S(2) can comprise materials such as silicon (Si), silicon germanium (SiGe), silicon carbide (SiC), silicon phosphide (SiP), and/or any other low-resistance semiconductor material with silicide/direct/ohmic contacted to metal-layer, and can be formed by epitaxy, conformal deposition, and/or direct landing deposition. Further, each drain 318D(1), 318D(2) can comprise materials the same or similar to those listed for each source 318S(1), 318S(2). Each gate contact 328(1), 328(2) can comprise conductive materials such as tungsten (W), cobalt (Co), and/or other low-resistance metals, and can be formed by via or trench-opening followed by metal fill. Each gate line 330(1)-330(4) can comprise materials such as poly-silicon (poly-Si), a set of metal-containing work-function metals and fill metals, and/or low-ohmic semiconductor materials, and can be formed by poly-silicon oxynitride (poly-SiON) processes, gate-first processes, and/or gate-last (replacement-gate) processes. Each power rail 326(1), 326(2) can comprise materials such as copper (Cu), tungsten (W), aluminum (Al) and/or cobalt (Co), and can be formed by semi-damascene, full-damascene, and/or direct metal etch processes. Each channel structure 310(1), 310(2) can comprise materials such as silicon (Si), silicon germanium (SiGe), germanium (Ge), and/or other III-V compounds. Each channel structure 310(1), 310(2) can comprise heights ranging from 10 nm to 100 nm, and/or widths ranging from 2 nm to 50 nm. Each trench isolation layer 334(1), 334(2) can comprise materials such as oxide, nitride, and/or any other dielectric material. Each trench isolation layer 334(1), 334(2) can comprise heights ranging from 20 nm to 200 nm and widths from 10 nm to the width of an entire wafer (300 mm for example). Each trench isolation height $H_{TI(334)(1)}$, $H_{TI(334)(2)}$ can include heights ranging from 10 nm to several hundreds of nm. The height $H_{CSX(312)(1)}$, $H_{CSX(312)(2)}$ of each vertical side surface 336H(1)-336H(4) can include heights ranging from 10 nm to 200 nm. The length $D_{CSX(312)(1)}$, $D_{CSX(312)(2)}$ of each horizontal top surface 338D(1), 338D(2) can include lengths ranging from 2 nm to 50 nm. In this manner, effective width $W_{eff}$ can include effective widths ranging from 22 nm to several hundreds of nm.

Figure 4:
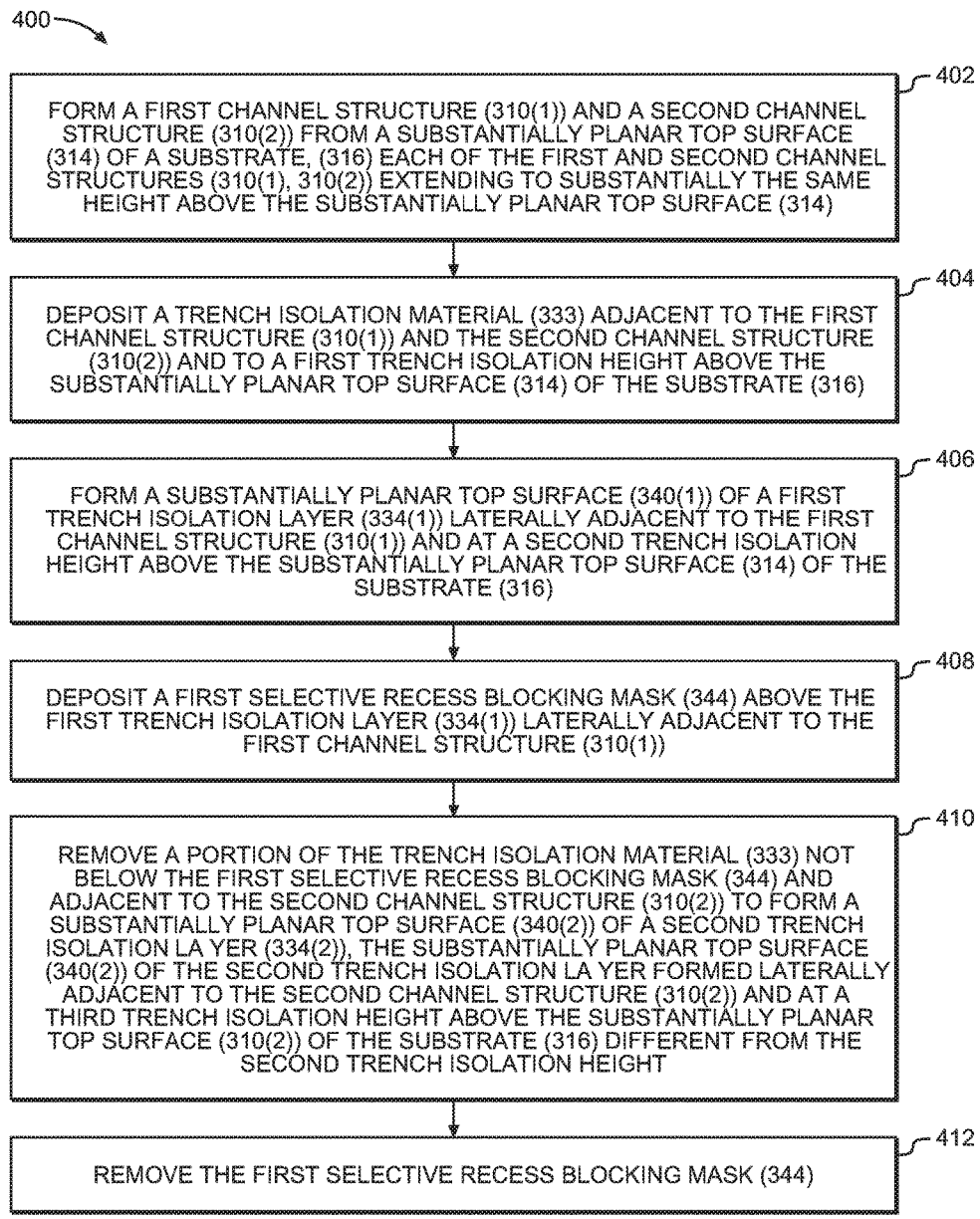
FIG. 4 is a flowchart illustrating an exemplary process of fabricating the standard cell of FIGS. 3A and 3B.
Figures 1, 5A:
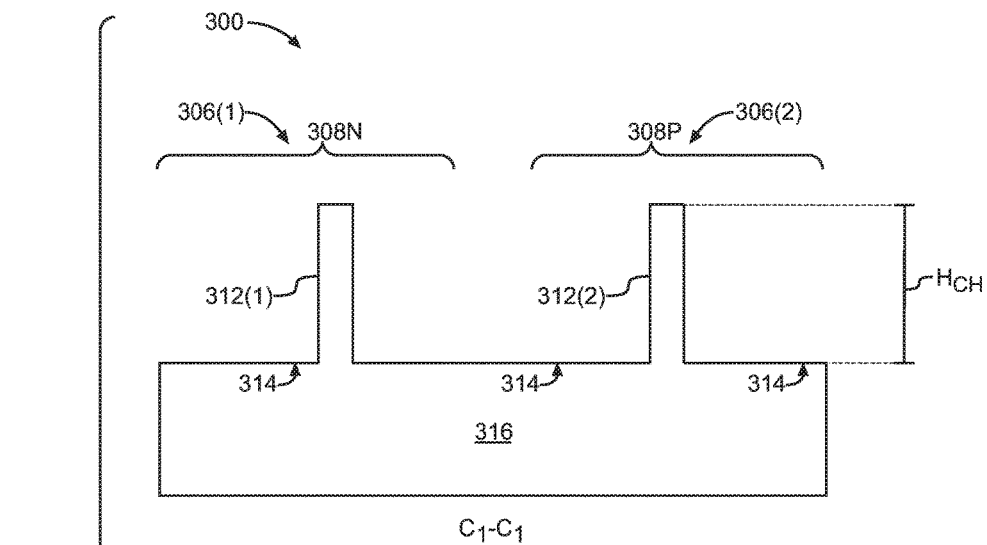
FIGS. 5A-1 and 5A-2 are cross-sectional and top-view diagrams illustrating forming the two (2) channel structures from the substrate of the standard cell in FIGS. 3A and 3B according to the exemplary fabrication process in FIG. 4.
Figures 2, 5A:
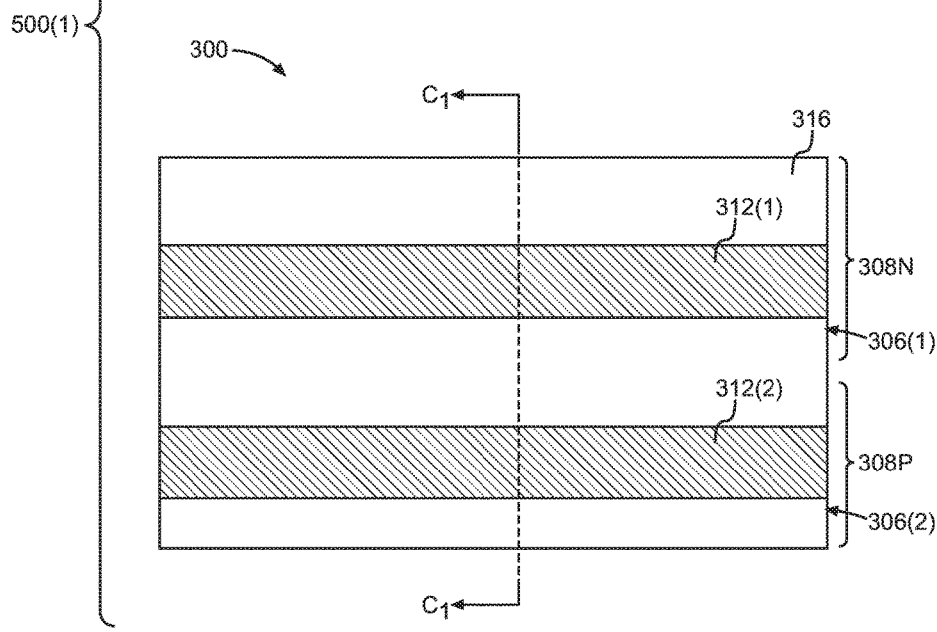

FIG. 4 illustrates an exemplary fabrication process 400 employed to fabricate the two (2) FinFETs 306(1), 306(2) in the standard cell 300 in FIGS. 3A and 3B. In this regard, as shown in FIG. 4, a first step of the fabrication process 400 in FIG. 4 includes forming a first channel structure 310(1) and a second channel structure 310(2) as the first and second fin 312(1), 312(2) in the standard cell 300 in FIGS. 3A and 3B, respectively, from a substantially planar top surface 314 of a substrate 316, wherein each of the first and second channel structures 310(1), 310(2) extend to substantially the same height above the substantially planar top surface 314 (block 402 in FIG. 4). In this regard, FIGS. 5A-1 and 5A-2 illustrate cross-sectional side and top views, respectively, of a first fabrication stage 500(1) of forming the first and second fins 312(1), 312(2) in the standard cell 300 according to the fabrication step in block 402 in FIG. 4. FIG. 5A-1 is a cross-sectional side view of the standard cell 300 across the C1-C1 line in FIG. 5A-2. As shown in FIGS. 5A-1 and 5A-2, the first fin 312(1) of the first FinFET 306(1) is formed in the NMOS region 308N of the substrate 316. The second fin 312(2) of the second FinFET 306(2) is formed in the PMOS region 308P of the substrate 316. The first and second fin 312(1), 312(2) both extend to the same channel structure height $H_{CH}$ above the substantially planar top surface 314 of the substrate 316, in accordance with the fabrication step in block 402 in FIG. 4. In this manner, the first and second fins 312(1), 312(2) are formed in the standard cell 300 from the substantially planar top surface 314 of the substrate 316.

The NMOS region 308N and PMOS region 308P can be formed in a variety of ways, which include but are not limited to diffusion processes, well formation, and/or in-situ doped epitaxial processes. In this manner, the standard cell 300 has CMOS standard cell characteristics, as it contains both an NMOS region 308N and a PMOS region 308P. In this aspect, the fabrication process 400 can include multiple steps to form the first and second fins 312(1), 312(2) from the substantially planar top surface 314 of the substrate 316. For example, forming the first and second fins 312(1), 312(2) from the substantially planar top surface 314 of the substrate 316 can include doping a bulk wafer comprising materials such as silicon (Si), silicon germanium (SiGe), and/or other III-V compounds, with dopants such as boron (B), arsenic (As), and/or phosphorus (P). Dopants of a first polarity, such as an N-type polarity, can include dopants such as phosphorus (P). Dopants of a second polarity, such as a P-type polarity, can include dopants such as boron (B). Doping processes can include ion-implantation and in-situ doped epitaxial processes. Forming the first and second fins 312(1), 312(2) can include etching a bulk wafer to remove portions of the wafer so as to form the first and second fins 312(1), 312(2). Etching can include dry etching, wet etching, and/or chemical recessing, and can use etchants such as hydrochloric acid (HCl), alkaline, and/or tetramethylammonium hydroxide (TMAH). Forming the first and second fins 312(1), 312(2) can also include epitaxially growing the fins 312(1), 312(2), guided epitaxial growth, and/or faceted epitaxial growth. Forming the fins 312(1), 312(2) to the same channel structure height $H_{CH}$ can include using processes such as chemical mechanical planarization (CMP), and/or other physical or chemical planarization steps. Channel structure heights $H_{CH}$ can include heights ranging from 10 nm to 100 nm.

The fabrication process 400 in FIG. 4 also includes depositing a trench isolation material 333 adjacent to the first channel structure 310(1) and the second channel structure 310(2) to a first trench isolation height $H_{TI(334)(1)}$ above the substantially planar top surface 314 of the substrate 316 (block 404 in FIG. 4). Further, the fabrication process 400 in FIG. 4 also includes forming a substantially planar top surface 340(1) of the first trench isolation layer 334(1) laterally adjacent to the first channel structure 310(1) and at a second trench isolation height about the substantially planar top surface 314 of the substrate 316 (block 406 in FIG. 4). As will be discussed in more detail below, the deposited trench isolation material 333 will be further processed, including etched, to form the final trench isolation layers 334(1), 334(2) as illustrated in FIGS. 3A and 3B.

Figures 1, 5B:
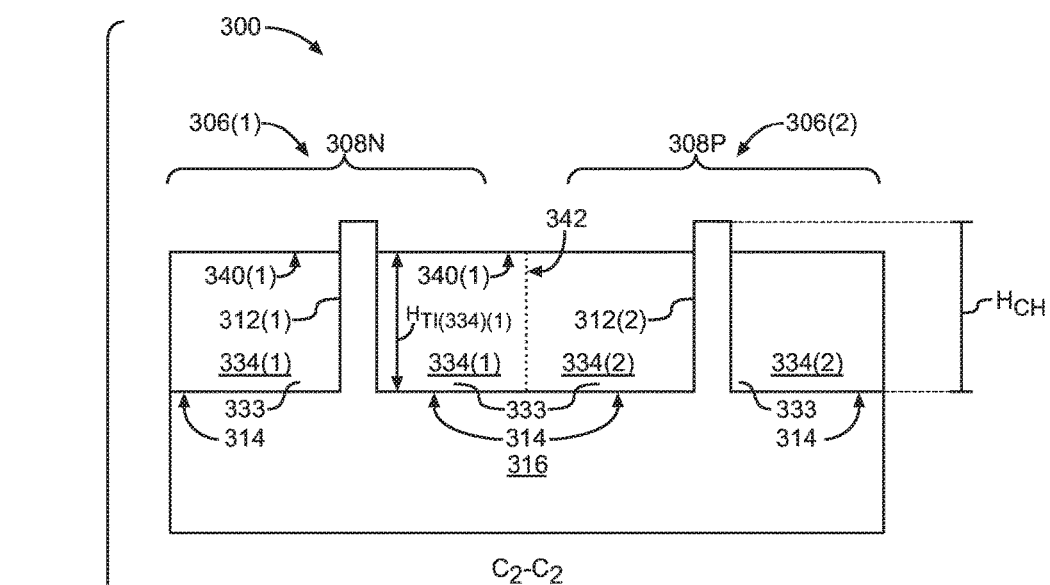
Figures 2, 5B:
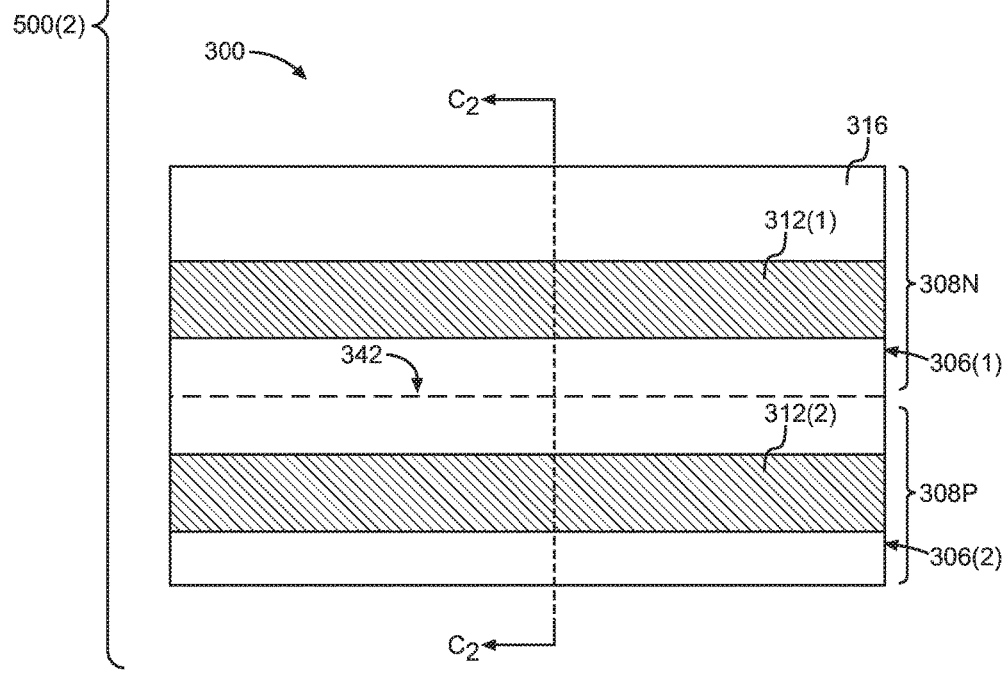

In this regard, FIGS. 5B-1 and 5B-2 illustrate cross-sectional side and top views, respectively, of a second fabrication stage 500(2) of depositing the trench isolation material 333 adjacent to the first and second fin 312(1), 312(2) in the standard cell 300 to a first trench isolation height $H_{TI(334)(1)}$, according to the fabrication step in block 404 in FIG. 4. FIG. 5B-1 is a cross-sectional side view of the standard cell 300 across the C2-C2 line in FIG. 5B-2. As shown in FIGS. 5B-1 and 5B-2, the trench isolation material 333 is deposited adjacent to the first fin 312(1) of the first FinFET 306(1) and the second fin 312(2) of the second FinFET 306(2) and extends to a first trench isolation height $H_{TI(334)(1)}$ above the substantially planar top surface 314 of the substrate 316. The trench isolation material 333 adjacent to the first fin 312(1) of the first FinFET 306(1) forms the first trench isolation layer 334(1). The first trench isolation layer 334(1) has a substantially planar top surface 340(1) formed at the first trench isolation height $H_{TI(334)(1)}$ laterally adjacent to the first fin 312(1). As shown in FIG. 5B-1, the trench isolation material 333 adjacent to the second fin 312(2) of the second FinFET 306(2) is not yet formed to a second trench isolation height $H_{TI(334)(2)}$ different from the first trench isolation height $H_{TI(334)(1)}$, and therefore does not yet form the second trench isolation layer 334(2). As shown in FIGS. 5B-1 and 5B-2, a boundary line 342 in the trench isolation material 333 delineates the portion of the trench isolation material 333 that will form the first trench isolation layer 334(1), and the portion of the trench isolation material 333 adjacent to the second fin 312(2) that will be further processed to form the second trench isolation layer 334(2) in the standard cell 300.

With continuing reference to FIGS. 5B-1 and 5B-2, the first trench isolation layer 334(1) is deposited adjacent to the first fin 312(1) to limit the effect of the first gate 332(1), as shown in FIG. 3B. As previously discussed above, the first trench isolation layer 334(1) limits the effect of the first gate 332(1) on transistors, such as the second FinFET 306(2), that share the same substrate 316 by isolating the substrate 316 from the electric field of the first gate 332(1). Additionally, the first trench isolation layer 334(1) limits gate control over the first fin 312(1) by isolating a lower portion of the first fin 312(1) from the electric field of the first gate 332(1). By having the first trench isolation layer 334(1) cover a lower portion of the first fin 312(1) to a first trench isolation height $H_{TI(334)(1)}$, the amount of surface area of the first fin 312(1) exposed to the first gate 332(1) is reduced. This reduction in direct gate-to-fin contact, along with the isolation of portions of the first fin 312(1) not in direct contact with the first gate 332(1) from the electric field of the first gate 332(1), reduces gate control over the first fin 312(1). By reducing gate control over the first fin 312(1), the effective width $W_{eff(1)}$ of the first FinFET 306(1) is also reduced. Since the effective width $W_{eff(1)}$ of the first FinFET 306(1) is a function of fin 312(1) exposure from trench isolation, and drive strength is a function of effective width $W_{eff}$, varying the exposure of the first fin 312(1) from trench isolation varies the drive strengths of the first FinFET 306(1). Thus, forming the first trench isolation layer 334(1) to a first trench isolation height $H_{TI(334)(1)}$ reduces the amount of fin surface area exposed to the first gate 332(1) and allows for the varying of the drive strength of the first FinFET 306(1).

An optional preliminary step to depositing the trench isolation material 333 can include depositing the trench isolation material 333 to a height $H_{TI+}$ greater than the first trench isolation height $H_{TI(334)(1)}$ in FIG. 5B-1 and then removing a portion of the trench isolation material 333 to form the first trench isolation layer 334(1) at the first trench isolation height $H_{TI(334)(1)}$. Alternatively, another optional preliminary step to depositing the trench isolation material 333 can include depositing the trench isolation material 333 to a height $H_{CH+}$ greater than the channel structure height $H_{CH}$ in FIG. 5B-1 and then removing a portion of the trench isolation material 333 to form the first trench isolation layer 334(1) at the first trench isolation height $H_{TI(334)(1)}$. Removing a portion of the trench isolation material 333 to form the first trench isolation layer 334(1) at the first trench isolation height $H_{TI(334)(1)}$ may also include removing a portion of the trench isolation material 333 to form the second trench isolation layer 334(2) at a height $H_{TI+}$ greater than the first trench isolation height $H_{TI(334)(1)}$. In this manner, the process can potentially be made more efficient. In at least one aspect, the trench isolation material 333 can be deposited using sputtering, chemical vapor deposition (CVD) and/or physical vapor deposition (PVD). In another aspect, the trench isolation material 333 can be removed using etching and/or recessing. Etching can include dry etching, wet etching and/or chemical recessing, and can use etchants such as hydrochloric acid (HCl), hydrofluoric acid (HF), and/or SiCoNi. Forming the substantially planar top surface 340(1) of the first trench isolation layer 334(1) to the first trench isolation height $H_{TI(334)(1)}$ can include using processes such as time-based etching or selective etching processes.

Figures 1, 5C:
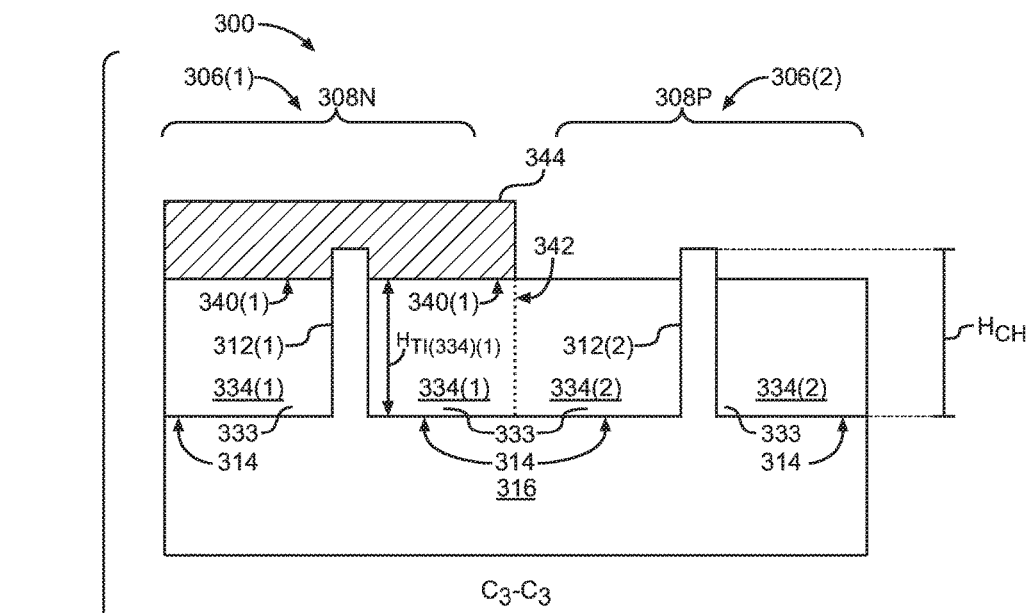
Figures 2, 5C:
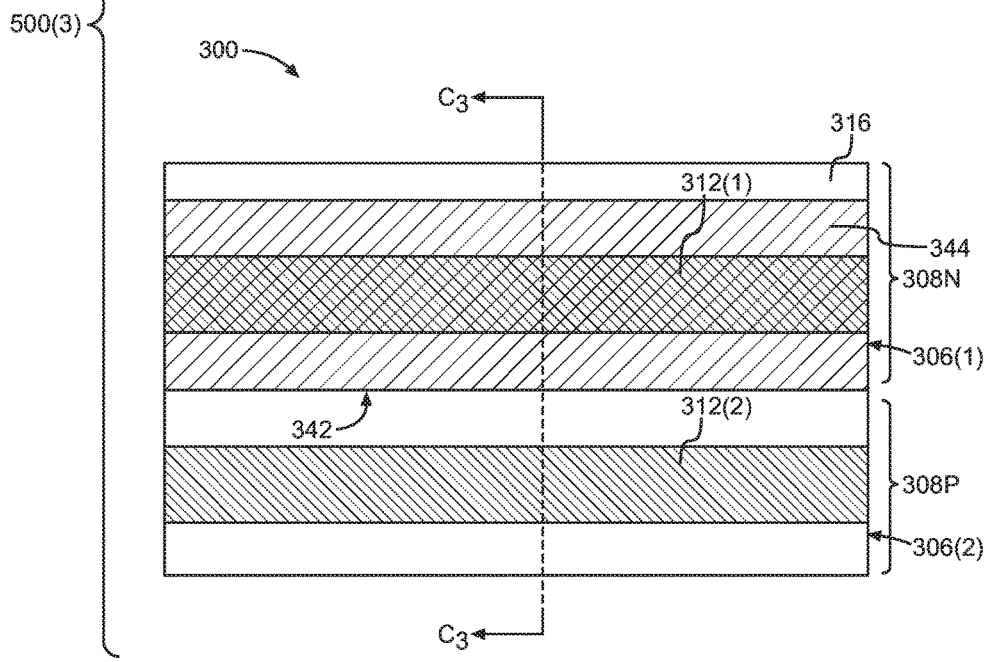

The fabrication process 400 in FIG. 4 also includes depositing a first selective recess blocking mask 344 above the first trench isolation layer 334(1) laterally adjacent to the first channel structure 310(2) of the standard cell 300 (block 408 in FIG. 4). In this regard, FIGS. 5C-1 and 5C-2 illustrate cross-sectional side and top views, respectively, of a third fabrication stage 500(3) of depositing a first selective recess blocking mask 344 above the first trench isolation layer 334(1) laterally adjacent to the first fin 312(1), according to the fabrication step in block 408 in FIG. 4. FIG. 5C-1 is a cross-sectional side view of the standard cell 300 across the C3-C3 line in FIG. 5C-2. As shown in FIGS. 5C-1 and 5C-2, the first selective recess blocking mask 344 is deposited above the first trench isolation layer 334(1) and extends to the boundary line 342 delineating the first trench isolation layer 334(1) and the portion of trench isolation material 333 adjacent to the second fin 312(2) that will be further processed to form the second trench isolation layer 334(2). In this manner, the first selective recess blocking mask 344 isolates and covers the first trench isolation layer 334(1) and leaves exposed a portion of the trench isolation material 333 adjacent to the second fin 312(2) that will be further processed to form the second trench isolation layer 334(2).

The first selective recess blocking mask 344 isolates and covers the first trench isolation layer 334(1) so that the portion of trench isolation material 333 adjacent to the second fin 312(2) not covered by the first selective recess blocking mask 344 may be formed into the second trench isolation layer 334(2) without damaging or removing a portion of the first trench isolation layer 334(1). The manner in which the first selective recess blocking mask 344 protects the first trench isolation layer 334(1) from damage and or removal is discussed further below. In one aspect, the first selective recess blocking mask 344 can be deposited using a lithography mask. Other aspects include depositing the first selective recess blocking mask 344 using physical vapor deposition (PVD) and/or resist coating. Aspects also include depositing the first selective recess blocking mask 344 in a non-conformal manner, such that the first selective recess blocking mask 344 is above, but not in direct contact with the first trench isolation layer 334(1). Depositing the first selective recess blocking mask 344 in such a non-conformal manner maintains isolation and protection of the first trench isolation layer 334(1) from processes involving the removal of other portions of trench isolation material 333 which may be conducted throughout the standard cell 300.

Figures 1, 5D:
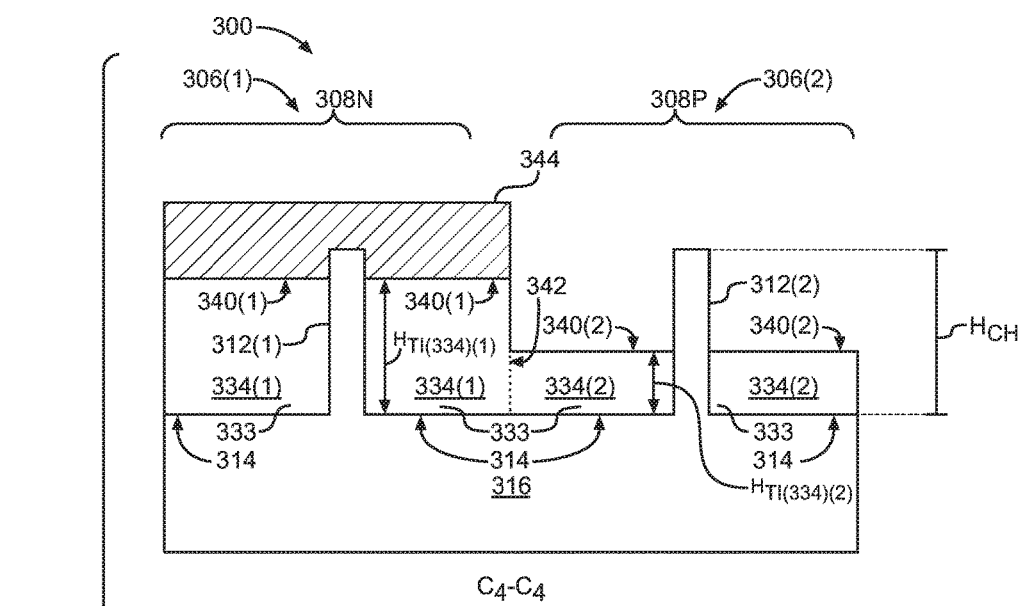
Figures 2, 5D:
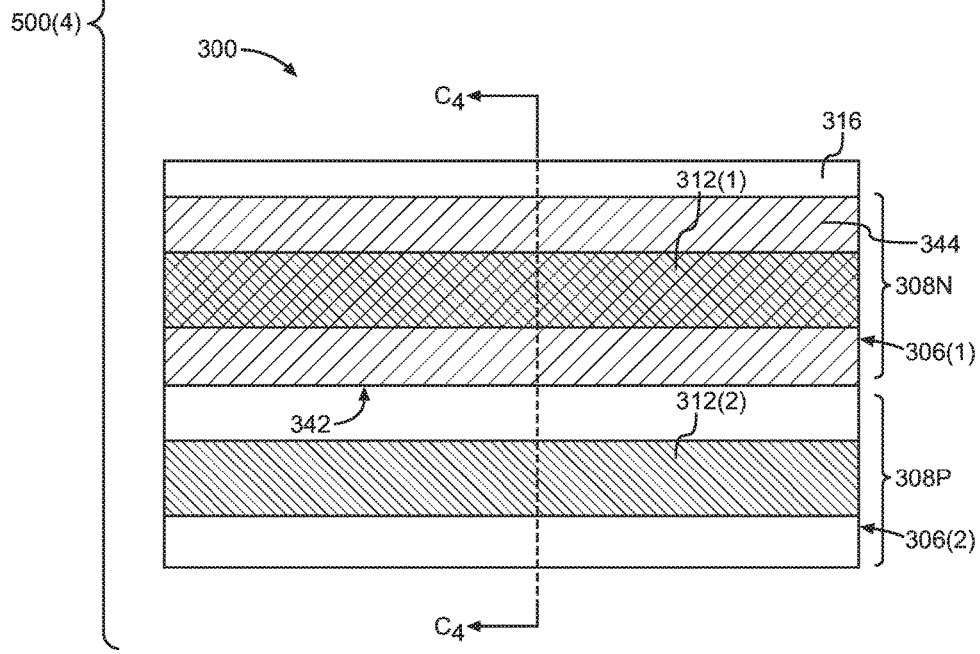

The fabrication process 400 in FIG. 4 also includes removing a portion of the trench isolation material 333 not below the first selective recess blocking mask 344 and adjacent to the second channel structure 310(2) to form the substantially planar top surface 340(2) of the second trench isolation layer 334(2), the substantially planar top surface 340(2) of the second trench isolation layer 334(2) formed laterally adjacent to the second channel structure 310(2) and at a third trench isolation height above the substantially planar top surface of the substrate 316 different from the second trench isolation height (block 410 in FIG. 4). In this regard, FIGS. 5D-1 and 5D-2 illustrate cross-sectional side and top views, respectively, of a fourth fabrication stage 500(4) of removing a portion of the trench isolation material 333 not below the first selective recess blocking mask 344 and adjacent to the second fin 312(2) to form the substantially planar top surface 340(2) of the second trench isolation layer 334(2) at a second trench isolation height $H_{TI(334)(2)}$, according to the fabrication step in block 410 in FIG. 4. FIG. 5D-1 is a cross-sectional side view of the standard cell 300 across the C4-C4 line in FIG. 5D-2. As shown in FIGS. 5D-1 and 5D-2, a portion of the trench isolation material 333 adjacent to the second fin 312(2) is removed. By removing a portion of trench isolation material 333, the substantially planar top surface 340(2) of the second trench isolation layer 334(2) is formed. The second trench isolation layer 334(2) extends to a second trench isolation height $H_{TI(334)(2)}$ above the substantially planar top surface 314 of the substrate 316. As shown in FIG. 5D-1, the second trench isolation height $H_{TI(334)(2)}$ is different from the first trench isolation height $H_{TI(334)(1)}$. In this manner, the second trench isolation layer 334(2) is formed in the standard cell 300 from the substantially planar top surface 314 of the substrate 316.

The difference between the first trench isolation height $H_{TI(334)(1)}$ and the second trench isolation height $H_{TI(334)(2)}$ allows for a greater amount of surface area of the second fin 312(2) to be exposed from trench isolation compared to the amount of surface area exposed by the first fin 312(1). Since a greater exposure of surface area allows for increased exposure to the gate 332(2), the drive strength of the second FinFET 306(2) can be higher than the drive strength of the first FinFET 306(1), making the first FinFET 306(1) the "weaker" FinFET relative to the "stronger" second FinFET 306(2). In this manner, a first and second FinFET 306(1), 306(2) having varying drive strengths can be formed. The first selective recess blocking mask 344 allows for the first trench isolation height $H_{TI(334)(1)}$ to vary from the second trench isolation height $H_{TI(334)(2)}$ because the first selective recess blocking mask 344 protects the first trench isolation layer 334(1) from removal, such as etching, while a portion of trench isolation material 333 is removed to form the second trench isolation layer 334(2). In at least one aspect, the trench isolation material 333 can be removed using etching and/or recessing. Etching can include dry etching, wet etching and/or chemical recessing, and can use etchants such as hydrochloric acid (HCl), hydrofluoric acid (HF), and/or SiCoNi. Forming the substantially planar top surface 340(1) of the first trench isolation layer 334(1) to the first trench isolation height $H_{TI(334)(1)}$ can include using processes such as time-based etching or selective etching processes.

Figures 1, 5E:
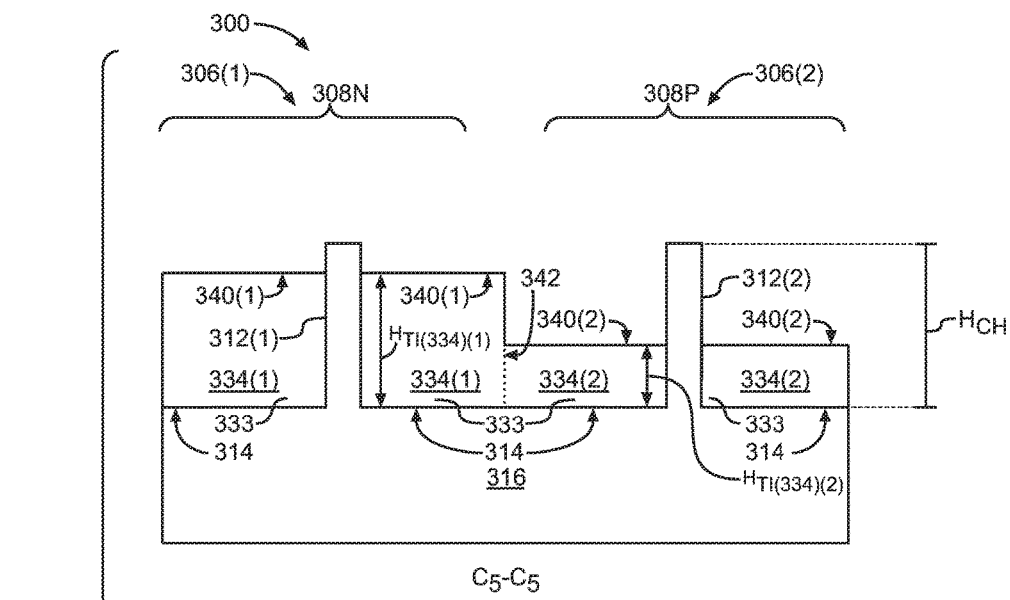
Figures 2, 5E:
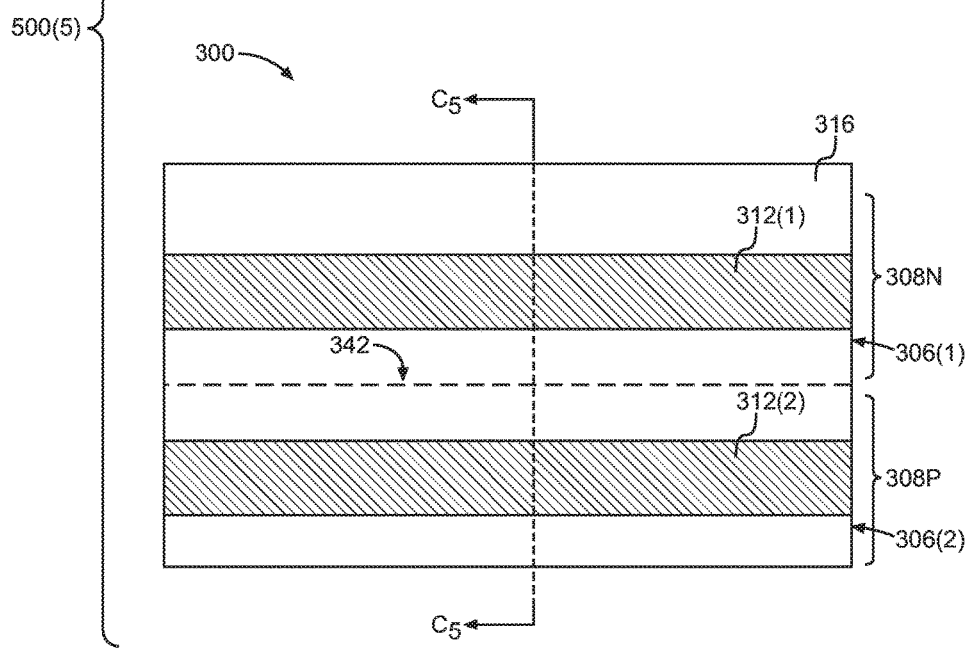

The fabrication process 400 in FIG. 4 also includes removing the first selective recess blocking mask 344 (block 412 in FIG. 4). In this regard, FIGS. 5E-1 and 5E-2 illustrate cross-sectional side and top views, respectively, of a fifth fabrication stage 500(5) of removing the first selective recess blocking mask 344, according to the fabrication step in block 412 in FIG. 4. FIG. 5E-1 is a cross-sectional side view of the standard cell 300 across the C5-C5 line in FIG. 5E-2. As shown in FIGS. 5E-1 and 5E-2, the first selective recess blocking mask 344 is removed and the first and second trench isolation layer 334(1), 334(2) are formed at the first trench isolation height $H_{TI(334)(1)}$ and the second trench isolation height $H_{TI(334)(2)}$, respectively. In this manner, the first and second fins 312(1), 312(2) are formed to have varying exposures from trench isolation.

In at least one aspect, the first selective recess blocking mask 344 can be removed using etching, stripping, and/or selective chemical processes. Etching can include dry etching, wet etching, reactive-ion etching (RIE), and ion beam etching (IBE), and can use etchants such as hydrochloric acid (HCl), alkaline solvents, and/or acetone. Further, the substantially planar top surface 340(2) of the second trench isolation layer 334(2) can be further processed using processes such as time-based etching and/or selective/self-aligned etching.

Figures 1, 5F:
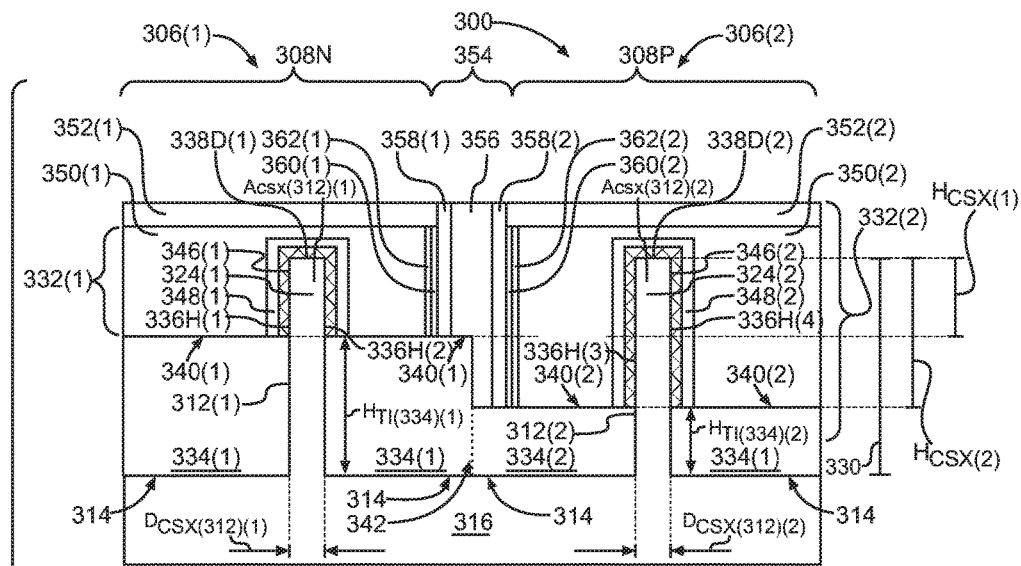
Figures 2, 5F:
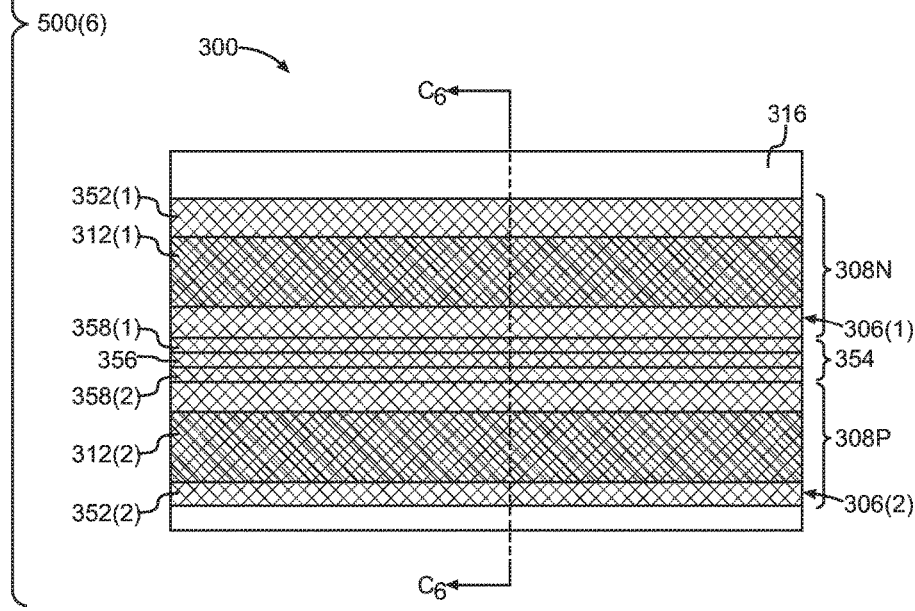

FIGS. 5F-1 and 5F-2 further illustrate cross-sectional side and top views, respectively, of a sixth fabrication stage 500(6) of fabricating the standard cell 300 of FIGS. 3A and 3B by forming gates 332(1) and 332(2) above the first and second fins 312(1), 312(2). Common components between the standard cell 300 in FIGS. 3A and 3B and the fabrication stage 500(6) in FIGS. 5F-1 and 5F-2 are shown with common element numbers, and thus will not be re-described. FIG. 5F-1 is a cross-sectional side view of the standard cell 300 across the C6-C6 line in FIG. 5F-2. As shown in FIGS. 5F-1 and 5F-2, each gate 332(1), 332(2) includes a gate dielectric material layer 346(1), 346(2), a work function layer 348(1), 348(2), a conductive layer 350(1), 350(2), and a gate cap 352(1), 352(2). FIGS. 5F-1 and 5F-2 also show the formation of an isolation region 354 between the NMOS region 308N and the PMOS region 308P so as to isolate each FinFET 306(1), 306(2) from external interference, such as stray capacitance between the first FinFET 306(1) and the second FinFET 306(2). In this regard, the isolation region 354 has a pre-metal dielectric oxide material layer 356 between two (2) spacers 358 (1) and 358(2), two (2) middle gate dielectric material layers 360(1) and 360(2), and two (2) middle work function layers 362(1) and 362(2), as shown in FIG. 5F-1.

In some aspects, the gate dielectric material layer 346(1), 346(2) may comprise oxide materials, high-k dielectric materials such as Hafnium oxide (HfO2), and/or other combinations of oxide materials. Aspects also include the work function layer 348(1), 348(2) comprising titanium nitride (TiN), titanium aluminide (TiAl), and/or tantalum nitride (TaN). The conductive layer 350(1), 350(2) can comprise tungsten (W), aluminum (Al), and/or other conductive metals. The gate cap 352(1), 352(2) can comprise silicon nitride (SiN), silicon oxycarbide (SiOC), and/or other selective dielectric to the intermetallic dielectric and gate spacer. In some aspects, forming aspects of the gate 332(1), 332(2) and the isolation region 354 may include using atomic layer deposition (ALD) and/or chemical vapor deposition (CVD). The pre-metal dielectric oxide material layer 356 may comprise oxide materials, low-k dielectric materials, and/or other thermally stable dielectric materials. The two (2) spacers 358(1) and 358(2) may comprise materials such as silicon nitride (SiN), silicon oxycarbide (SiOC), and/or other dielectric materials selective to the surrounding dielectrics. The two (2) middle gate dielectric material layers 360(1) and 360(2) may comprise oxide materials, Hafnium oxide (HfO2), and/or aluminum oxide ($Al_2O_3$). The two (2) middle work function layers 362(1) and 362(2) may comprise titanium nitride (TiN), titanium aluminide (TiAl), and/or tantalum nitride (TaN).

In this regard, the 3D transistors 304(1), 304(2) formed in the standard cell 300 in FIGS. 3A and 3B include channel structures 310(1), 310(2) having varying exposures from trench isolation to vary the drive strengths of the 3D transistors 304(1), 304(2) in the same standard cell 300. However, the concept of varying channel structure exposures from trench isolation to vary the drive strengths of 3D transistors is not limited to a single standard cell. Rather, 3D transistors formed in different standard cells can have varying channel structure exposures from trench isolation as well. In this manner, drive strengths of 3D transistors formed in different standard cells can be varied.

Figure 6A:
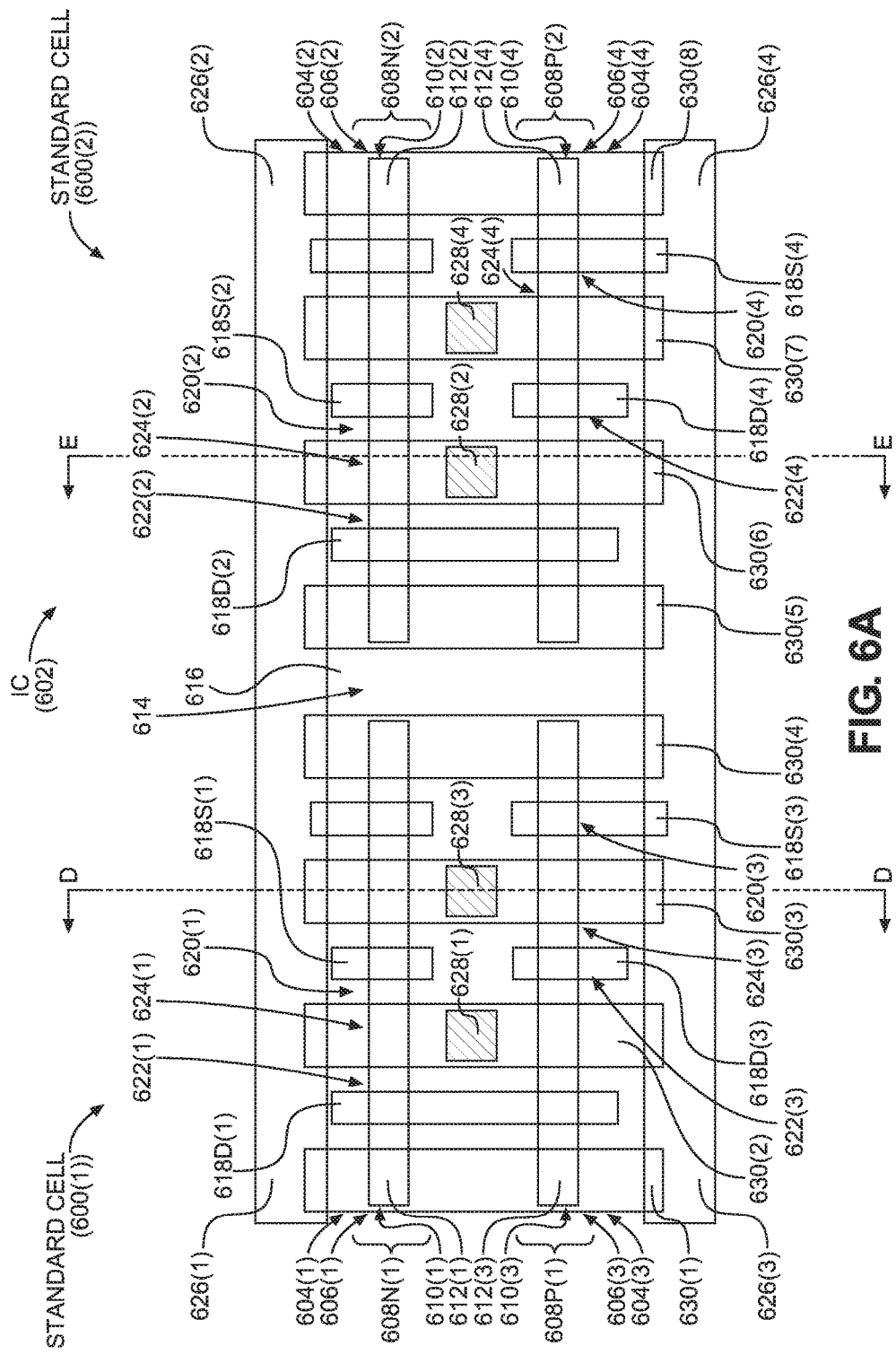
FIG. 6A is a top-view diagram of two adjacent exemplary standard cells, wherein each standard cell includes two (2) 3D transistors and each 3D transistor is in the form of a FinFET having one (1) fin as a channel structure, having varied channel structure exposures from trench isolation such that each FinFET has a different drive strength relative to the other FinFETs.

FIG. 6A illustrates a top-view diagram of two (2) exemplary standard cells 600(1), 600(2) formed in an IC 602, wherein each standard cell 600(1), 600(2) has two (2) 3D transistors 604(1), 604(3) and 604(2), 604(4) therein. As discussed in more detail below, the 3D transistors 604(1)-604(4) formed in the different standard cells 600(1), 600(2) include channel structures 610(1)-610(4) having varying exposures from trench isolation to vary the drive strengths of the 3D transistors 604(1)-604(4). In this regard, the first standard cell 600(1) includes a first 3D transistor 604(1) in the form of a first FinFET 606(1) in an NMOS region 608N(1) of the first standard cell 600(1) and a third 3D transistor 604(3) in the form of a third FinFET 606(3) in a PMOS region 608P(1) of the first standard cell 600(1). The second standard cell 600(2) of FIG. 6A includes a second 3D transistor 604(2) in the form of a second FinFET 606(2) in an NMOS region 608N(2) of the second standard cell 600(2) and a fourth 3D transistor 604(4) in the form of a fourth FinFET 606(4) in a PMOS region 608P(2) of the second standard cell 600(2). The first FinFET 606(1) has a first channel structure 610(1) in the form of a first fin 612(1) formed from a substantially planar top surface 614 of a substrate 616. The first FinFET 606(1) includes a first source 618S(1) formed in a first end portion 620(1) of the first fin 612(1) and a first drain 618D(1) formed in a second end portion 622(1) of the first fin 612(1). The first FinFET 606(1) also includes a first channel 624(1) formed in the first fin 612(1) between the first drain 618D(1) and the first source 618S(1). Similarly, the second, third, and fourth FinFETs 606(2)-606(4) have a second, third, and fourth channel structure 610(2)-610(4), respectively, each in the form of a second, third, and fourth fin 612(2)-612(4). Each fin 612(2)-612(4) is formed from the substantially planar top surface 614 of the substrate 616. The second, third, and fourth FinFET 606(2)-606(4) each include a second, third, and fourth source 618S(2)-618S(4) and a second, third, and fourth drain 618D(2)-618D(4). The source 618S(2)-618S(4) of each FinFET 606(2)-606(4) is formed in a first end portion 620(2)-620(4) of a respective fin 612(2)-612(4). Similarly, the drain 618D(2)-618D(4) of each FinFET 606(2)-606(4) is formed in a second end portion 622(2)-622(4) of a respective fin 612(2)-612(4). Each FinFET 606(2)-606(4) also includes a second, third, and fourth channel 624(2)-624(4), respectively, formed in a respective fin 612(2)-612(4) between a respective drain 618D(2)-618D(4) and a respective source 618S(2)-618S(4). The first FinFET 606(1) and the third FinFET 606(3) are formed in the first standard cell 600(1) between and substantially parallel to two (2) power rails 626(1), 626(3) also provided in the first standard cell 600(1). The second FinFET 606(2) and the fourth FinFET 606(4) are formed in the second standard cell 600(2) between and substantially parallel to two (2) power rails 626(2), 626(4) also provided in the second standard cell 600(2). A gate contact 628(1)-628(4) is formed over a gate line 630(1)-630(8) of each FinFET 606(1)-606(4) to form a gate 632(1)-632(4) that controls the current through each channel 624(1)-624(4).

Figure 6B:
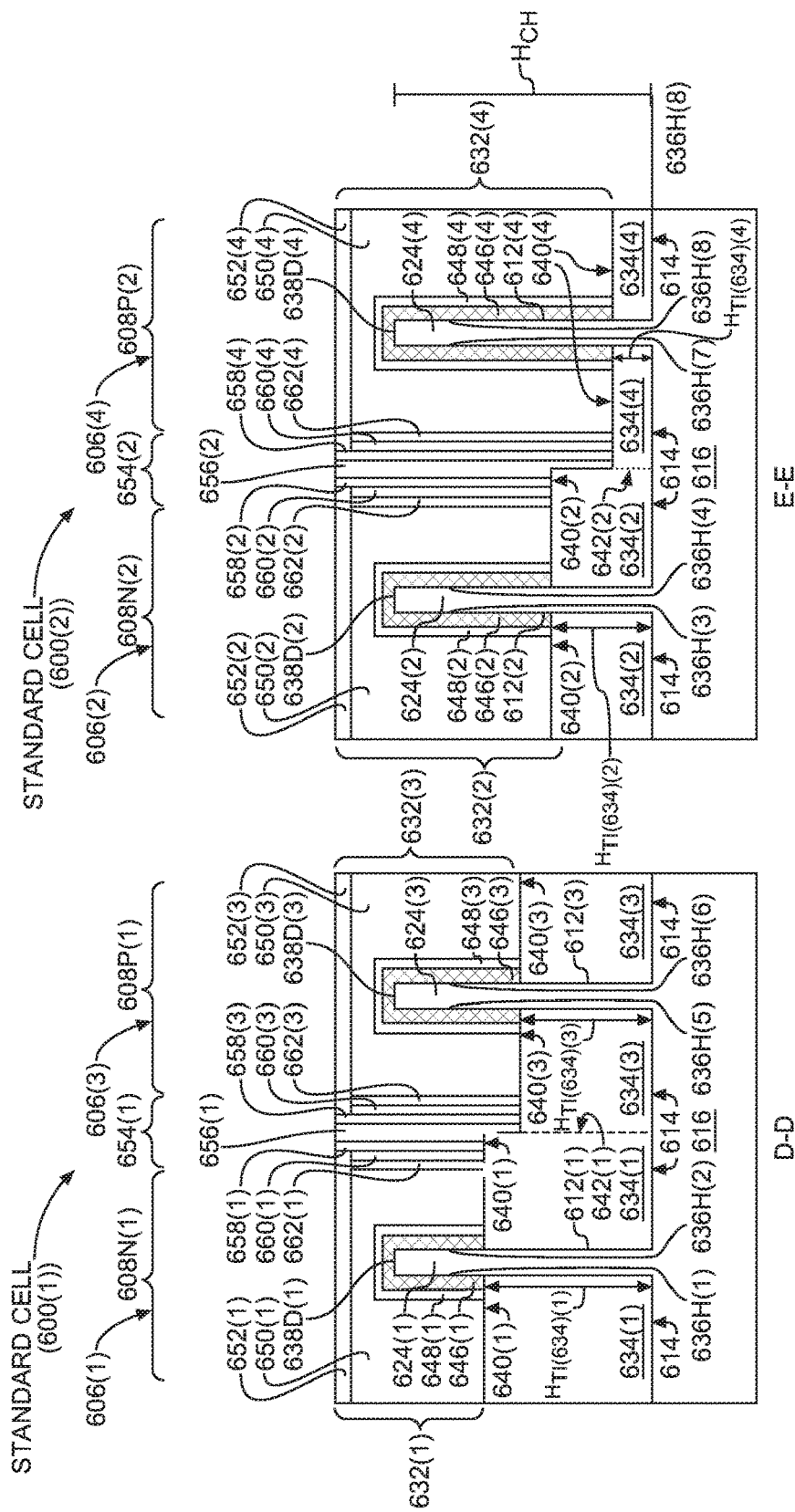
FIG. 6B is a cross-sectional diagram of the exemplary standard cells of FIG. 6A.

FIG. 6B is a cross-sectional view along the D-D line and E-E line of the exemplary standard cells 600(1) and 600(2) of FIG. 6A to further illustrate the varied exposures of each fin 612(1)-612(4) from trench isolation to vary the drive strength of each FinFET 606(1)-606(4), respectively. With reference to FIG. 6B, a first, second, third, and fourth trench isolation layer 634(1)-634(4) is disposed adjacent to the first, second, third, and fourth channel structures 610(1)-610(4), respectively, to provide current isolation between channels 624(1)-624(4) provided by the respective channel structures 610(1)-610(4) of the 3D transistors 604(1)-604(4). Each trench isolation layer 634(1)-634(4) also limits the effect of each respective gate 632(1)-632(4) on other transistors that share the same substrate 616 by isolating the substrate 616 from the electric field of each gate 632(1)-632(4). For example, the first trench isolation layer 634(1) limits the effect of the first gate 632(1) on the third FinFET 606(3). Similarly, the third trench isolation layer 634(3) limits the effect of the third gate 632(3) on the first FinFET 606(1).

Similar to the standard cell 300 in FIGS. 3A and 3B above, each trench isolation layer 634(1)-634(4) in the standard cells 600(1), 600(2) in FIGS. 6A and 6B additionally limits the amount of gate control over a respective fin 612(1)-612(4) by isolating a lower portion of each fin 612(1)-612(4) from the electric field of a respective gate 632(1)-632(4). This results in the amount of gate control over each fin 612(1)-612(4) being reduced by a function of a respective trench isolation height $H_{TI(634)(1)}$-$H_{TI(634)(4)}$ of each trench isolation layer 634(1)-634(4). This reduction in gate control reduces the channel 624(1)-624(4) of each fin 612(1)-612(4) to a cross-sectional area $A_{CSX(612)(1)}$-$A_{CSX(612)(4)}$ of each fin 612(1)-612(4). Since the cross-sectional area $A_{CSX(612)(1)}$-$A_{CSX(612)(4)}$ of each fin 612(1)-612(4) determines the resistance, and thus affects the drive strength of the respective channel 624(1)-624(4) of each fin 612(1)-612(4), a decrease in resistance of the fins 612(1)-612(4) increases drive strength of the respective FinFETs 606(1)-606(4). The cross-sectional area $A_{CSX(612)(1)}$-

$A_{CSX(612)(4)}$ of each fin 612(1)-612(4) is a function of the height $H_{CSX(612)(1)}$-$H_{CSX(612)(8)}$ of each vertical side surface 636H(1)-636H(8) exposed from the respective trench isolation layers 634(1)-634(4) times the length $D_{CSX(612)(1)}$-$D_{CSX(612)(4)}$ of each horizontal top surface 638D(1)-638D(2) exposed to the gate 632(1)-632(4). Thus, since a larger effective width $W_{eff}$ reduces channel 624(1)-624(4) resistance, FinFET 606(1)-606(4) drive strength can be increased by increasing effective width $W_{eff}$. Thus, by controlling the exposure of each fin 612(1)-612(4) from the respective trench isolation layers 634(1)-634(4), the amount of fin surface area exposed to each gate 632(1)-632(4) is also controlled, resulting in each FinFET 606(1)-606(4) of the first and second standard cells 600(1), 600(2) having a drive strength different from one another. In this regard, the materials, processes, and other characteristics related to the standard cell 300 in FIGS. 3A and 3B may also be applied to the standard cells 600(1), 600(2) in FIGS. 6A and 6B.

Figure 7A:
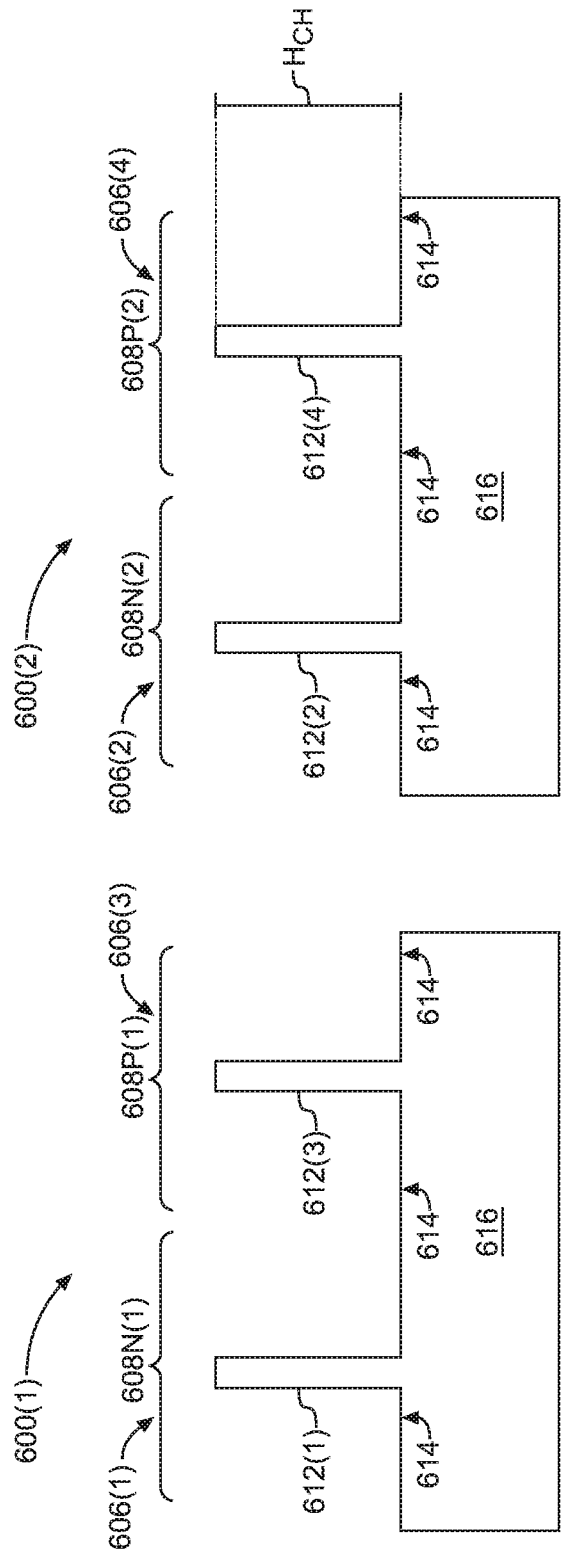
FIGS. 7A-7J are cross-sectional diagrams illustrating the two (2) standard cells having FinFETs with varied channel structure exposures in FIGS. 6A and 6B at various fabrication stages.

In this regard, FIGS. 7A-7J illustrate stages of an exemplary fabrication process employed to fabricate the four (4) FinFETs 606(1)-606(4) in the standard cells 600(1), 600(2) in FIGS. 6A and 6B. In this regard, a first fabrication stage 700(1) includes forming the first, second, third, and fourth fins 612(1)-612(4) in the standard cells 600 in FIGS. 6A and 6B from the substantially planar top surface 614 of the substrate 616. FIG. 7A illustrates a cross-sectional side view of the first fabrication stage 700(1) of forming the first and third fin 612(1), 612(3) in the first standard cell 600(1) and the second and fourth fin 612(2), 612(4) in the second standard cell 600(2). As shown in FIG. 7A, the first fin 612(1) of the first FinFET 606(1) is formed in the NMOS region 608N(1) of the first standard cell 600(1). The third fin 612(3) of the third FinFET 606(3) is formed in the PMOS region 608P(1) of the first standard cell 600(1). The second fin 612(2) of the second FinFET 606(2) is formed in the NMOS region 608N(2) of the second standard cell 600(2). The fourth fin 612(4) of the fourth FinFET 606(4) is formed in the PMOS region 608P(2) of the second standard cell 600(2). Each fin 612(1)-612(4) extends to the same channel structure height $H_{CH}$ above the substantially planar top surface 614 of the substrate 616. In this manner, each fin 612(1)-612(4) is formed from the substantially planar top surface 614 of the substrate 616. In this regard, the materials, processes, and other characteristics related to the standard cell 300 in FIGS. 3A and 3B may also be applied to the standard cells 600(1), 600(2) in FIGS. 6A and 6B.

Figure 7B:
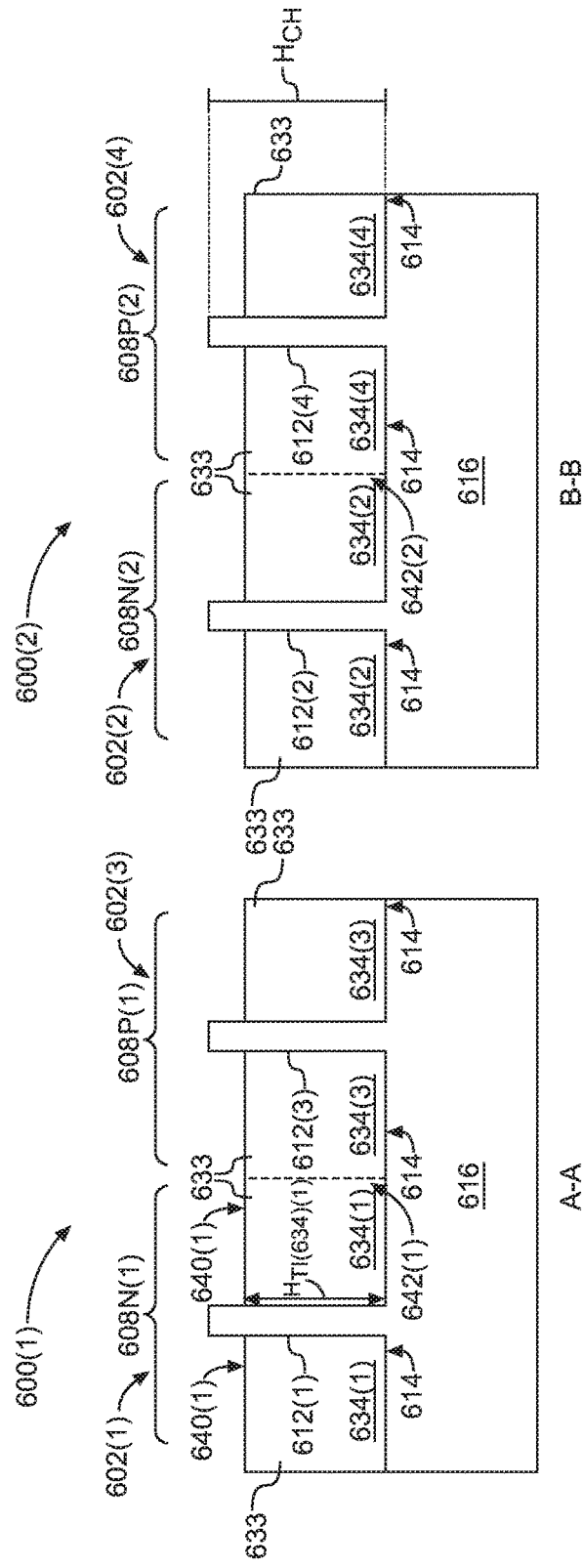

FIG. 7B illustrates a second fabrication stage 700(2) including depositing a trench isolation material 633 adjacent to each fin 612(1)-612(4) to a first trench isolation height $H_{TI(634)(1)}$ above the substantially planar top surface of the substrate 616. As will be discussed in more detail below, the deposited trench isolation material 633 will be further processed, including etched, to form the final trench isolation layers 634(1)-634(4) as illustrated in FIGS. 6A and 6B. In this regard, FIG. 7B illustrates a cross-sectional side view at a second fabrication stage 700(2) of depositing the trench isolation material 633 adjacent to each fin 612(1)-612(4) in the standard cells 600(1), 600(2) to a first trench isolation height $H_{TI(634)(1)}$. As shown in FIG. 7B, the trench isolation material 633 is deposited adjacent to each fin 612(1)-612(4) and extends to a first trench isolation height $H_{TI(634)(1)}$ above the substantially planar top surface 614 of the substrate 616. The trench isolation material 633 adjacent to the first fin 612(1) of the first FinFET 606(1) forms the first trench isolation layer 634(1). The first trench isolation layer 634(1) has a substantially planar top surface 640(1) formed at the first trench isolation height $H_{TI(634)(1)}$ laterally adjacent to the first fin 612(1). As shown in FIG. 7B, the boundary lines 642(1), 642(2) in the trench isolation material 633 of each standard cell 600(1), 600(2) delineate the portions of the trench isolation material 633 that will form each trench isolation layer 634(1)-634(4) in each standard cell 600(1), 600(2). For example, the first boundary line 642(1) indicates the line at which the first trench isolation layer 634(1) is separated from the portion of trench isolation material 633 adjacent to the third fin 612(3) that will be further processed to form the third trench isolation layer 634(3). In this regard, the materials, processes, and other characteristics related to the standard cell 300 in FIGS. 3A and 3B, and particularly related to block 404 in FIG. 4, may also be applied to the standard cells 600(1), 600(2) in FIGS. 6A and 6B.

Figure 7C:
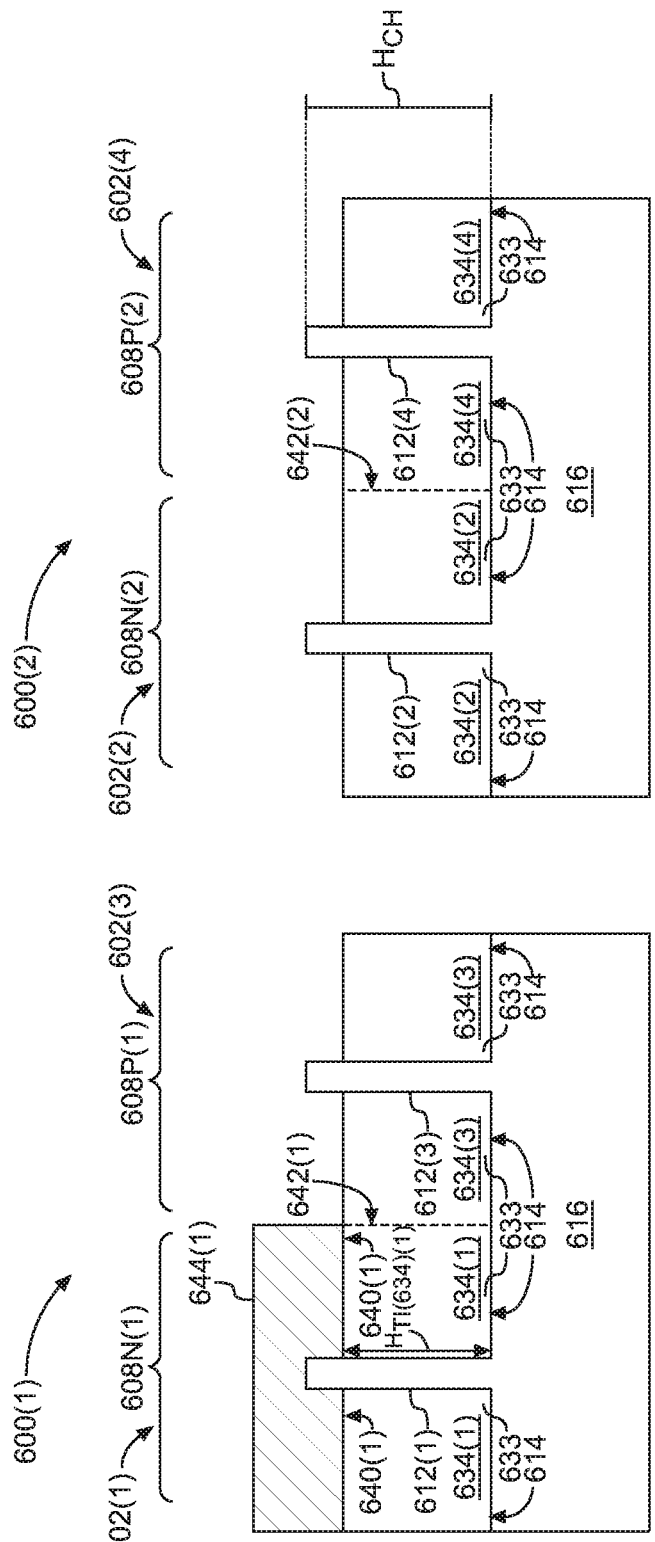

FIG. 7C illustrates a cross-sectional side view of the standard cells 600(1), 600(2) at a third fabrication stage 700(3) of depositing a first selective recess blocking mask 644(1) above the first trench isolation layer 634(1) laterally adjacent to the first fin 612(1) of the first standard cell 600(1). As shown in FIG. 7C, the first selective recess blocking mask 644(1) is deposited above the first trench isolation layer 634(1) and extends to the first boundary line 642(1) delineating the first trench isolation layer 634(1) and the portion of trench isolation material 633 adjacent to the third fin 612(3) that will be further processed to form the third trench isolation layer 634(3). In this manner, the first selective recess blocking mask 644(1) isolates and covers the first trench isolation layer 634(1) and leaves exposed a portion of the trench isolation material 633 adjacent to the third fin 612(3) that will be further processed to form the third trench isolation layer 634(3). Similarly, the portions of trench isolation material 633 adjacent to the second and fourth fins 612(2), 612(4) are also left exposed so that they may be further processed to form the second and fourth trench isolation layers 634(2), 634(4), respectively.

In some aspects, the first selective recess blocking mask 644(1) may be deposited using a lithography mask. In other aspects, a lithography mask may be used as the first selective recess blocking mask 644(1). Using a lithography mask as the first selective recess blocking mask 644(1) allows the first selective recess blocking mask 644(1) to have two functions. First, the first selective recess blocking mask 644(1) in the form of a lithography mask can isolate and protect the first trench isolation layer. Second, the first selective recess blocking mask 644(1) in the form of a lithography mask can be used to selectively deposit additional selective recess blocking masks through processes such as physical vapor deposition (PVD), chemical vapor deposition (CVD), and/or resist coating. One benefit to using a lithography mask as the first selective recess blocking mask 644(1) is the reduced risk relative to masks of other materials of damaging the semiconductor surfaces the mask is above. For example, removing masks of a different material, such as thermal oxide, nitride, and/or other hard masks, may result in damage to semiconductor surfaces through processes such as oxidation, contamination, and/or other associated ex-situ processes. While alternatively, removing a lithography mask does not cause such damage. In other embodiments, the first selective recess blocking mask 644(1) may be deposited using lithography track, physical vapor deposition (PVD), and/or any other thin-film process. Further, the materials, processes, and other characteristics related to the standard cell 300 in FIGS. 3A and 3B, and particularly related to block 408 in FIG. 4, may also be applied to the standard cells 600(1), 600(2) in FIGS. 6A and 6B.

Figure 7D:
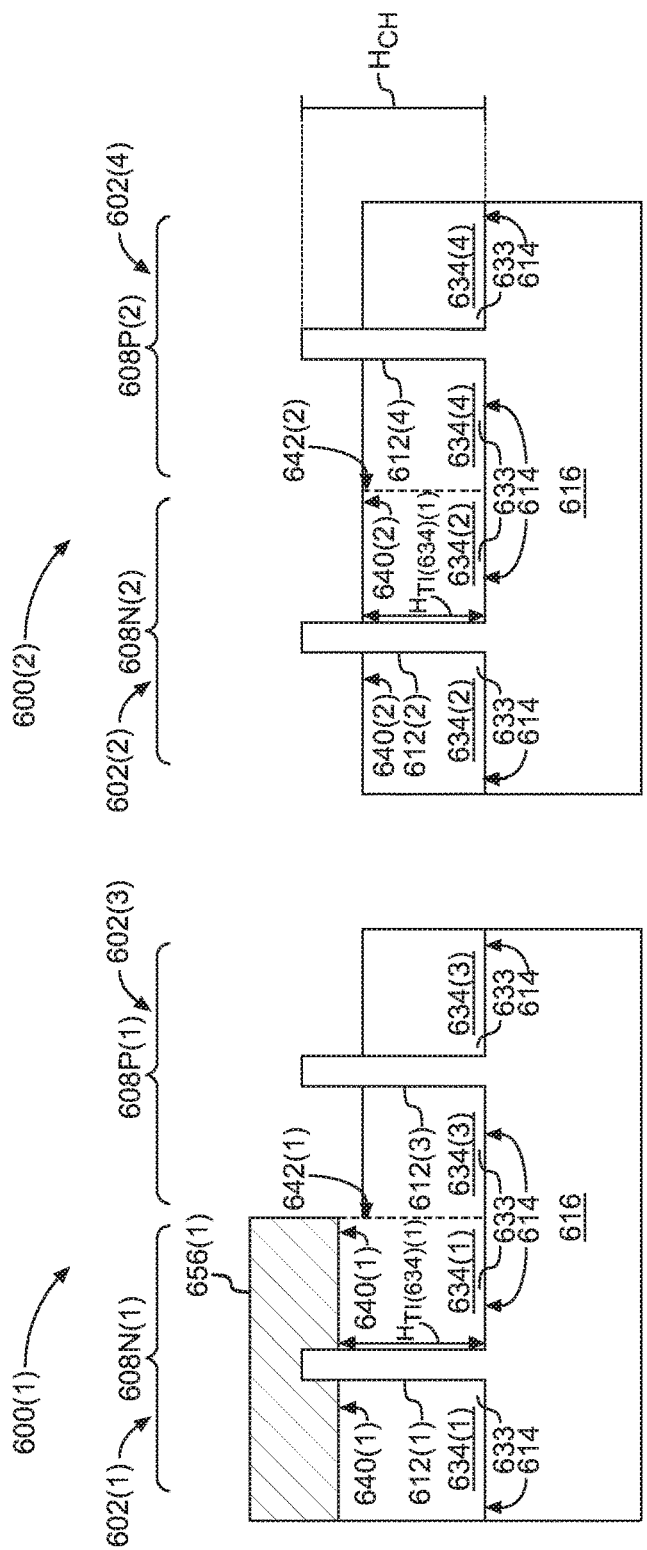

FIG. 7D illustrates a cross-sectional side view of the standard cells 600(1), 600(2) at a fourth fabrication stage 700(4) of removing a portion of trench isolation material 633 not below the first selective recess blocking mask 644(1) and adjacent to the second, third, and fourth fins 612(2)-612(4). In this manner, the first selective recess blocking mask 644(1) is used to isolate and protect the first trench isolation layer 634(1) so that a portion of the trench isolation material 633 not below the first selective recess blocking mask 644(1) and adjacent to the second fin 612(2) can be removed. In this regard, the substantially planar top surface 640(2) of the second trench isolation layer 634(2) is formed at a second trench isolation height $H_{TI(634)(2)}$ above the substantially planar top surface 614 of the substrate 616. Similarly, the trench isolation material 633 laterally adjacent to the third and fourth fins 612(3), 612(4) is formed to the second trench isolation height $H_{TI(634)(2)}$. The second trench isolation height $H_{TI(634)(2)}$ is different from the first trench isolation height $H_{TI(634)(1)}$, and allows for a greater amount of surface area of the second, third, and fourth fin 612(2)-612(4) to be exposed from trench isolation relative to the amount of surface area exposed by the first fin 612(1). As with the FinFETs 306(1), 306(2) discussed with regard to FIGS. 3A and 3B, by increasing the exposure of the second fin 612(2) from trench isolation relative to the first fin 612(1), the first FinFET 606(1) is formed to have a "weaker" drive strength relative to the "stronger" second FinFET 606(2).

Figure 7E:
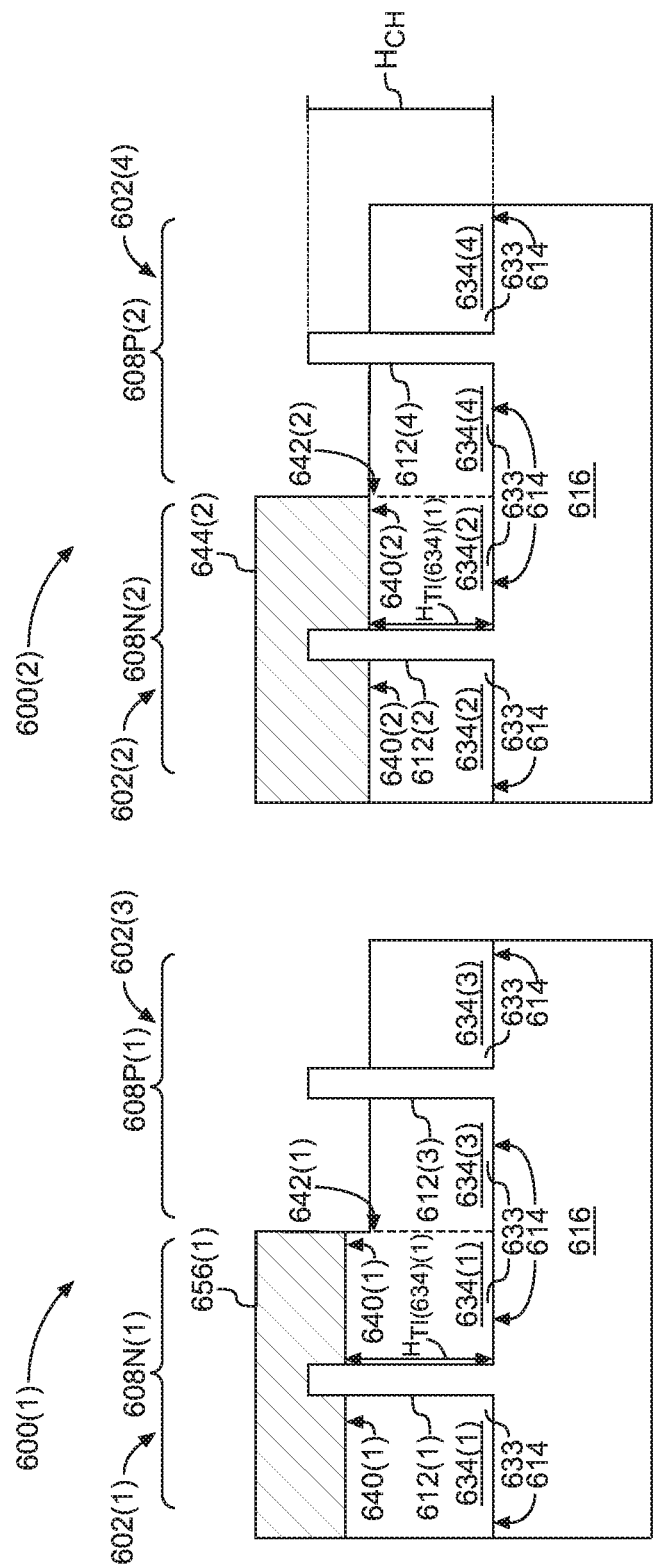

FIG. 7E illustrates a cross-sectional side view of the standard cells 600(1), 600(2) at a fifth fabrication stage 700(5) of depositing a second selective recess blocking mask 644(2) above the second trench isolation layer 634(2) laterally adjacent to the second fin 612(2) of the second standard cell 600(2). As shown in FIG. 7E, the second selective recess blocking mask 644(2) is deposited above the second trench isolation layer 634(2) and extends to the second boundary line 642(2) delineating the second trench isolation layer 634(2) and the portion of trench isolation material 633 adjacent to the fourth fin 612(4) that will be further processed to form the fourth trench isolation layer 634(4). In this manner, the second selective recess blocking mask 644(2) isolates and covers the second trench isolation layer 634(2) and leaves exposed a portion of the trench isolation material 633 adjacent to the fourth fin 612(4) that will be further processed to form the fourth trench isolation layer 634(4). Similarly, the portion of trench isolation material 633 adjacent to the third fin 612(3) is also left exposed so that it may be further processed to form the third trench isolation layers 634(3).

In some aspects, the second selective recess blocking mask 644(1) may be deposited using a lithography mask. In other aspects, a lithography mask may be used as the second selective recess blocking mask 644(2). Using a lithography mask as the second selective recess blocking mask 644(2) allows the second selective recess blocking mask 644(2) to have functions and characteristics similar to those discussed above, regarding using a lithography mask as the first selective recess blocking mask 644(1). Further, the materials, processes, and other characteristics related to the standard cell 300 in FIGS. 3A and 3B, and particularly related to block 408 in FIG. 4, may also be applied to the standard cells 600(1), 600(2) in FIGS. 6A and 6B.

Figure 7F:
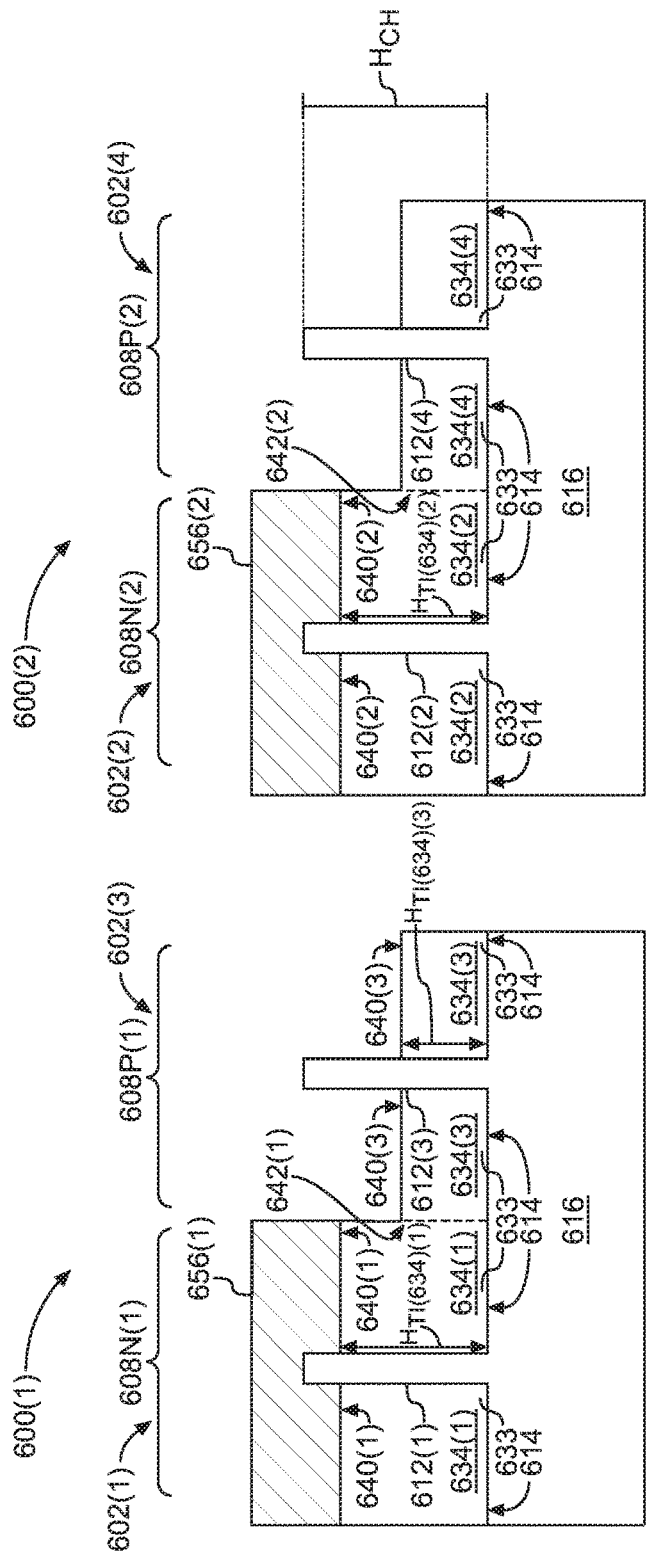

FIG. 7F illustrates a cross-sectional side view of the standard cells 600(1), 600(2) at a sixth fabrication stage 700(6) of removing a portion of trench isolation material 633 not below either of the first and second selective recess blocking masks 644(1), 644(2) and adjacent to the third and fourth fins 612(3), 612(4). In this manner, the first and second selective recess blocking masks 644(1), 644(2) are used to isolate and protect the first and second trench isolation layers 634(1), 634(2), respectively, so that a portion of the trench isolation material 633 not below the first and second selective recess blocking masks 644(1), 644(2) can be removed. In this regard, the substantially planar top surface 640(3) of the third trench isolation layer 634(3) is formed at a third trench isolation height $H_{TI(634)(3)}$ above the substantially planar top surface 614 of the substrate 616. Similarly, the trench isolation material 633 laterally adjacent to the fourth fin 612(4) is formed to the third trench isolation height $H_{TI(634)(3)}$. The third trench isolation height $H_{TI(634)(3)}$ is different from the first trench isolation height $H_{TI(634)(1)}$ and the second trench isolation height $H_{TI(634)(2)}$, and allows for a greater amount of surface area of the third and fourth fin 612(2)-612(4) to be exposed from trench isolation relative to the amount of surface area exposed by the second fin 612(2). By increasing the exposure of the third fin 612(3) from trench isolation relative to the second fin 612(2), the third FinFET 606(1) is formed to have a "stronger" drive strength relative to the "weaker" drive strength of the second FinFET 606(2).

Figure 7G:
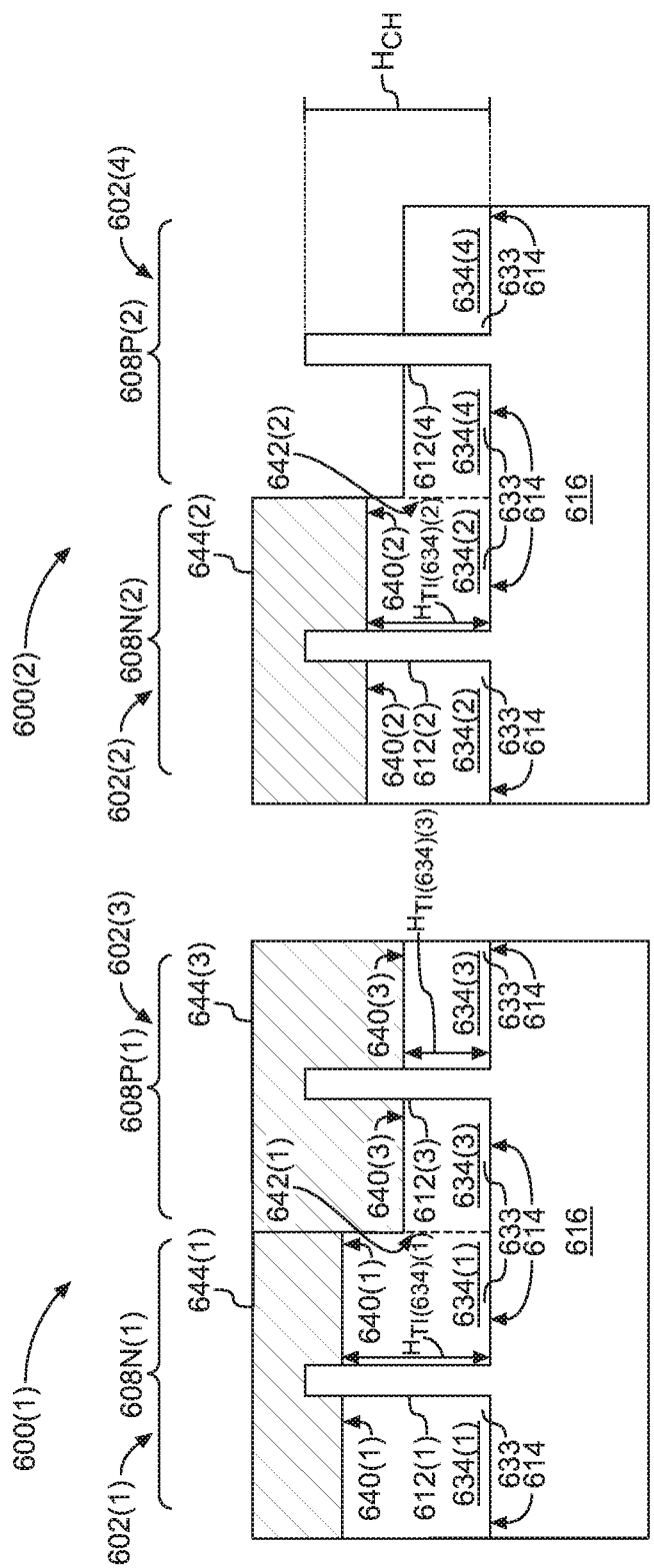
Figure 7H:
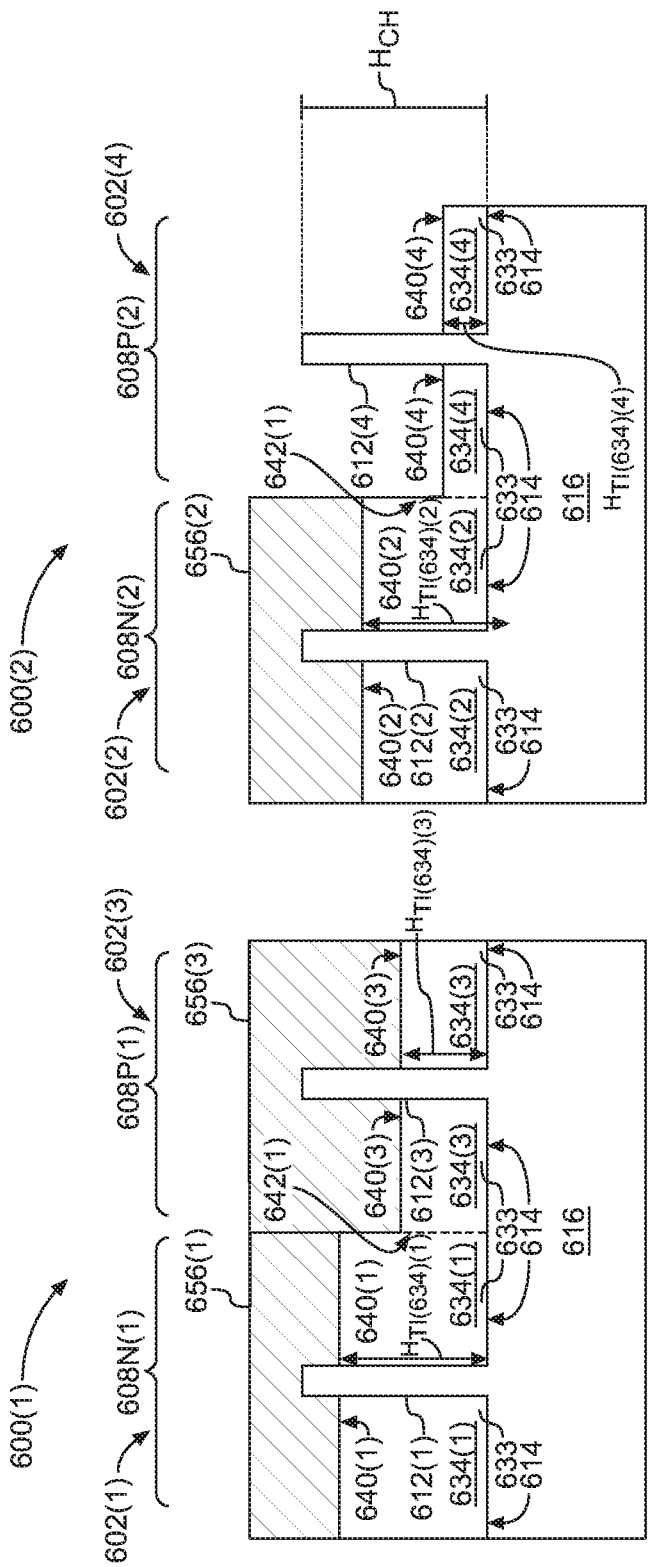

FIGS. 7G and 7H are similar to FIGS. 7E and 7F because they both involve depositing an additional selective recess blocking mask and then removing a portion of trench isolation material 633 not covered by a selective recess blocking mask. FIG. 7G illustrates a cross-sectional side view of the standard cells 600(1), 600(2) at a seventh fabrication stage 700(7) of depositing a third selective recess blocking mask 644(3) above the third trench isolation layer 634(2) laterally adjacent to the third fin 612(3) of the first standard cell 600(1). As shown in FIG. 7G, the third selective recess blocking mask 644(3) is deposited above the third trench isolation layer 634(3) and extends to the first boundary line 642(1) delineating the first trench isolation layer 634(1) and the third trench isolation layer 634(3). In this manner, the third selective recess blocking mask 644(3) isolates and covers the third trench isolation layer 634(3) and leaves exposed a portion of the trench isolation material 633 adjacent to the fourth fin 612(4) that will be further processed to form the fourth trench isolation layer 634(4).

In some aspects, the third selective recess blocking mask 644(3) may be deposited using a lithography mask. In other aspects, a lithography mask may be used as the third selective recess blocking mask 644(3). Using a lithography mask as the third selective recess blocking mask 644(3) allows the third selective recess blocking mask 644(3) to have functions and characteristics similar to those discussed above, regarding the first and second selective recess blocking masks 644(1), 644(2). Further, the materials, processes, and other characteristics related to the standard cell 300 in FIGS. 3A and 3B, and particularly related to block 408 in FIG. 4, may also be applied to the standard cells 600(1), 600(2) in FIGS. 6A and 6B.

FIG. 7H illustrates a cross-sectional side view of the standard cells 600(1), 600(2) at an eighth fabrication stage 700(7) of removing a portion of trench isolation material 633 not below either of the first, second, and third selective recess blocking masks 644(1)-644(3) and adjacent to the second, third, and fourth fins 612(2)-612(4). In this manner, the first, second, and third selective recess blocking masks 644(1)-644(3) are used to isolate and protect the first, second, and third trench isolation layers 634(1)-634(3), respectively, so that a portion of the trench isolation material 633 not below the first, second, and third selective recess blocking masks 644(1)-644(3) can be removed. In this regard, the substantially planar top surface 640(4) of the fourth trench isolation layer 634(4) is formed at a fourth trench isolation height $H_{TI(634)(4)}$ above the substantially planar top surface 614 of the substrate 616. The fourth trench isolation height $H_{TI(634)(4)}$ is different from the first, second, and third trench isolation heights $H_{TI(634)(1)}$-$H_{TI(634)(3)}$, and allows for a greater amount of surface area of the fourth fin 612(4) to be exposed from trench isolation relative to the amount of surface area exposed by each of the first, second, and third fins 612(1)-612(3). By increasing the exposure of the fourth fin 612(4) from trench isolation relative to the first, second, and third fins 612(1)-612(3), the fourth FinFET 606(1) can be formed to have a "stronger" drive strength relative to the drive strengths of the first, second, and third FinFETs 606(1)-606(3).

In further elaboration to the discussion above with regard to drive strength, the first FinFET 606(1) is "weaker" than the second FinFET 606(2), the second FinFET 606(2) is "weaker" than the third FinFET 606(3), and the third FinFET 606(3) is "weaker" than the fourth FinFET 606(4). Thus, the fourth FinFET 606(4) has the highest drive strength of the four FinFETs 606(1)-606(4), the third FinFET 606(3) has the second-highest drive strength of the four FinFETs 606(1)-606(4), the second FinFET 606(2) has the second-lowest drive strength of the four FinFETs 606(1)-606(4), and the first FinFET 606(1) has the lowest drive strength of the four FinFETs 606(1)-606(4). While not explicitly illustrated in FIGS. 7A-7J, the process of depositing additional selective recess blocking masks 644(M-1) and removing a portion of the trench isolation material 633 not protected by a selective recess blocking mask 644(M-1) can repeated for a plurality of M FinFETs 612(1)-612(M) so as to provide a number M of drive strengths, wherein each drive strength of a FinFET 612 in the plurality of FinFETs 612(1)-612(M) is different from another drive strength of a FinFET 612 in the plurality of FinFETs 612(1)-612(M).

Figure 7I:
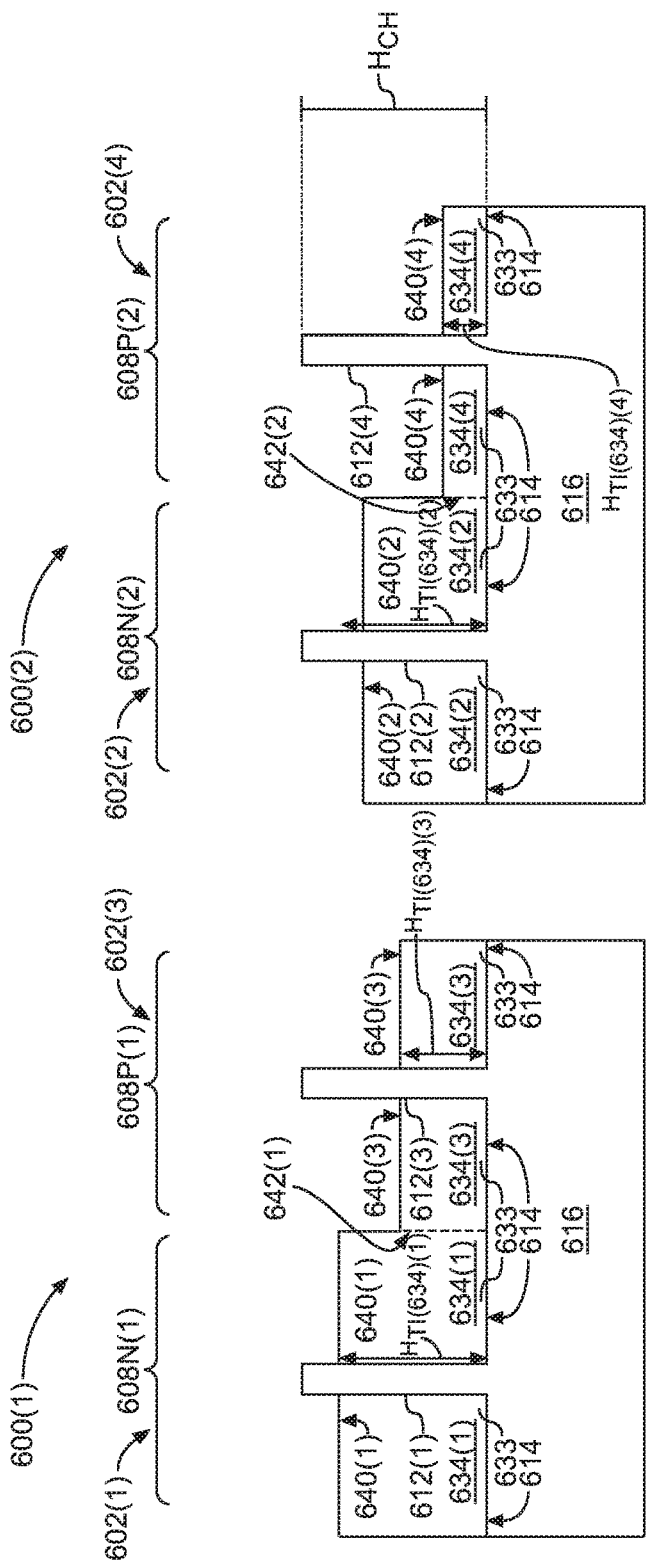

FIG. 7I illustrates a cross-sectional side view of the standard cells 600(1), 600(2) at an ninth fabrication stage 700(9) of removing the first, second, and third selective recess blocking masks 644(1)-644(3). In this manner, each of the first, second, and third selective recess blocking masks 644(1)-644(3) are removed, revealing the first, second, third, and fourth fins 612(1)-612(4) formed to have varying exposures from trench isolation. In at least one aspect, each selective recess blocking mask 644(1) can be removed using etching, strip, and/or clean process. Etching can include dry-etching, wet/dry cleaning, and/or chemical processes, and can use etchants such as hydrochloric acid (HCl), solvents, and/or alkaline solutions. Further, the substantially planar top surface 640(2) of each trench isolation layer 634(1)-634(4) can be further processed using processes such as etching, planarization, and/or time-based recessing. Further, the materials, processes, and other characteristics related to the standard cell 300 in FIGS. 3A and 3B, and particularly related to block 412 in FIG. 4, may also be applied to the standard cells 600(1), 600(2) in FIGS. 6A and 6B.

Figure 7J:
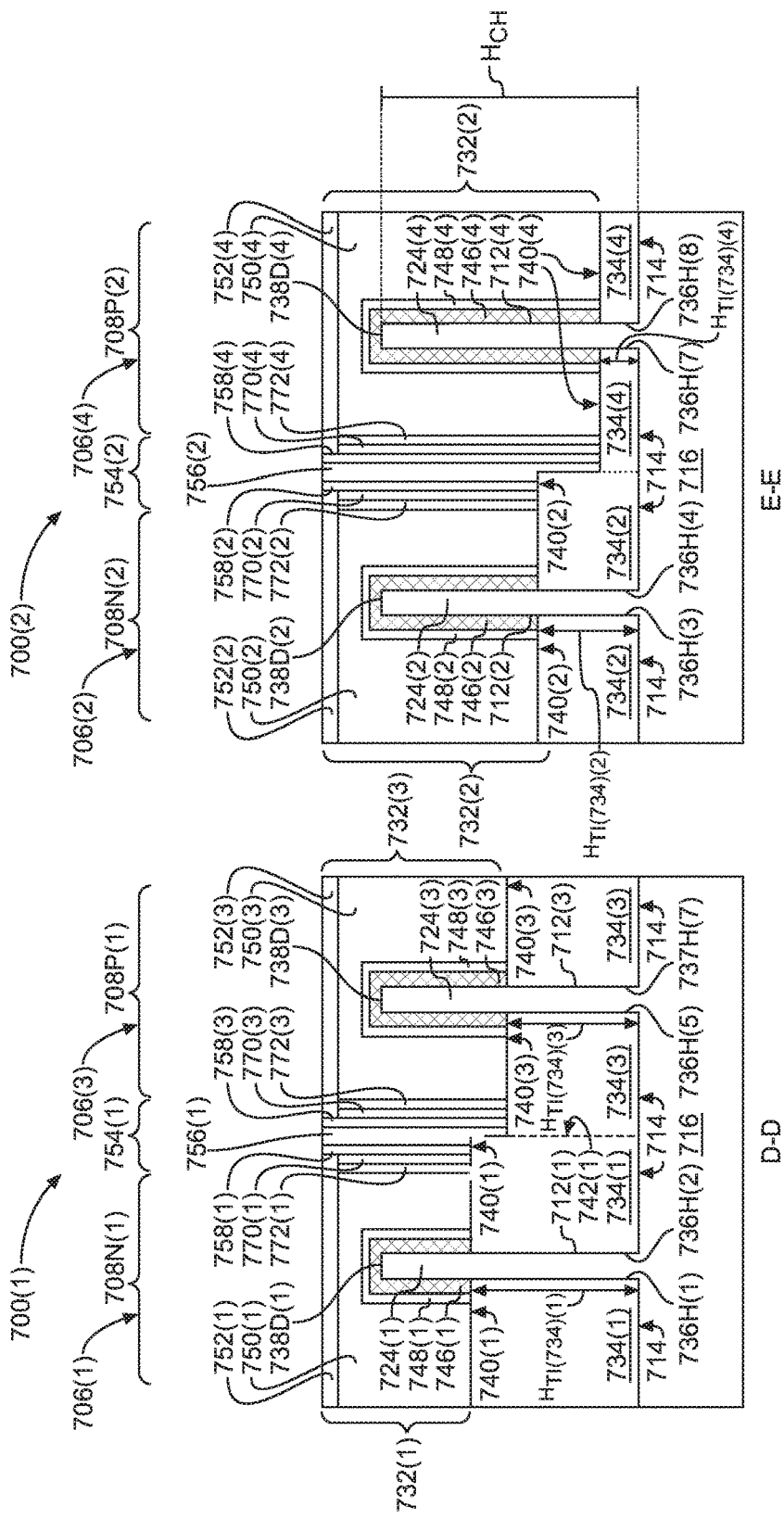

FIG. 7J illustrates a cross-sectional side view of the standard cells 600(1), 600(2) at a tenth fabrication stage 700(10) of forming gates 632(1)-632(4) above each fin 612(1)-612(4). In this manner, each gate 632(1)-632(4) includes a gate dielectric material layer 646(1)-646(4), a work function layer 648(1)-648(4), a conductive layer 650(1)-650(4), and a gate cap 652(1)-652(4). FIG. 7J also includes forming an isolation region 654(1), 654(2) between the NMOS region 608N and the PMOS region 608P of each standard cell 600(1), 600(2) so as to isolate each FinFET 606(1)-606(4) from external interference, such as stray capacitance between FinFETs 606(1)-606(4) of the same standard cell 600(1), 600(2). For example, a first isolation region 654(1) in the first standard cell 600(1) can isolate the first FinFET 606(1) from the stray capacitance of the third FinFET 606(3). In this regard, each isolation region 654(1), 654(2) has a pre-metal dielectric oxide material layer 656 between two (2) spacers 658(1), 658(2), two (2) middle gate dielectric material layers 660(1), 660(2), and two (2) middle work function layers 662(1), 662(2), as shown in FIG. 7J.

In some aspects, the gate dielectric material layer 638(1), 638(2) may comprise oxide materials, high-k dielectric materials such as hafnium oxide (HfO2), and/or other combinations of oxide materials. Aspects also include the work function layers 648(1), 648(2) comprising titanium aluminide (TiAl), titanium nitride (TiN), and/or other metals providing a band shift. The conductive layer 650(1), 650(2) can comprise tungsten (W), aluminum (Al), and/or other low-resistance metals. The gate cap 652(1), 652(2) can comprise silicon-nitride (SiN), silicon oxycarbide (SiOC), and/or dielectrics selective to gate spacer and inter-layer metallic dielectric (IMD) materials. In some aspects, forming aspects of the gate 632(1), 632(2) and the isolation region may include using atomic layer deposition, Chemical Vapor Deposition (CVD), and/or bottom-up fill. The pre-metal dielectric oxide material layer 656 may comprise oxide materials and any other low-k dielectric materials. The two (2) spacers 658(1), 658(2) may comprise materials such as silicon nitride (SiN). The two (2) middle gate dielectric material layers 660(1), 660(2) may comprise oxide materials, high-k dielectric materials such as hafnium oxide (HfO2), and/or combinations of oxide materials. The two (2) middle work function layers 662(1), 662(2) may comprise titanium aluminide (TiAl), titanium nitride (TiN), and/or other metals providing a band shift. Additional aspects may include forming a third isolation region 654(3) and/or a fourth isolation region 654(4) between each NMOS region 608N(1), 608N(2) and each PMOS region 608P(1), 608P(2) in each standard cell 600(1), 600(2). For example, the third isolation region 654(3) can be formed between the first FinFET 612(1) of the first standard cell 600(1) and the second FinFET 612(2) of the second standard cell 612(2) in FIGS. 6A and 6B. Further, the materials, processes, and other characteristics related to the standard cell 300 in FIGS. 3A and 3B, and particularly related to FIG. 5F, may also be applied to the standard cells 600(1), 600(2) in FIGS. 6A and 6B as well as FIG. 7J.

Figure 8A:
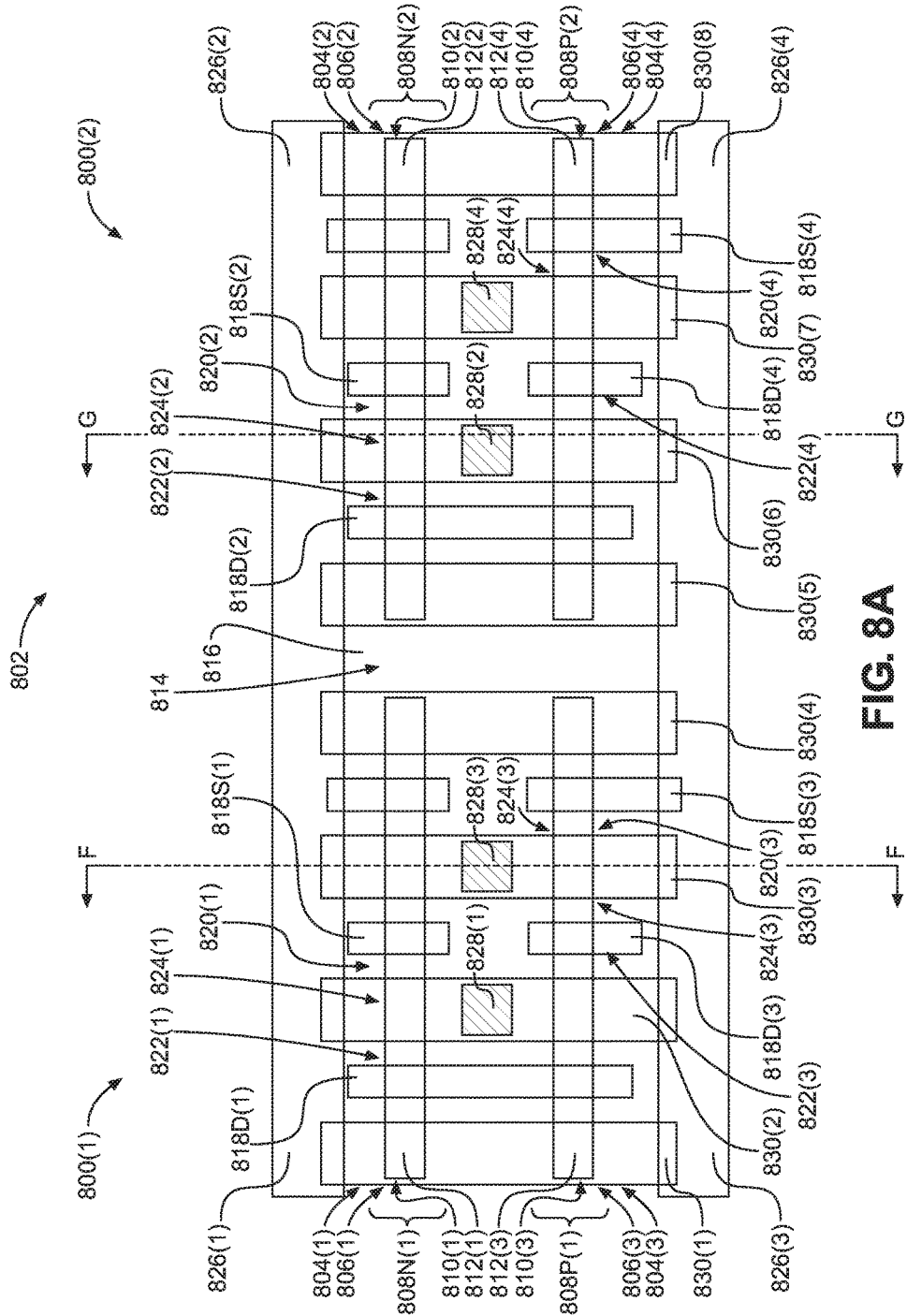
FIG. 8A is a top-view diagram of two adjacent exemplary standard cells, wherein each standard cell includes two (2) 3D transistors and each 3D transistor is in the form of a nanowire 3D transistor having a nanowire channel structure with nanowires therein, having varied nanowire channel structure exposures from trench isolation such that one of the standard cells is a "weaker" standard cell having nanowire 3D transistors of a weaker drive strength relative to the other "stronger" standard cell having nanowire 3D transistors of a stronger relative drive strength.

FIG. 8A illustrates a top-view diagram of two (2) exemplary standard cells 800(1), 800(2) formed in an IC 802, wherein each standard cell 800(1), 800(2) has two (2) 3D transistors therein. In this regard, the first standard cell 800(1) includes a first 3D transistor 804(1) in the form of a first nanowire 3D transistor 806(1) in an NMOS region 808N(1) of the first standard cell 800(1) and a third 3D transistor 804(3) in the form of a third nanowire 3D transistor 806(3) in a PMOS region 808P(1) of the first standard cell 800(1). The second standard cell 800(2) of FIG. 8A includes a second 3D transistor 804(2) in the form of a second nanowire 3D transistor 806(2) in an NMOS region 808N(2) of the second standard cell 800(2) and a fourth 3D transistor 804(4) in the form of a fourth nanowire 3D transistor 806(4) in a PMOS region 808P(2) of the second standard cell 800(2). The first nanowire 3D transistor 806(1) has a first channel structure 810(1) in the form of a first nanowire channel structure 812(1) formed from a substantially planar top surface 814 of a substrate 816. The first nanowire 3D transistor 806(1) includes a first source 818S (1) formed in a first end portion 820(1) of the first nanowire channel structure 812(1) and a first drain 818D(1) formed in a second end portion 822(1) of the first nanowire channel structure 812(1). The first nanowire 3D transistor 806(1) also includes a first and second channel 824(1), 824(2) formed in the first nanowire channel structure 812(1) between the first drain 818D(1) and the first source 818S(1) as a gate-all-around-type channel. Similarly, the second, third, and fourth nanowire channel structures 812(2)-812(4) are formed from the substantially planar top surface 814 of the substrate 816. The second, third, and fourth nanowire 3D transistors 806(2)-806(4) each include a second, third, and fourth source 818S(2)-818S(4), respectively, and a second, third, and fourth drain 818D(2)-818D(4), respectively. The source 818S(2)-818S(4) of each nanowire 3D transistor 806(2)-806(4) is formed in a first end portion 820(2)-820(4) of a respective nanowire channel structure 812(2)-812(4). Similarly, the drain 818D(2)-818D(4) of each nanowire 3D transistor 806(2)-806(4) is formed in a second end portion 822(2)-822(4) of a respective nanowire channel structure 812(2)-812(4). The third nanowire 3D transistor 806(3) includes a first and second channel 824(6)-824(7) formed in the third nanowire channel structure 812(3) between the third drain 818D(3) and the third source 818S(3). The second nanowire 3D transistor 806(2) includes a first, second, and third channel 824(3)-824(5) formed in the second nanowire channel structure 812(2) between the second drain 818D(2) and the second source 818S(2). Similarly, the fourth nanowire 3D transistor 806(4) includes a first, second, and third channel 824(8)-824(10) formed in the fourth nanowire channel structure 812(4) between the fourth drain 818D(4) and the fourth source 818S(4). The first nanowire 3D transistor 806(1) and the third nanowire 3D transistor 806(3) are formed in the first standard cell 800(1) between and substantially parallel to two (2) power rails 826(1), 826(3) also provided in the first standard cell 800(1). The second nanowire 3D transistor 806(1) and the fourth nanowire 3D transistor 806(4) are formed in the second standard cell 800(2) between and substantially parallel to two (2) power rails 826(2), 826(4) provided in the second standard cell 800(2). A gate contact 828(1)-828(4) is formed over a gate line 830(2)-830(3), 830(6)-830(7) of each nanowire 3D transistor 806(1)-806(4) to form a gate 832(1)-832(4) that controls the current conduction through each channel 824(1)-824(4).

Figure 8B:
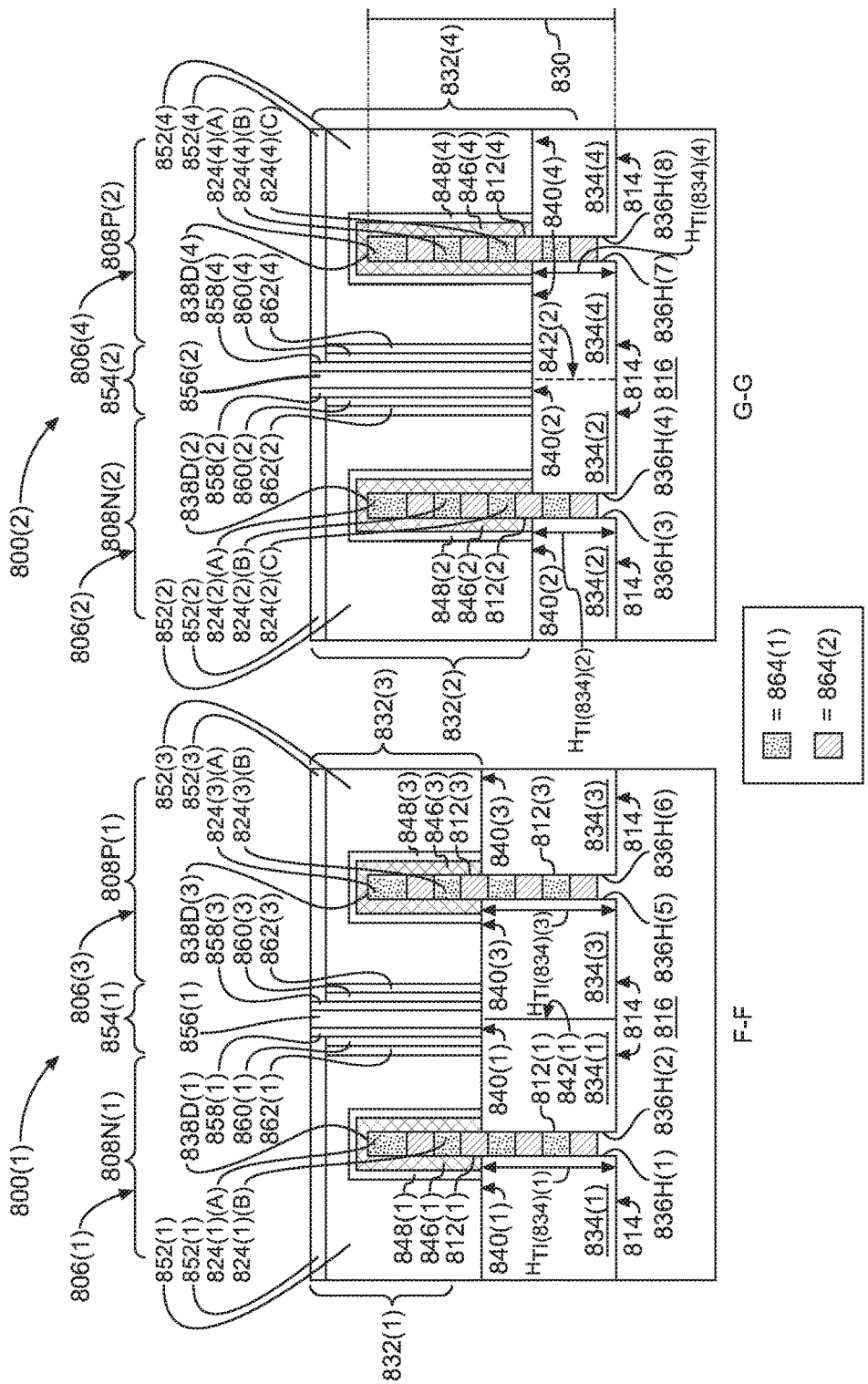
FIG. 8B is a cross-sectional diagram of the exemplary standard cells of FIG. 8A.

FIG. 8B is a cross-sectional view along the F-F line and G-G line of the exemplary standard cells 800(1) and 800(2) of FIG. 8A to further illustrate the varied exposures of each nanowire channel structure 812(1)-812(4) from trench isolation to vary the drive strength of each nanowire 3D transistor 806(1)-806(4), respectively. With reference to FIG. 8B, a first, second, third, and fourth trench isolation layer 834(1)-834(4) are disposed adjacent to the first, second, third, and fourth channel structures 810(1)-810(4), respectively, to provide current isolation between channels 824(1)-824(10) provided by the respective channel structures 810(1)-810(4) of the 3D transistors 804(1)-804(4). Each trench isolation layer 834(1)-834(4) also limits the effect of each respective gate 832(1)-832(4) on other transistors that share the same substrate 816 by isolating the substrate 816 from the electric field of each gate 832(1)-832(4). For example, the first trench isolation layer 834(1) limits the effect of the first gate 832(1) on the third nanowire 3D transistor 806(3). Similarly, the third trench isolation layer 834(3) limits the effect of the third gate 832(3) on the first nanowire 3D transistor 806(1).

Similar to FIGS. 6A and 6B above, each trench isolation layer 834(1)-834(4) additionally limits the amount of gate control over a respective nanowire channel structure 812(1)-812(4) by isolating a lower portion of each nanowire channel structure 812(1)-812(4) from the electric field of a respective gate 832(1)-832(4). This results in the amount of gate control over each nanowire channel structure 812(1)-812(4) being reduced by a function of a respective trench isolation height $H_{TI(834)(1)}$-$H_{TI(834)(4)}$ of each trench isolation layer 834(1)-834(4). This reduction in gate control reduces the total channel 824(1)-824(10) cross-sectional area of each nanowire channel structure 812(1)-812(4) to a total cross-sectional area $A_{CSX(812)(1)}$-$A_{CSX(812)(4)}$ of each nanowire channel structure 812(1)-812(4). Since the cross-sectional area $A_{CSX(812)(1)}$-$A_{CSX(812)(4)}$ of each nanowire channel structure 812(1)-812(4) determines the resistance, and thus affects the drive strength of the respective nanowire 3D transistor 806(1)-806(4), a decrease in resistance of the nanowire channel structures 812(1)-812(4) increases drive strength of the respective nanowire 3D transistors 806(1)-806(4). The total cross-sectional area $A_{CSX(812)(1)}$-$A_{CSX(812)(4)}$ of each nanowire channel structure 812(1)-812(4) is a function of the height $H_{CSX(812)(1)}$-$H_{CSX(812)(8)}$ of each vertical side surface 836H(1)-836H(8) of each channel 824(1)-824(10) exposed from the respective trench isolation layers 834(1)-834(4) times the length $D_{CSX(812)(1)}$-$D_{CSX(812)(4)}$ of each horizontal top surface 838D(1)-838D(2) exposed to the gate 832(1)-832(4). Thus, since a larger effective width $W_{eff}$ reduces channel 824(1)-824(4) resistance, nanowire 3D transistor 806(1)-806(4) drive strength can be increased by increasing effective width $W_{eff}$. Thus, by controlling the exposure of each nanowire channel structure 812(1)-812(4) from the respective trench isolation layers 834(1)-834(4), the amount of nanowire channel structure surface area exposed to each gate 832(1)-832(4) is also controlled, resulting in the first and third nanowire 3D transistors 806(1), 806(3) of the first standard cell 800(1) having a drive strength different from the second and fourth nanowire 3D transistors 806(2), 806(4). In this regard, the materials, processes, and other characteristics related to the standard cell 600 in FIGS. 6A and 6B may also be applied to the standard cells 800(1), 800(2) in FIGS. 8A and 8B.

Figure 9A:
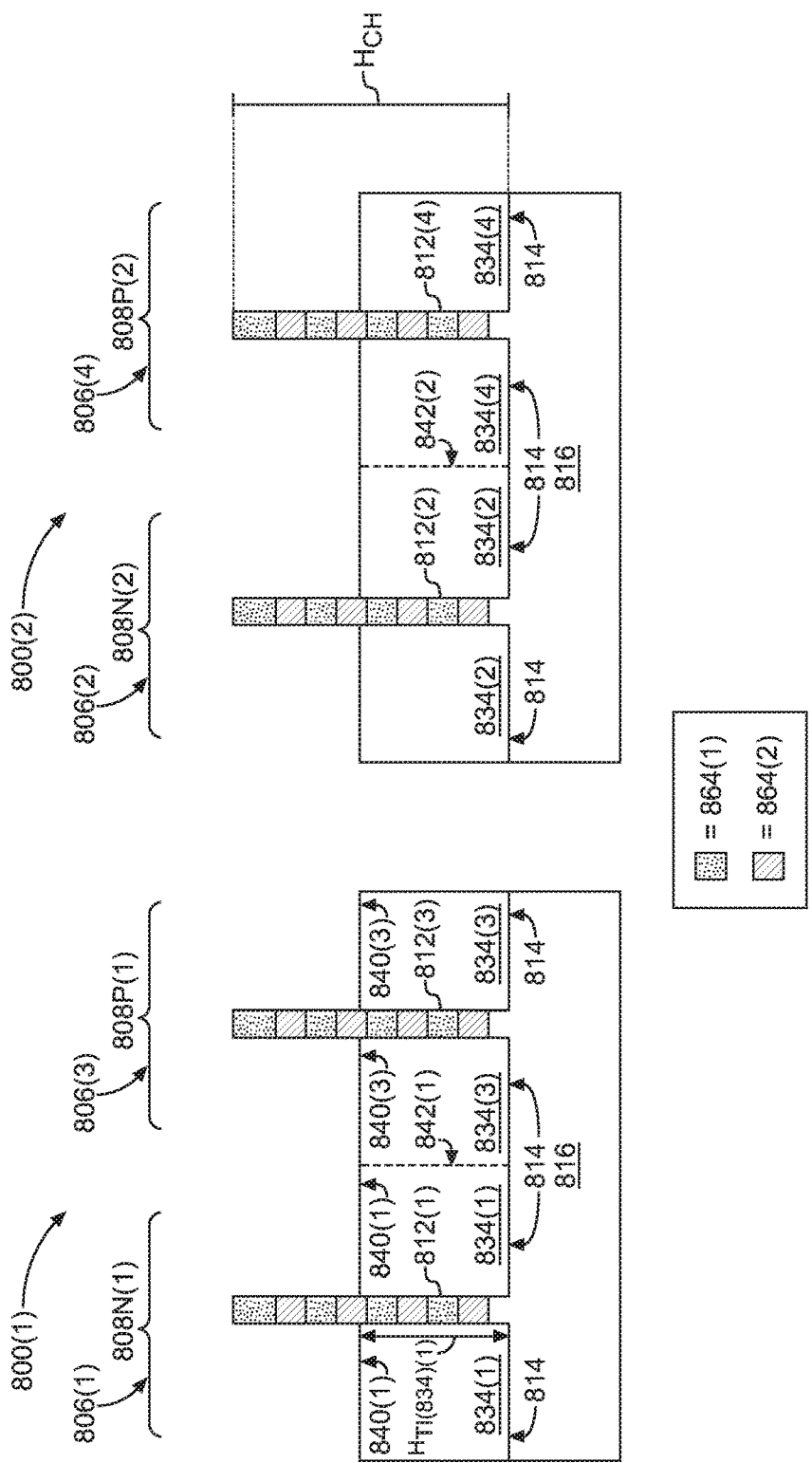

In this regard, FIGS. 9A-9E illustrate stages of an exemplary fabrication process employed to fabricate the four (4) nanowire 3D transistors 806(1)-806(4) in the standard cells 800(1), 800(2) in FIGS. 8A and 8B. In this regard, a first fabrication stage 900(1) includes forming the first, second, third, and fourth nanowire channel structures 812(1)-812(4) in the standard cells 800 in FIGS. 8A and 8B from the substantially planar top surface 814 of the substrate 816. FIG. 9A illustrates a cross-sectional side view of the first fabrication stage 900(1) of forming the first and third nanowire channel structure 812(1), 812(3) in the first standard cell 800(1) and the second and fourth nanowire channel structure 812(2), 812(4) in the second standard cell 800(2). As shown in FIG. 9A, the first nanowire channel structure 812(1) of the first nanowire 3D transistor 806(1) is formed in the NMOS region 808N(1) of the first standard cell 800(1). The third nanowire channel structure 812(3) of the third nanowire 3D transistor 806(3) is formed in the PMOS region 808P(1) of the first standard cell 800(1). The second nanowire channel structure 812(2) of the second nanowire 3D transistor 806(2) is formed in the NMOS region 808N(2) of the second standard cell 800(2). The fourth nanowire channel structure 812(4) of the fourth nanowire 3D transistor 806(4) is formed in the PMOS region 808P(2) of the second standard cell 800(2). Each nanowire channel structure 812(1)-812(4) extends to the same channel structure height $H_{CH}$ above the substantially planar top surface 814 of the substrate 816. In this manner, each nanowire channel structure 812(1)-812(4) is formed from the substantially planar top surface 814 of the substrate 816.

Forming each nanowire channel structure 812(1)-812(4) can include multiple steps. For example, a first material 864(1) and a second material 864(2) can be deposited or epitaxially grown in an alternating and vertically stacked manner to form vertically stacked and alternating layers of the first material 864(1) and the second material 864(2). In some aspects, the first material 864(1) comprises a first semiconductor material, such as silicon (Si), silicon germanium (SiGe), and/or another selective channel material, and the second material 864(2) comprises a second semiconductor material, such as silicon germanium (SiGe), germanium (Ge), and/or another selective channel materials. In one example, the second and fourth nanowire channel structures 812(2), 812(4) formed in the PMOS regions 808P(1), 808P (2) of the standard cells 800(1), 800(2) include nanowire channels made of the second material 864(2). In another example, the first and third nanowire channel structures 812(1), 812(3) formed in the NMOS regions 808N(1), 808N(2) of the standard cells 800(1), 800(2) include nanowire channels made of the first material 864(1). Once formed to a desired channel structure height $H_{CH}$, portions of the vertically stacked and alternating layers can later be removed to provide the nanowire channels. Additional aspects include processes such as ion bombardment, bottom-channel oxidation, and/or ground-plane formation processes. Such processes can be used to form a stop layer. The materials, processes, and other characteristics related to the standard cell 300 in FIGS. 3A and 3B and the standard cells 600(1), 600(2) in FIGS. 6A and 6B may also be applied to the first fabrication stage 900(1) associated with the standard cells 800(1), 800(2) in FIGS. 8A and 8B.

FIG. 9A further illustrates depositing a trench isolation material 833 adjacent to each nanowire channel structure 812(1)-812(4) to a first trench isolation height $H_{TI(834)(1)}$ above the substantially planar top surface of the substrate 816. As will be discussed in more detail below, the deposited trench isolation material 833 will be further processed, including etched, to form the final trench isolation layers 834(1)-834(4) as illustrated in FIGS. 8A and 8B. In this regard, FIG. 9A illustrates a cross-sectional side view of depositing the trench isolation material 833 adjacent to each nanowire channel structure 812(1)-812(4) in the standard cells 800(1), 800(2) to a first trench isolation height $H_{TI(834)(1)}$. As shown in FIG. 9A, the trench isolation material 833 is deposited adjacent to each nanowire channel structure 812(1)-812(4) and extends to a first trench isolation height $H_{TI(834)(1)}$ above the substantially planar top surface 814 of the substrate 816. The trench isolation material 833 adjacent to the first nanowire channel structure 812(1) of the first nanowire 3D transistor 806(1) forms the first trench isolation layer 834(1). The first trench isolation layer 834(1) has a substantially planar top surface 840(1) formed at the first trench isolation height $H_{TI(834)(1)}$ laterally adjacent to the first nanowire channel structure 812(1). As shown in FIG. 9A, the boundary lines 842(1), 842(2) in the trench isolation material 833 of each standard cell 800(1), 800(2) delineate the portions of the trench isolation material 833 that will form each trench isolation layer 834(1)-834(4) in each standard cell 800(1), 800(2). For example, the first boundary line 842(1) indicates the line at which the first trench isolation layer 834(1) is separated from the portion of trench isolation material 833 adjacent to the third nanowire channel structure 812(3) that will be further processed to form the third trench isolation layer 834(3). In this regard, the materials, processes, and other characteristics related to the standard cell 300 in FIGS. 3A and 3B may also be applied to the second fabrication stage 900(2) associated with the standard cells 800(1), 800(2) in FIGS. 8A and 8B.

Figure 9B:
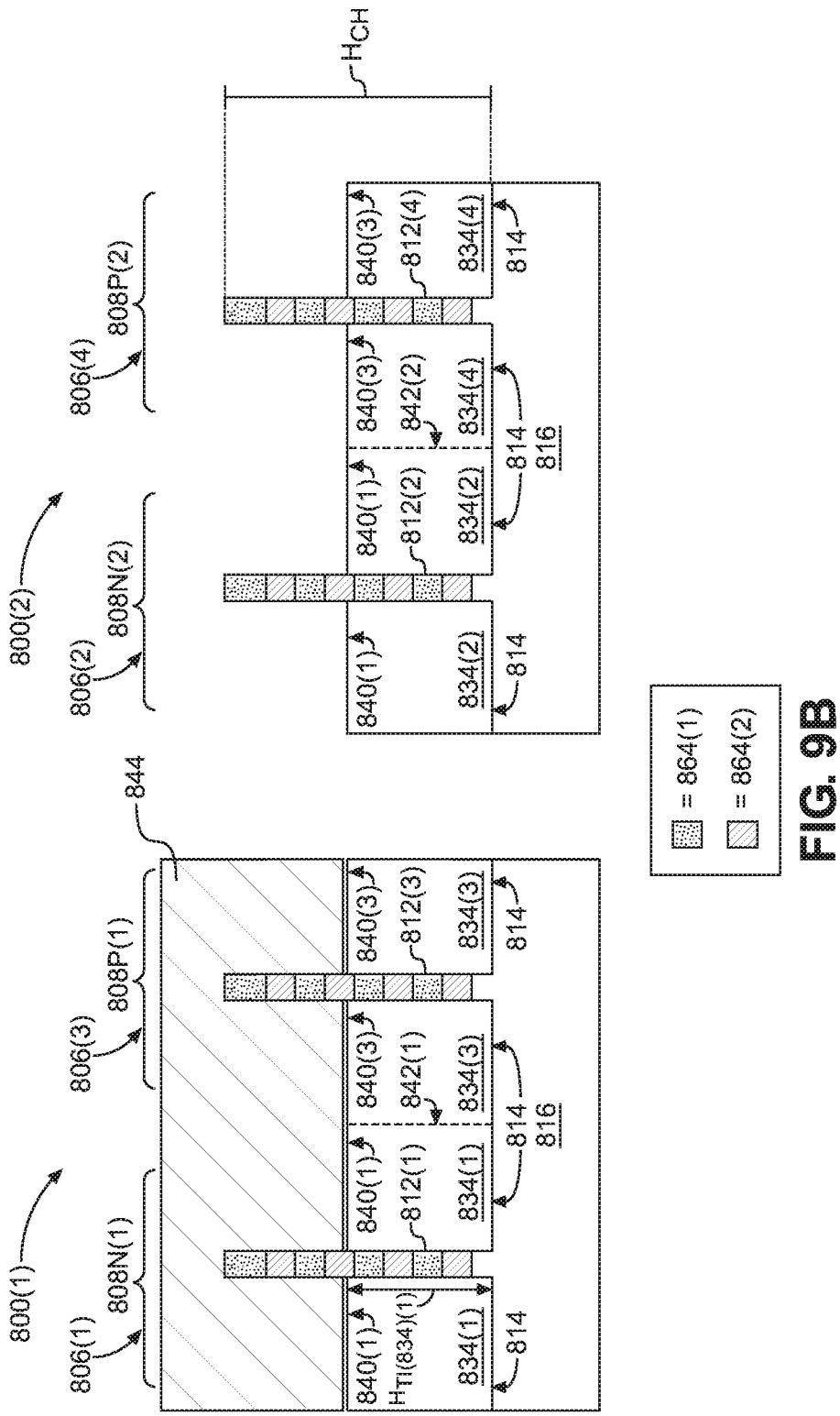

FIG. 9B illustrates a cross-sectional side view of the standard cells 800(1), 800(2) at a second fabrication stage 700(2) of depositing a first selective recess blocking mask 844(1) above the first and third trench isolation layers 834(1), 834(3) laterally adjacent to the first and third nanowire channel structures 812(1), 812(3) of the first standard cell 800(1). As shown in FIG. 9B, the first selective recess blocking mask 844(1) is deposited above the first and third trench isolation layers 834(1), 834(3). In this manner, the first selective recess blocking mask 844(1) isolates and covers the first and third trench isolation layers 834(1), 834(3) and leaves exposed the portions of trench isolation material 833 adjacent to the second and fourth nanowire channel structures 812(2), 812(4) that will be further processed to form the second and fourth trench isolation layers 834(2), 834(4), respectively. The materials, processes, and other characteristics related to the standard cell 300 in FIGS. 3A and 3B and the standard cells 600(1), 600(2) in FIGS. 6A and 6B may also be applied to the third fabrication stage 900(3) associated with the standard cells 800(1), 800(2) in FIGS. 8A and 8B.

FIG. 9C illustrates a cross-sectional side view of the standard cells 800(1), 800(2) at a third fabrication stage 700(3) of removing a portion of trench isolation material 833 not below the first selective recess blocking mask 644(1) and adjacent to the second and fourth nanowire channel structures 812(2), 812(4). In this manner, the first selective recess blocking mask 844(1) is used to isolate and protect the first and third trench isolation layers 834(1), 834(3) so that a portion of the trench isolation material 833 not below the first selective recess blocking mask 844(1) and adjacent to the second and fourth nanowire channel structures 812(2), 812(4) can be removed. In this regard, the substantially planar top surfaces 840(2), 840(4) of the second and fourth trench isolation layers 834(2), 834(4) are formed at a second trench isolation height $H_{TI(834)(2)}$ above the substantially planar top surface 814 of the substrate 816. The second trench isolation height $H_{TI(834)(2)}$ is different from the first trench isolation height $H_{TI(834)(1)}$, and allows for a greater amount of surface area of the second and fourth nanowire channel structures 812(2), 812(4) to be exposed from trench isolation relative to the amount of surface area exposed by the first and third nanowire channel structures 812(1). By increasing the exposure of the second and fourth nanowire channel structures 812(2), 812(4) from trench isolation relative to the first and third nanowire channel structures 812(1), 812(3), the first and third nanowire 3D transistors 806(1), 806(3) are formed to have a "weaker" drive strength relative to the "stronger" second and fourth nanowire 3D transistors 806(2), 806(4).

Figure 9D:
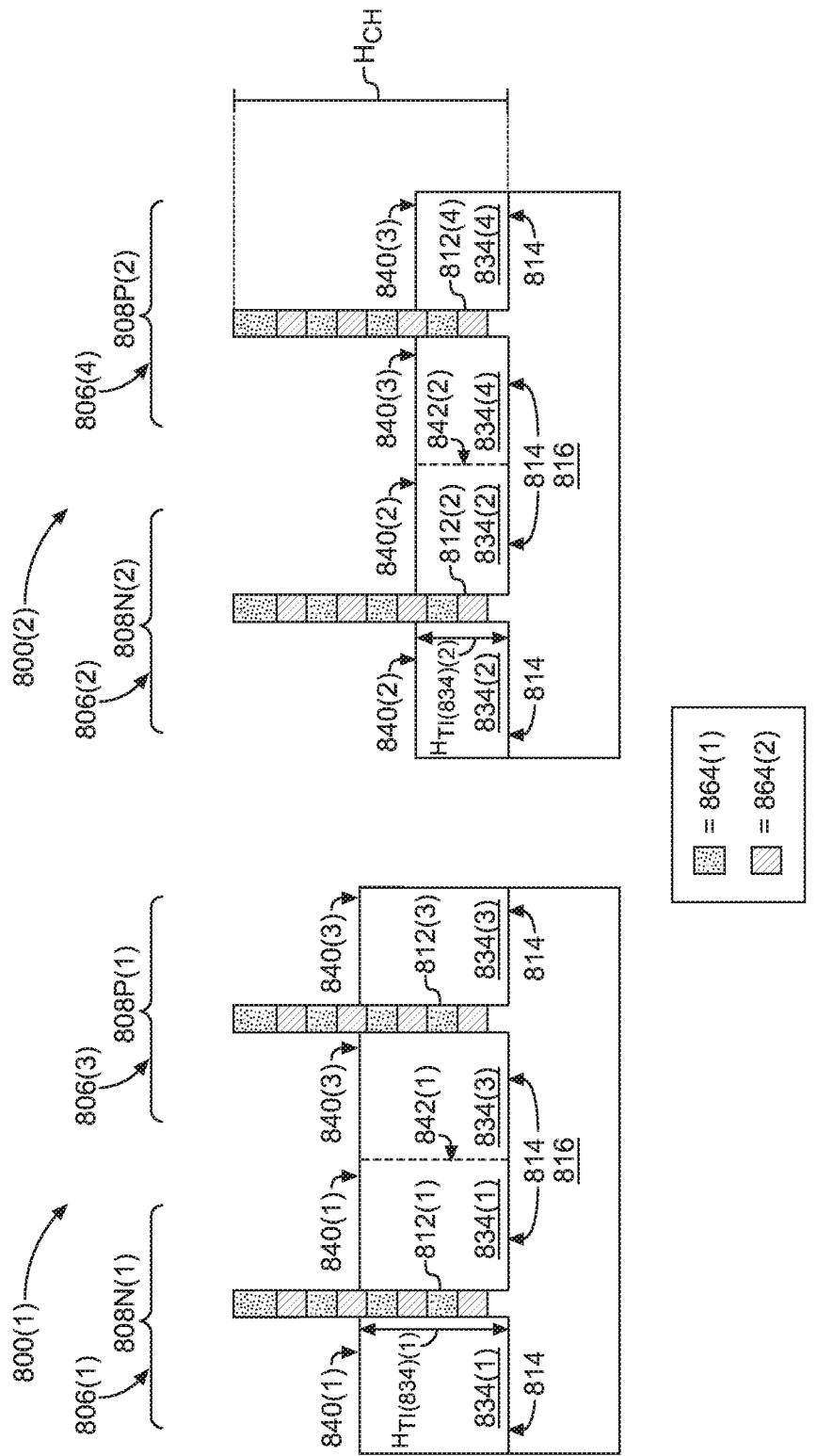

FIG. 9D illustrates a cross-sectional side view of the standard cells 800(1), 800(2) at an fourth fabrication stage 700(4) of removing the first selective recess blocking mask 844(1). In this manner, each of the first selective recess blocking mask 844(1) is removed, revealing each of the first, second, third, and fourth nanowire channel structures 812 (1)-812(4) formed to have one of two varying exposures from trench isolation. In at least one aspect, each selective recess blocking mask 644(1) can be removed using etching, stripping, and/or cleaning processes. Etching can include dry-etching, wet/dry cleaning, and/or chemical processes, and can use etchants such as hydrochloric acid (HCl), solvents, and/or alkaline solutions. Further, the substantially planar top surface 840(2) of the each trench isolation layer 834(1)-834(4) can be further processed using processes such as ion bombardment, doping, and/or epitaxial processes. Further, the materials, processes, and other characteristics related to the standard cell 300 in FIGS. 3A and 3B and the standard cells 600(1), 600(2) in FIGS. 6A and 6B may also be applied to the fourth fabrication stage 900(4) associated with the standard cells 800(1), 800(2) in FIGS. 8A and 8B.

Figure 9E:
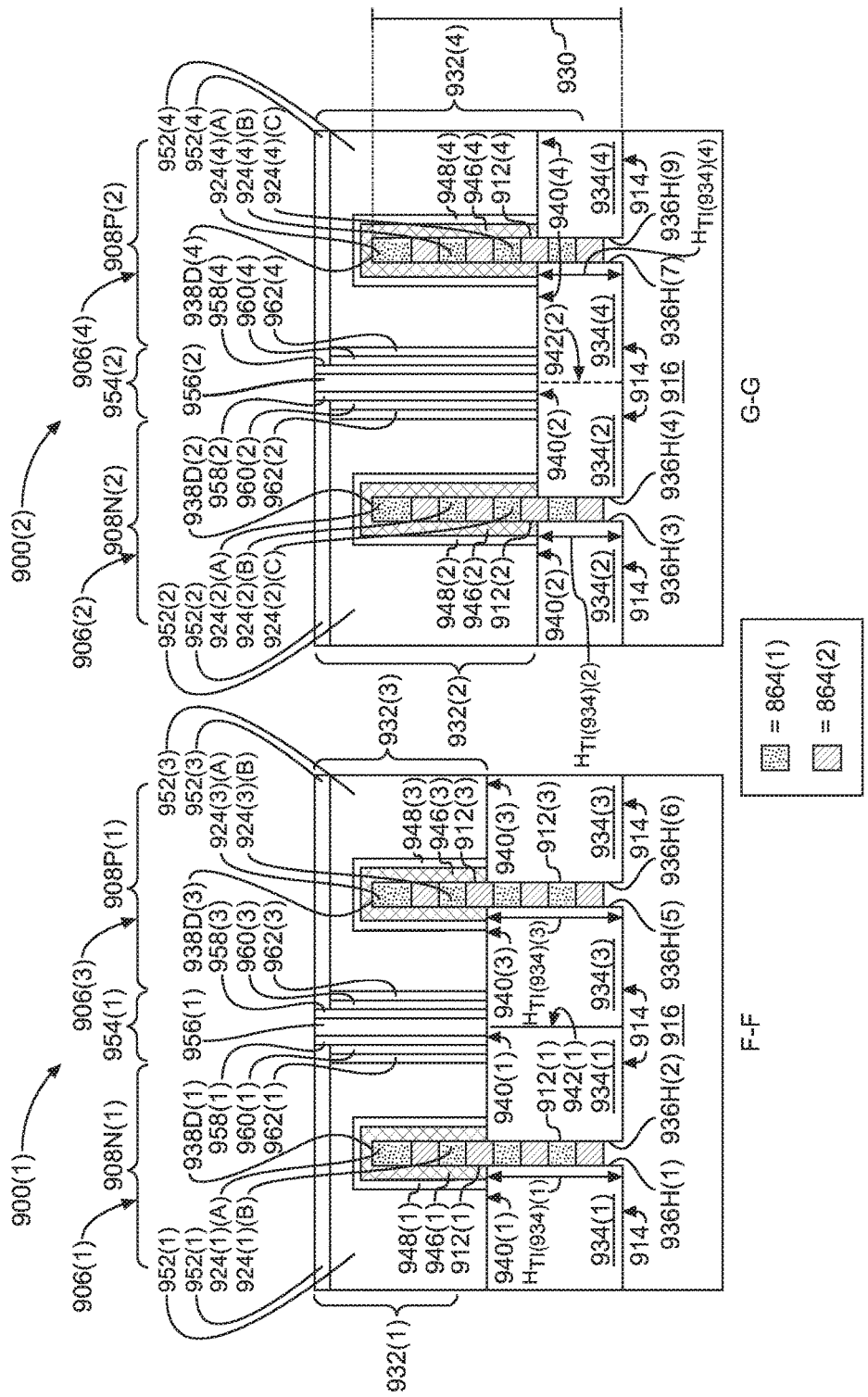

FIG. 9E illustrates a cross-sectional side view of the standard cells 800(1), 800(2) at a fifth fabrication stage 900(5) of forming gates 832(1)-832(4) above each nanowire channel structure 812(1)-812(4). In this manner, each gate 832(1)-832(4) includes a gate dielectric material layer 846(1)-846(4), a work function layer 848(1)-848(4), a conductive layer 850(1)-850(4), and a gate cap 852(1)-852(4). FIG. 9E also includes forming an isolation region 854(1), 854(2) between the NMOS region 808N and the PMOS region 808P of each standard cell 800(1), 800(2) so as to isolate each nanowire 3D transistor 806(1)-806(4) from external interference, such as stray capacitance between nanowire 3D transistors 806(1)-806(4) of the same standard cell 800(1), 800(2). For example, a first isolation region 854(1) in the first standard cell 800(1) can isolate the first nanowire 3D transistor 806(1) from the stray capacitance of the third nanowire 3D transistor 806(3). In this regard, each isolation region 854(1), 854(2) has a pre-metal dielectric oxide material layer 856 between two (2) spacers 858(1), 858(2), two (2) middle gate dielectric material layers 860(1), 860(2), and two (2) middle work function layers 862(1), 862(2), as shown in FIG. 9E. Further, the materials, processes, and other characteristics related to the standard cell 300 in FIGS. 3A and 3B and the standard cells 600(1), 600(2) in FIGS. 6A and 6B may also be applied to the fifth fabrication stage 900(5) associated with the standard cells 800(1), 800(2) in FIGS. 8A and 8B.

Controlling the drive strengths of FinFETs in different standard cells in an IC, like those shown above, may be desired in IC applications, such as ICs implementing memory units and logic units. One example of an application where controlling the drive strengths of FinFETs in standard cells may be desired is in static random access memory (SRAM) bit cells. For example, a six (6) transistor (6T) SRAM bit cell powered by a voltage Vdd, can use two (2) cross-coupled inverters to reinforce each other to retain data in the form of a voltage on a true storage node or a complement storage node. Each inverter could include a pull-up P-type FET (PFET) coupled in series to a pull-down N-type FET (NFET). Access transistors can be coupled to the respective inverters to provide respective read/write ports to the bit cell. In a read operation, a bitline and a complement bitline can be pre-charged to a voltage Vdd. Then, a wordline coupled to gates of the access transistors can be asserted to evaluate the differential voltages on the true storage node and complement node to read the bit cell. If a logic high voltage level (i.e., a '1') is stored at the true storage node (T=1) and a logic low voltage level (i.e., '0') is stored at the complement storage node (C=0), assertion of the wordline can cause the access transistor to discharge the pre-charged voltage on the complement bitline to the complement storage node and through the pull-down NFET to ground. However, if the access transistor is a faster device than the pull-up PFET, the discharge of the pre-charged voltage on the complement bitline can cause a charge build up on complement storage node that can cause inverter to flip the voltage on the true storage node from a logic '1' to a logic '0', which may cause a subsequent read operation to the bit cell to return erroneous data. This is known as a read disturb condition. To mitigate or avoid a read disturb condition from occurring in the SRAM bit cell in the example above, the access transistors could be weakened and the pull-up PFETs in the inverters could be strengthened. As discussed above with regard to the standard cells 300, 600(1), 600(2), 800(1), 800(2) in FIGS. 3A, 3B, 6A, 6B, 8A, and 8B, drive strengths of 3D transistors can be varied across and within standard cells. Thus, aspects disclosed herein can be used to implement an SRAM bit cell with pull-up P-type FinFETs 1018P(0), 1018P(1) having less exposure to trench isolation and pull-down N-type FinFETs 1018N(0), 1018N(1) having more exposure to trench isolation to address the read disturb condition, if desired.

Figure 10:
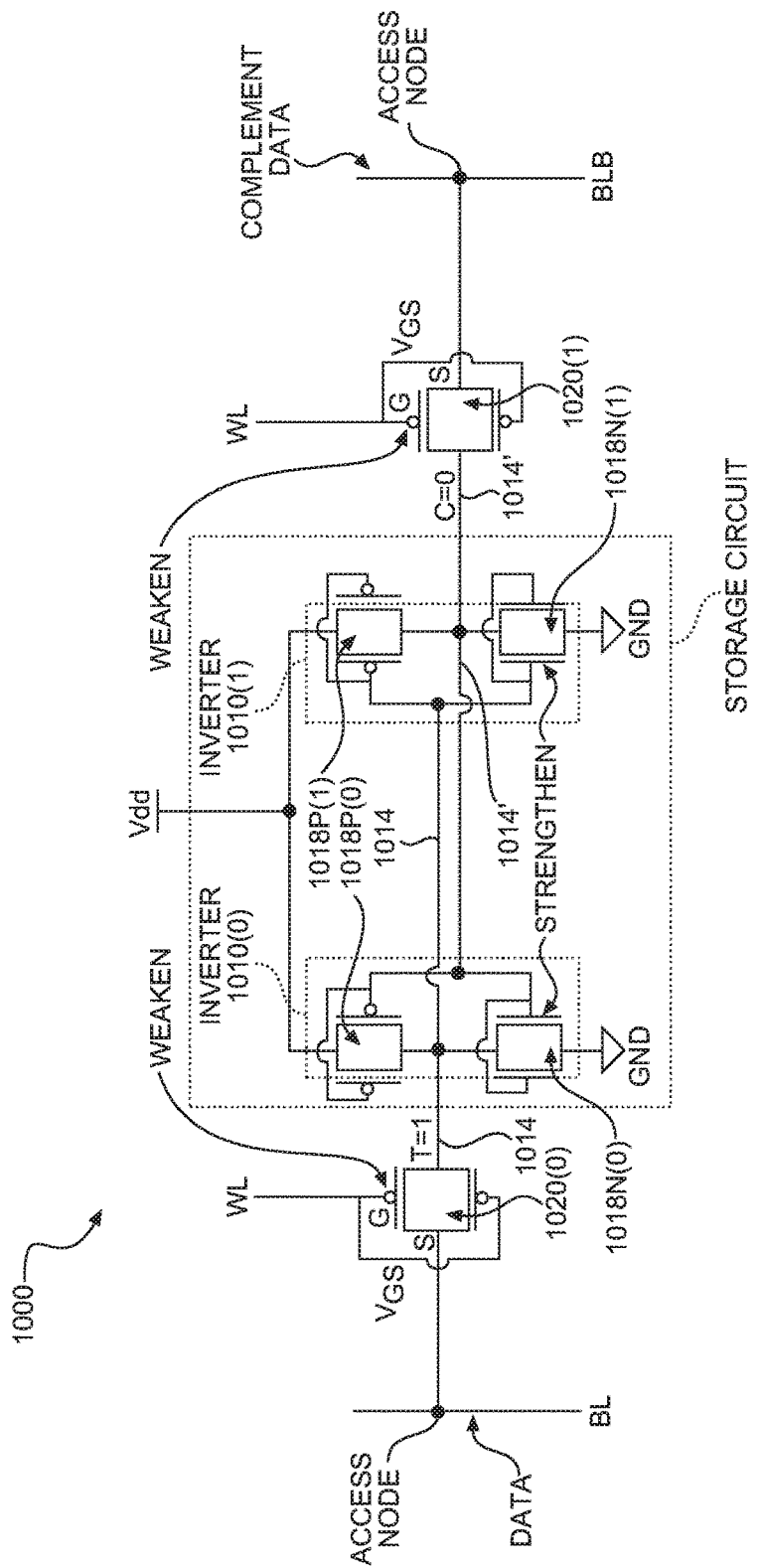
FIG. 10 is a circuit diagram illustrating a six (6) 3D-transistor (6T) static random access memory (SRAM) bit cell wherein the N-type FinFETs labeled "Strengthen" each have a channel structures with greater exposure from trench isolation relative to the exposure of the channel structures of the P-type FinFETs labeled "Weaken"

In this regard, FIG. 10 is a circuit diagram illustrating a six (6) 3D transistor (6T) static random access memory (SRAM) bit cell 1000 ("SRAM bit cell 1000") in an IC 1002, wherein pull-down N-type FinFETs 1018N(0), 1018N(1) labeled "Strengthen" each have a higher drive strength relative to pull-up P-type FinFETs 1018P(0), 1018P(1) labeled "Weaken." The memory bit cell 1000 in FIG. 10 includes a storage circuit 1008 in this example comprised of two (2) cross-coupled inverters 1010(1), 1010(2) powered by voltage Vdd. A true storage node (T) 1014 and a complement storage node (C) 1014' retain data 1016 (i.e., a charge) and complement data 1016' (i.e., a complement charge to the data 1016), respectively, in the form of voltages on the respective true storage node (T) 1014 and the complement storage node (C) 1014'. Each inverter 1010(0), 1010(1) is comprised of a respective pull-up P-type FinFET 1018P(0), 1018P(1) coupled in series to a respective pull-down N-type FinFET 1018N(0), 1018N(1). Each storage node 1014, 1014' is coupled to a respective inverter node 1022, 1022', which couples the FinFETs 1018P(0), 1018P(1) and 1018N(0), 1018N(1) of each inverter 1010(0), 1010(1) in series. Each storage node 1014, 1014' is also coupled to a respective control node 1024, 1024', which couples the FinFETs 1018P(0), 1018P(1) and 1018N(0), 1018N(1) of each inverter 1010(0), 1010(1) in parallel. Instead of providing N-type FinFET access transistors, P-type FinFET access transistors 1020(0), 1020(1) are coupled to the respective inverters 1010(0), 1010(1) to provide respective inverter nodes 1022, 1022' to the P-type FinFET read port memory bit cell 1000.

In a read operation, a bitline BL and complement bitline BLB are pre-charged to voltage Vdd. Then, the wordline WL coupled to gates (G) of each P-type FinFET access transistor 1020(0), 1020(1) is asserted to evaluate the differential voltages on the true storage node (T) 1014 and complement storage node (C) 1014' to read the memory bit cell 1000. If a logic high voltage level (i.e., a '1') is stored at the true storage node 1014 (T=1) and a logic low voltage level (i.e., '0') is stored at the complement storage node 1014' (C=0), assertion of the wordline WL will cause the access transistor 1020(0) coupled to the true storage node (T) 1014 to discharge the pre-charged voltage on the bitline BL to the true storage node 1014 and through the pull-down N-type FinFET 1018N(0) coupled to the true storage node 1014 to ground. However, if the access transistor 1020(1) is a faster device than the pull-up P-type FinFET 1018P(0) coupled to the true storage node 1014, the discharge of the pre-charged voltage on the bitline BL can cause a charge build up on the true storage node 1014 that can cause the inverter 1010(0) to flip the voltage on the true storage node 1014 from a logical '1' to a logical '0', which may cause a subsequent read operation to the memory bit cell 1000 to return erroneous data. This is known as a read disturb condition. To mitigate or avoid a read disturb condition from occurring in the memory bit cell 1000 in FIG. 10, the access transistors 1020(0), 1020(1) could be weakened and the pull-down N-type FinFETs 1018N(0), 1018N(1) in the inverters 1010(0), 1010(1) could be strengthened. Similarly, in order to mitigate or avoid a write failure condition from occurring in the memory bit cell 1000 in FIG. 10, the access transistors 1020(0), 1020(1) could be strengthened and the pull-up P-type FinFETs 1018P(0), 1018P(1) in the inverters 1010(0), 1010(1) could be weakened. In this manner, having FinFETs of varying drive strengths could reduce both read disturb conditions and write failures in the 6T SRAM memory bit cell 1000 in FIG. 10.

Selectively recessing trench isolation in 3D transistors to vary channel structure exposures from trench isolation to control drive strength according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 11 illustrates an example of a processor-based system 1100 that can employ 3D transistors 1101 having varying channel structure exposures from trench isolation to vary their drive strength. In this example, the processor-based system 1100 includes one or more central processing units (CPUs) 1102, each including one or more processors 1104. The CPU(s) 1102 may be a master device. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112, one or more input devices 1114, one or more output devices 1116, one or more network interface devices 1118, and one or more display controllers 1120, as examples. The input device(s) 1114 can include any type of input device, including, but not limited to, input keys, switches, voice processors, etc. The output device(s) 1116 can include any type of output device, including, but not limited to, audio, video, other visual indicators, etc. The network interface device(s) 1118 can be any devices configured to allow exchange of data to and from a network 1122. The network 1122 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1118 can be configured to support any type of communications protocol desired. The memory system 1112 can include one or more memory units 1124(0)-1124(M).

The CPU(s) 1102 may also be configured to access the display controller(s) 1120 over the system bus 1108 to control information sent to one or more displays 1126. The display controller(s) 1120 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc.

In another example, an IC comprising a substrate, a first 3D transistor, and a second 3D transistor can be provided. The substrate includes a substantially planar top surface. The first 3D transistor comprises a first means for conducting current extending from the substantially planar top surface of the substrate to a first means for conducting current height above the substantially planar top. The first means for conducting current may be the first channel structure 310(1) in FIGS. 3A and 3B, the first channel structure 610(1) in FIGS. 6A and 6B, and/or the first channel structure 810(1) in FIGS. 8A and 8B, as examples. The first means for conducting current includes a first end portion and a second end portion. A first means for providing electrical current is formed in the first end portion of the first means for conducting current. The first means for providing electrical current may be the first source 318S(1) in FIGS. 3A and 3B, the first source 618S(1) in FIGS. 6A and 6B, and/or the first source 818S(1) in FIGS. 8A and 8B, as examples. A first means for receiving electrical current is formed in the second end portion of the first means for conducting current. The first means for receiving electrical current may be the first drain 318D(1) in FIGS. 3A and 3B, the first drain 618D(1) in FIGS. 6A and 6B, and/or the first drain 818D(1) in FIGS. 8A and 8B, as examples. A first means for dispersing electric field of the first 3D transistor is disposed above the substrate and is laterally adjacent to the first means for conducting current, and includes a substantially planar top surface at a first means for dispersing electric field height above the substantially planar top surface of the substrate. The first means for dispersing electric field may be the first trench isolation layer 334(1) in FIGS. 3A and 3B, the first trench isolation layer 634(1) in FIGS. 6A and 6B, and the first trench isolation layer 834(1) in FIGS. 8A and 8B, as examples.

Further, the first 3D transistor includes a first means for controlling electrical current through the first means for conducting current disposed adjacent to the first means for conducting current and above the first means for dispersing electric field. The first means for controlling electrical current may be the first gate 332(1) in FIGS. 3A and 3B, the first gate 632(1) in FIGS. 6A and 6B, and/or the first gate 832(1) in FIGS. 8A and 8B, as examples. The second 3D transistor includes a second means for conducting current extending from the substantially planar top surface of the substrate to a second means for conducting current height above the substantially planar top surface substantially same as the first means for conducting current height. The second means for conducting current may be the second channel structure 310(2) in FIGS. 3A and 3B, the second channel structure 610(2) in FIGS. 6A and 6B, and/or the second channel structure 810(2) in FIGS. 8A and 8B, as examples. The second means for conducting current includes a first end portion and a second end portion. A second means for providing electrical current is formed in the first end portion of the second means for conducting current. The second means for providing electrical current may be the second source 318S(2) in FIGS. 3A and 3B, the second source 618S(2) in FIGS. 6A and 6B, and/or the second source 818S(2) in FIGS. 8A and 8B, as examples. A second means for receiving electrical current is formed in the second end portion of the second means for conducting current. The second means for receiving electrical current may be the second drain 318D(2) in FIGS. 3A and 3B, the second drain 618D(2) in FIGS. 6A and 6B, and/or the second drain 818D(2) in FIGS. 8A and 8B, as examples. A second means for dispersing electric field of the second 3D transistor is disposed above the substrate and laterally adjacent to the second means for conducting current, and includes a substantially planar top surface at a second means for dispersing electric field height above the substantially planar top surface of the substrate different from the first means for dispersing electric field height. The second means for dispersing electric field may be the second trench isolation layer 334(2) in FIGS. 3A and 3B, the second trench isolation layer 634(2) in FIGS. 6A and 6B, and the second trench isolation layer 834(2) in FIGS. 8A and 8B, as examples. Further, the second 3D transistor comprises a second means for controlling electrical current through the at least one second means for conducting current disposed adjacent to the second means for conducting current and above the second means for dispersing electric field. The second means for controlling electrical current may be the second gate 332(2) in FIGS. 3A and 3B, the second gate 632(2) in FIGS. 6A and 6B, and/or the second gate 832(2) in FIGS. 8A and 8B, as examples.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC), comprising:
a substrate comprising a substantially planar top surface;
a first three-dimensional (3D) transistor, comprising:
    a first channel structure extending from the substantially planar top surface of the substrate to a first channel structure height above the substantially planar top surface, the first channel structure comprising a first end portion, a second end portion, a first side surface, and a second side surface opposite the first side surface;
    a first source formed in the first end portion of the first channel structure;

a first drain formed in the second end portion of the first channel structure;

at least one first channel formed in the first channel structure between the first source and the first drain;

a first trench isolation layer disposed above the substrate and laterally adjacent to the first channel structure, the first trench isolation layer comprising a substantially planar top surface at a first trench isolation height above the substantially planar top surface of the substrate; and a first gate disposed over at least a portion of the first side surface and a portion of the second side surface, and above the first trench isolation layer to a gate height above the substantially planar top surface of the substrate; and a second 3D transistor, comprising:

a second channel structure extending from the substantially planar top surface of the substrate to a second channel structure height above the substantially planar top surface substantially the same as the first channel structure height, the second channel structure comprising a first end portion, a second end portion, a third side surface, and a fourth side surface opposite the third side surface;

a second source formed in the first end portion of the second channel structure;

a second drain formed in the second end portion of the second channel structure;

at least one second channel formed in the second channel structure between the second source and the second drain;

a second trench isolation layer disposed above the substrate and laterally adjacent to the second channel structure, the second trench isolation layer comprising a substantially planar top surface at a second trench isolation height above the substantially planar top surface of the substrate different from the first trench isolation height; and a second gate disposed over at least a portion of the third side surface and a portion of the fourth side surface, and above the second trench isolation layer to the gate height;

the at least one first channel of the first 3D transistor doped with a first dopant of a first polarity; and the at least one second channel of the second 3D transistor doped with a second dopant of a second polarity opposite that of the first polarity.

2. The IC of claim 1, wherein the first 3D transistor has a first drive strength and the second 3D transistor has a second drive strength different from the first drive strength.

3. The IC of claim 2, wherein the first drive strength is a function of the first trench isolation height and the second drive strength is a function of the second trench isolation height.

4. The IC of claim 1, further comprising:

a third 3D transistor, comprising:

a third channel structure extending from the substantially planar top surface of the substrate to a third channel structure height above the substantially planar top surface substantially the same as the first channel structure height, the third channel structure comprising a first end portion, a second end portion, a fifth side surface, and a sixth side surface opposite the fifth side surface;

a third source formed in the first end portion of the third channel structure;

a third drain formed in the second end portion of the third channel structure;

at least one third channel formed in the third channel structure between the third source and the third drain;

a third trench isolation layer disposed above the substrate and laterally adjacent to the third channel structure, the third trench isolation layer comprising a substantially planar top surface at a third trench isolation height above the substantially planar top surface of the substrate different from the first trench isolation height and the second trench isolation height; and a third gate disposed over at least a portion of the fifth side surface and a portion of the sixth side surface, and above the third trench isolation layer to the gate height.

5. The IC of claim 1, further comprising:

a complementary metal-oxide semiconductor (CMOS) standard cell;

wherein the first 3D transistor and the second 3D transistor are integrated into the CMOS standard cell.

6. The IC of claim 5, wherein:

the at least one first channel of the first 3D transistor is doped with a first dopant of a first polarity; and the at least one second channel of the second 3D transistor is doped with a second dopant of a second polarity opposite that of the first polarity.

7. The IC of claim 1, further comprising:

a third 3D transistor, comprising:

a third channel structure extending from the substantially planar top surface of the substrate to a third channel structure height above the substantially planar top surface substantially the same as the first channel structure height, the third channel structure comprising a first end portion, a second end portion, a fifth side surface, and a sixth side surface opposite the fifth side surface;

a third source formed in the first end portion of the third channel structure;

a third drain formed in the second end portion of the third channel structure;

at least one third channel formed in the third channel structure between the third source and the third drain;

a third trench isolation layer disposed above the substrate and laterally adjacent to the third channel structure; and a third gate disposed over at least a portion of the fifth side surface and a portion of the sixth side surface, and above the third trench isolation layer to the gate height;

a fourth 3D transistor, comprising:

a fourth channel structure extending from the substantially planar top surface of the substrate to a fourth channel structure height above the substantially planar top surface substantially the same as the first channel structure height, the fourth channel structure comprising a first end portion, a second end portion, a seventh side surface, and an eighth side surface opposite the seventh side surface;

a fourth source formed in the first end portion of the fourth channel structure;

a fourth drain formed in the second end portion of the fourth channel structure;

at least one fourth channel formed in the fourth channel structure between the fourth source and the fourth drain;
a fourth trench isolation layer disposed above the substrate and laterally adjacent to the fourth channel structure; and
a fourth gate disposed over at least a portion of the seventh side surface and a portion of the eighth side surface, and above the fourth trench isolation layer to the gate height;
a first complementary metal-oxide semiconductor (CMOS) standard cell;
wherein the first 3D transistor and the third 3D transistor are integrated into the first CMOS standard cell; and
a second CMOS standard cell;
wherein the second 3D transistor and the fourth 3D transistor are integrated into the second CMOS standard cell.

8. The IC of claim 7, wherein:
the third trench isolation layer further comprises a substantially planar top surface at the first trench isolation height above the substantially planar top surface of the substrate; and
the fourth trench isolation layer further comprises a substantially planar top surface at the second trench isolation height above the substantially planar top surface of the substrate.

9. The IC of claim 7, wherein:
the third trench isolation layer further comprises a substantially planar top surface at a third trench isolation height above the substantially planar top surface of the substrate different from the first trench isolation height and the second trench isolation height; and
the fourth trench isolation layer further comprises a substantially planar top surface at a fourth trench isolation height above the substantially planar top surface of the substrate different from the first trench isolation height and the second trench isolation height and the third trench isolation height.

10. The IC of claim 1, further comprising:
a memory bit cell, comprising:
a storage circuit, comprising:
a first inverter and a second inverter, each comprising a pull-up P-type (P) Field-Effect Transistor (FET) (PFET) and a pull-down N-type FET (NFET), wherein the pull-up PFET and the pull-down NFET are coupled in series by an inverter node and coupled in parallel by a control node;
a storage node coupled to the inverter node of the first inverter and to the control node of the second inverter; and
a complementary storage node coupled to the inverter node of the second inverter and to the control node of the first inverter;
a first access transistor coupled to the storage node and a bitline, and comprising a gate coupled to a wordline; and
a second access transistor coupled to the complementary storage node and a complementary bitline, and comprising a gate coupled to the wordline.

11. The IC of claim 10, wherein:
the first 3D transistor comprises at least one of the pull-up PFET of the first inverter, the pull-up PFET of the second inverter, the pull-down NFET of the first inverter, the pull-down NFET of the second inverter, the first access transistor, and the second access transistor; and
the second 3D transistor comprises at least another of the pull-up PFET of the first inverter, the pull-up PFET of the second inverter, the pull-down NFET of the first inverter, the pull-down NFET of the second inverter, the first access transistor, and the second access transistor.

12. The IC of claim 10, wherein:
at least one of the first access transistor and the second access transistor comprises the first 3D transistor having a first drive strength; and
the pull-down NFET coupled to the at least one access transistor of the first and second access transistors having the first drive strength comprises the second 3D transistor having a second drive strength higher than the first drive strength.

13. The IC of claim 10, wherein:
at least one of the first access transistor and the second access transistor comprises the first 3D transistor having a first drive strength; and
the pull-up PFET coupled to the at least one access transistor of the first and second access transistors having the first drive strength comprises the second 3D transistor having a second drive strength lower than the first drive strength.

14. The IC of claim 1, wherein at least one of the at least one first and second channels comprises a fin-type channel.

15. The IC of claim 1, wherein at least one of the at least one first and second channels comprises a gate-all-around-type channel.

16. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. An integrated circuit (IC), comprising:
a substrate comprising a substantially planar top surface;
a first three-dimensional (3D) transistor, comprising:
a first means for conducting current extending from the substantially planar top surface of the substrate to a first means for conducting current height above the substantially planar top surface, the first means for conducting current comprising a first end portion, a second end portion, a first side surface, and a second side surface opposite the first side surface;
a first means for providing electrical current formed in the first end portion of the first means for conducting current;
a first means for receiving electrical current formed in the second end portion of the first means for conducting current;
a first means for dispersing electric field disposed above the substrate and laterally adjacent to the first means for conducting current, the first means for dispersing electric field comprising a substantially planar top surface at a first means for dispersing electric field height above the substantially planar top surface of the substrate; and a first means for controlling electrical current through the first means for conducting current disposed over at least a portion of the first side surface and a portion of the second side surface, and above the first means for dispersing electric field to a gate height above the substantially planar top surface of the substrate; and a second 3D transistor, comprising:
   a second means for conducting current extending from the substantially planar top surface of the substrate to a second means for conducting current height above the substantially planar top surface substantially the same as the first means for conducting current height, the second means for conducting current comprising a first end portion, a second end portion, a third side surface, and a fourth side surface opposite the third side surface;
   a second means for providing electrical current formed in the first end portion of the second means for conducting current;
   a second means for receiving electrical current formed in the second end portion of the second means for conducting current;
   a second means for dispersing electric field disposed above the substrate and laterally adjacent to the second means for conducting current, the second means for dispersing electric field comprising a substantially planar top surface at a second means for dispersing electric field height above the substantially planar top surface of the substrate different from the first means for dispersing electric field height;
   a second means for controlling electrical current through the second means for conducting current disposed over at least a portion of the third side surface and a portion of the fourth side surface, and above the second means for dispersing electric field to the gate height;

the first means for conducting current of the first 3D transistor doped with a first dopant of a first polarity; and the second means for conducting current of the second 3D transistor doped with a second dopant of a second polarity opposite that of the first polarity.

18. A method of selectively recessing trench isolation to vary channel structure exposures from trench isolation to control drive strength, comprising:
   (a) forming a first channel structure and a second channel structure from a substantially planar top surface of a substrate, each of the first and the second channel structures extending to substantially a same height above the substantially planar top surface and comprising two side surfaces opposite one another;
   (b) depositing a trench isolation material adjacent to the first channel structure and the second channel structure and to a first trench isolation height above the substantially planar top surface of the substrate;
   (c) forming a substantially planar top surface of a first trench isolation layer laterally adjacent to the first channel structure and at a second trench isolation height above the substantially planar top surface of the substrate;
   (d) depositing a first selective recess blocking mask above the first trench isolation layer laterally adjacent to the first channel structure;
   (e) removing a portion of the trench isolation material not below the first selective recess blocking mask and adjacent to the second channel structure to form a substantially planar top surface of a second trench isolation layer, the substantially planar top surface of the second trench isolation layer formed laterally adjacent to the second channel structure and at a third trench isolation height above the substantially planar top surface of the substrate different from the second trench isolation height;
   (f) removing the first selective recess blocking mask;
   (g) forming a first gate over at least a portion of the two side surfaces of the first channel structure to a gate height above the substantially planar top surface of the substrate;
   (h) forming a second gate over at least a portion of the two side surfaces of the second channel structure to the gate height;
   (i) depositing a second selective recess blocking mask above the second trench isolation layer laterally adjacent to the second channel structure before step (c); and
   (j) removing the second selective recess blocking mask after step (c).

19. The method of claim 18, wherein:
forming the substantially planar top surface of the first trench isolation layer at the second trench isolation height further comprises removing a portion of the trench isolation material adjacent to the first channel structure.

20. The method of claim 18, further comprising:
removing a portion of the trench isolation material adjacent to the second channel structure to form the substantially planar top surface of the second trench isolation layer laterally adjacent to the second channel structure and at the second trench isolation height above the substantially planar top surface of the substrate.

21. The method of claim 18, wherein:
forming the substantially planar top surface of the first trench isolation layer at the second trench isolation height comprises forming the substantially planar top surface of the first trench isolation layer at the second trench isolation height substantially the same as the first trench isolation height.

22. The method of claim 18, further comprising:
forming a third channel structure from the substantially planar top surface of the substrate, comprising two side surfaces opposite one another and extending to substantially the same height above the substantially planar top surface as the first channel structure and the second channel structure during step (a);
depositing the trench isolation material adjacent to the third channel structure to the first trench isolation height above the substantially planar top surface of the substrate during step (b);
removing a portion of the trench isolation material not below the first selective recess blocking mask and adjacent to the third channel structure to form a substantially planar top surface of a third trench isolation layer, the substantially planar top surface of the third trench isolation layer formed laterally adjacent to the third channel structure and at the third trench isolation height above the substantially planar top surface of the substrate different from the second trench isolation height during step (e);

depositing a third selective recess blocking mask above the second trench isolation layer laterally adjacent to the second channel structure after step (e);

removing a portion of the trench isolation material not below the third selective recess blocking mask and adjacent to the third channel structure to form the substantially planar top surface of the third trench isolation layer formed laterally adjacent to the third channel structure and at a fourth trench isolation height above the substantially planar top surface of the substrate different from the second trench isolation height and the third trench isolation height;

removing the third selective recess blocking mask; and forming a third gate over at least a portion of the two side surfaces of the third channel structure to the gate height.

23. The method of claim 22, wherein:

depositing the first selective recess blocking mask above the first trench isolation layer comprises depositing a lithography mask above the first trench isolation layer used to selectively deposit the third selective recess blocking mask.

24. The method of claim 18, comprising:

depositing the first selective recess blocking mask above the first trench isolation layer laterally adjacent to the first channel structure using physical vapor deposition.

25. The method of claim 18, wherein:

depositing the first selective recess blocking mask above the first trench isolation layer laterally adjacent to the first channel structure comprises depositing the first selective recess blocking mask in a non-conformal manner above the first trench isolation layer laterally adjacent to the first channel structure.

26. The method of claim 18, comprising:

removing a portion of the trench isolation material not below the first selective recess blocking mask and adjacent to the second channel structure using wet etching to form the substantially planar top surface of the second trench isolation layer, the substantially planar top surface of the second trench isolation layer formed laterally adjacent to the second channel structure and at the third trench isolation height above the substantially planar top surface of the substrate different from the second trench isolation height.

27. The method of claim 18, wherein forming the first channel structure and the second channel structure from the substantially planar top surface of the substrate, each of the first and the second channel structures extending to substantially the same height above the substantially planar top surface, comprises:

forming the first channel structure and the second channel structure from the substantially planar top surface of the substrate, each comprising vertically stacked and alternating layers of a first material and a second material extending to substantially the same height above the substantially planar top surface and comprising the two side surfaces opposite one another; and removing one of the first material and the second material to form at least one gate-all-around-type channel from another of the first material and the second material.

28. The method of claim 27, further comprising:

forming a stop layer at each trench isolation layer laterally adjacent to each gate-all-around-type channel of the at least one gate-all-around-type channel using ion bombardment.

29. A semiconductor die, comprising:

a first power rail above the semiconductor die having a longitudinal axis disposed in a first direction;

a second power rail above the semiconductor die having a longitudinal axis disposed in the first direction and parallel to the first power rail;

a first standard cell, comprising:

a first P-type diffusion region disposed above the semiconductor die between the first power rail and the second power rail and having a longitudinal axis disposed in the first direction, wherein the first P-type diffusion region comprises a first P-type channel structure disposed in the first direction and comprising two side surfaces opposite one another;

a first N-type diffusion region disposed above the semiconductor die between the first power rail and the second power rail and having a longitudinal axis disposed in the first direction, wherein the first N-type diffusion region comprises a first N-type channel structure disposed in the first direction and comprising two side surfaces opposite one another;

a first non-diffusion region disposed above the semiconductor die between the first P-type diffusion region and the first N-type diffusion region;

a first trench isolation layer disposed above the semiconductor die and laterally adjacent to at least one of the first P-type channel structure and the first N-type channel structure, the first trench isolation layer comprising a substantially planar top surface at a first trench isolation height above the semiconductor die;

a plurality of first gate lines each having a longitudinal axis, wherein each first gate line is disposed in a second direction substantially orthogonal to the first direction and over at least one of a portion of the two side surfaces of the first P-type channel structure and a portion of the two side surfaces of the first N-type channel structure; and a plurality of first source/drain lines each having a longitudinal axis and disposed in the second direction and over at least one of the first P-type channel structure and the first N-type channel structure; and a second standard cell adjacent to the first standard cell, comprising:

a second P-type diffusion region disposed above the semiconductor die between the first power rail and the second power rail and having a longitudinal axis disposed in the first direction, wherein the second P-type diffusion region comprises a second P-type channel structure in line with the first P-type channel structure disposed in the first direction and comprising two side surfaces opposite one another;

a second N-type diffusion region disposed above the semiconductor die between the first power rail and the second power rail and having a longitudinal axis disposed in the first direction, wherein the second N-type diffusion region comprises a second N-type channel structure in line with the first N-type channel structure disposed in the first direction and comprising two side surfaces opposite one another;

a second non-diffusion region disposed above the semiconductor die between the second P-type diffusion region and the second N-type diffusion region;

a second trench isolation layer disposed above the semiconductor die and laterally adjacent to at least one of the second P-type channel structure and the second N-type channel structure, the second trench isolation layer comprising a substantially planar top surface at a second trench isolation height above the semiconductor die different from the first trench isolation height;

a plurality of second gate lines each having a longitudinal axis, wherein each second gate line is disposed in the second direction substantially orthogonal to the first direction and over at least one of a portion of the two side surfaces of the second P-type channel structure and a portion of the two side surfaces of the second N-type channel structure; and a plurality of second source/drain lines each having a longitudinal axis and disposed in the second direction and over at least one of the second P-type channel structure and the second N-type channel structure.

30. The semiconductor die of claim 29, wherein:

the first P-type channel structure is doped with a first dopant of a first polarity;

the first N-type channel structure is doped with a second dopant of a second polarity opposite that of the first polarity;

the second P-type channel structure is doped with a third dopant of a third polarity; and the second N-type channel structure is doped with a fourth dopant of a fourth polarity opposite that of the third polarity.

31. An integrated circuit (IC), comprising:

a substrate comprising a substantially planar top surface;

a plurality of first three-dimensional (3D) transistors each comprising:
- a first channel structure extending from the substantially planar top surface of the substrate to a first channel structure height above the substantially planar top surface, the first channel structure comprising a first end portion, a second end portion, a first side surface, and a second side surface opposite the first side surface;
- a first source formed in the first end portion of the first channel structure;
- a first drain formed in the second end portion of the first channel structure;
- at least one first channel formed in the first channel structure between the first source and the first drain;
- a first trench isolation layer disposed above the substrate and laterally adjacent to the first channel structure, the first trench isolation layer comprising a substantially planar top surface at a first trench isolation height above the substantially planar top surface of the substrate; and
- a first gate disposed over at least a portion of the first side surface and a portion of the second side surface, and above the first trench isolation layer to a gate height above the substantially planar top surface of the substrate; and at least one second 3D transistor comprising:
- a second channel structure extending from the substantially planar top surface of the substrate to a second channel structure height above the substantially planar top surface substantially same as the first channel structure height, the second channel structure comprising a first end portion, a second end portion, a third side surface, and a fourth side surface opposite the third side surface;
- a second source formed in the first end portion of the second channel structure;
- a second drain formed in the second end portion of the second channel structure;
- at least one second channel formed in the second channel structure between the second source and the second drain;
- a second trench isolation layer disposed above the substrate and laterally adjacent to the second channel structure, the second trench isolation layer comprising a substantially planar top surface at a second trench isolation height above the substantially planar top surface of the substrate different from the first trench isolation height; and
- a second gate disposed over at least a portion of the third side surface and a portion of the fourth side surface, and above the second trench isolation layer to the gate height; and a memory bit cell above the substrate and comprising:
- a storage circuit, comprising:
  - a first inverter and a second inverter, each comprising a pull-up P-type Field-Effect Transistor (FET) (PFET) and a pull-down N-type FET (NFET), wherein the pull-up PFET and the pull-down NFET are coupled in series by an inverter node and coupled in parallel by a control node;
  - a storage node coupled to the inverter node of the first inverter and to the control node of the second inverter; and
  - a complementary storage node coupled to the inverter node of the second inverter and to the control node of the first inverter;
- a first access transistor coupled to the storage node and a bitline, and comprising a gate coupled to a wordline; and
- a second access transistor coupled to the complementary storage node and a complementary bitline, and comprising a gate coupled to the wordline.

32. The IC of claim 31, wherein:

the plurality of first 3D transistors comprise at least one of the pull-up PFET of the first inverter, the pull-up PFET of the second inverter, the pull-down NFET of the first inverter, the pull-down NFET of the second inverter, the first access transistor, and the second access transistor; and the at least one second 3D transistor comprises at least another of the pull-up PFET of the first inverter, the pull-up PFET of the second inverter, the pull-down NFET of the first inverter, the pull-down NFET of the second inverter, the first access transistor, and the second access transistor.

33. The IC of claim 31, wherein:

at least one of the first access transistor and the second access transistor comprises the plurality of first 3D transistors having a first drive strength; and the pull-down NFET coupled to the at least one of the first and second access transistors having the first drive strength comprises the at least one second 3D transistor having a second drive strength higher than the first drive strength.

34. The IC of claim 31, wherein:

at least one of the first access transistor and the second access transistor comprises the plurality of first 3D transistors having a first drive strength; and the pull-up PFET coupled to the at least one of the first and second access transistors having the first drive strength comprises the at least one second 3D transistor having a second drive strength lower than the first drive strength.

35. The IC of claim 31, wherein at least one of the at least one first and second channels comprises a fin-type channel.

36. The IC of claim 31, wherein at least one of the at least one first and second channels comprises a gate-all-around-type channel.

* * * * *